(12) United States Patent
Baek

(10) Patent No.: US 10,991,717 B2
(45) Date of Patent: Apr. 27, 2021

(54) VERTICAL MEMORY DEVICES

(71) Applicant: Samsung Electronics Co., Ltd., Suwon-si (KR)

(72) Inventor: Seok-Cheon Baek, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/380,422

(22) Filed: Apr. 10, 2019

(65) Prior Publication Data
US 2020/0105783 A1   Apr. 2, 2020

(30) Foreign Application Priority Data
Sep. 28, 2018  (KR) .................. 10-2018-0116223

(51) Int. Cl.
*H01L 27/11582* (2017.01)
*H01L 27/11565* (2017.01)
*H01L 27/11573* (2017.01)
*H01L 21/311* (2006.01)
*H01L 29/423* (2006.01)
*H01L 21/768* (2006.01)
*H01L 23/522* (2006.01)
*H01L 23/528* (2006.01)
*H01L 23/48* (2006.01)
*H01L 21/28* (2006.01)

(52) U.S. Cl.
CPC ... *H01L 27/11582* (2013.01); *H01L 21/31111* (2013.01); *H01L 21/76897* (2013.01); *H01L 21/76898* (2013.01); *H01L 23/481* (2013.01); *H01L 23/5226* (2013.01); *H01L 23/5283* (2013.01); *H01L 27/11565* (2013.01); *H01L 27/11573* (2013.01); *H01L 29/40117* (2019.08); *H01L 29/4234* (2013.01)

(58) Field of Classification Search
None
See application file for complete search history.

(56) References Cited

U.S. PATENT DOCUMENTS 9,741,733 B2   8/2017  Lim et al.
9,780,104 B2  10/2017  Nomachi et al.
(Continued)

FOREIGN PATENT DOCUMENTS

KR   2017-0046892 A   5/2017

*Primary Examiner* — Khaja Ahmad
(74) *Attorney, Agent, or Firm* — Harness, Dickey & Pierce, P.L.C.

(57) ABSTRACT

A vertical memory device may include gate electrodes on a substrate, a merged pattern structure and a cell contact plug. The gate electrodes may be spaced apart in a first direction orthogonal to the substrate, and may extend in a second direction parallel to the substrate. The merged pattern structure may extend in the second direction while merging ends of the gate electrodes of each level. Edges of the merged pattern structure may have a step shape. The merged pattern structure may include pad patterns electrically connected to the gate electrodes. The cell contact plug may extend through the merged pattern structure and be electrically connected to one of the pad patterns. The cell contact plug may be electrically insulated from other gate electrodes. The cell contact plug may contact a conductive material underlying. An upper surface of the cell contact plug may only contact an insulation material.

20 Claims, 49 Drawing Sheets

(56) References Cited

U.S. PATENT DOCUMENTS

| | | | |
|---|---|---|---|
| 9,847,341 B2 | 12/2017 | Shin et al. | |
| 9,865,540 B2 | 1/2018 | Kim et al. | |
| 9,876,031 B1 | 1/2018 | Shimizu et al. | |
| 2015/0287710 A1* | 10/2015 | Yun | H01L 23/5226 |
| | | | 257/314 |
| 2017/0084532 A1* | 3/2017 | Son | H01L 27/11565 |
| 2017/0148804 A1* | 5/2017 | Lee | H01L 27/1104 |
| 2017/0179153 A1* | 6/2017 | Ogawa | H01L 27/11575 |
| 2017/0236746 A1 | 8/2017 | Yu et al. | |
| 2017/0271354 A1* | 9/2017 | Kwak | H01L 27/11556 |
| 2017/0330887 A1 | 11/2017 | Kim et al. | |
| 2017/0338241 A1 | 11/2017 | Lee | |
| 2017/0352678 A1 | 12/2017 | Lu et al. | |
| 2018/0047744 A1 | 2/2018 | Utsumi | |

* cited by examiner

VERTICAL MEMORY DEVICES

CROSS-REFERENCE TO RELATED APPLICATION

This application claims priority under 35 USC § 119 to Korean Patent Application No. 10-2018-0116223, filed on Sep. 28, 2018, in the Korean Intellectual Property Office (KIPO), the contents of which are incorporated by reference herein in their entirety.

BACKGROUND

1. Field

Some example embodiments relate to vertical memory devices. More particularly, some example embodiments relate to vertical memory devices including wiring structures.

2. Description of the Related Art

Recently, a vertical memory device including a plurality of memory cells vertically stacked at a plurality of levels, respectively, on a substrate has been developed. As the number of stacked memory cells in the vertical memory device increases, forming of the memory cells and wiring structures connecting the memory cells may become increasingly difficult.

SUMMARY

Some example embodiments provide a vertical memory device including simple wiring structures.

According to some example embodiments, there is provided a vertical memory device that may include gate electrodes, a channel, a merged pattern structure and a cell contact plug. The gate electrodes may be stacked on a substrate, and may be spaced apart from each other in a first direction substantially vertical to an upper surface of the substrate. The gate electrodes may extend in a second direction substantially parallel to the upper surface of the substrate, and arranged in a third direction perpendicular to the second direction and substantially parallel to the upper surface of the substrate. The channel may extend through the gate electrodes in the first direction. The merged pattern structure may extend in the second direction while merging ends of the gate electrodes of each level. Edges of the second direction of the merged pattern structure may have a step shape, and the merged pattern structure may include pad patterns being electrically connected to the gate electrodes of each level. The cell contact plug may be electrically connected to one of pad patterns in the merged pattern structure. The cell contact plug may extend through the merged pattern structure in a first direction, and may be electrically insulated from gate electrodes of other levels except for the gate electrode being connected to the pad pattern. The cell contact plug may contact a conductive material under the pad pattern, and an upper surface of the cell contact plug may only contact an insulation material.

According to some example embodiments, there is provided a vertical memory device that may include a circuit pattern, gate electrodes, a channel, a merged pattern structure and a cell contact plug. The circuit pattern may be formed on a substrate including a first region and a second region. The gate electrodes may be disposed on the circuit pattern in the first region, the gate electrodes may be stacked in a first direction substantially vertical to an upper surface of the substrate. The gate electrodes may extend in a second direction substantially parallel to the upper surface of the substrate, and may be arranged in the third direction perpendicular to the second direction and substantially parallel to the upper surface of the substrate. The channel may extend through the gate electrodes in the first direction. The merged pattern structure may be formed on the second region. The merged pattern structure may extend in the second direction while merging ends of the gate electrodes of each level. Edges of the second direction of the merged pattern structure have a step shape. The merged pattern structure may include insulation materials and pad patterns being electrically connected to the gate electrodes of each level. The cell contact plugs may extend through the merged pattern structure in a first direction, and may be electrically connected to one of the pad patterns and the circuit pattern.

According to some example embodiments, there is provided a vertical memory device that may include gate electrodes, a channel, a merged pattern structure and a cell contact plug. The gate electrodes may be stacked in a first direction substantially vertical to an upper surface of a substrate. The gate electrodes may extend in a second direction substantially parallel to the upper surface of the substrate. The merged pattern structure may include an insulation material and a plurality of pad patterns being electrically connected to the gate electrodes of each level. The channel may extend through the gate electrodes in the first direction. The cell contact plug may extend through insulation materials of the merged pattern structure in a first direction, and may contact at least portions of one of the pad patterns in the merged pattern structure. The cell contact plug may be electrically connected to only one of the pad patterns in the merged pattern structure.

In some example embodiments, the vertical memory device may have a simple wiring structure including the cell contact plug.

BRIEF DESCRIPTION OF THE DRAWINGS

Some example embodiments will be more clearly understood from the following detailed description taken in conjunction with the accompanying drawings.

FIGS. 1 to 7 are a plan view, cross-sectional views, a perspective view illustrating a vertical memory device in accordance with some example embodiments;

FIG. 56 is a cross-sectional view illustrating a vertical memory device in accordance with some example embodiments.

DESCRIPTION OF EMBODIMENTS

Figure 1:
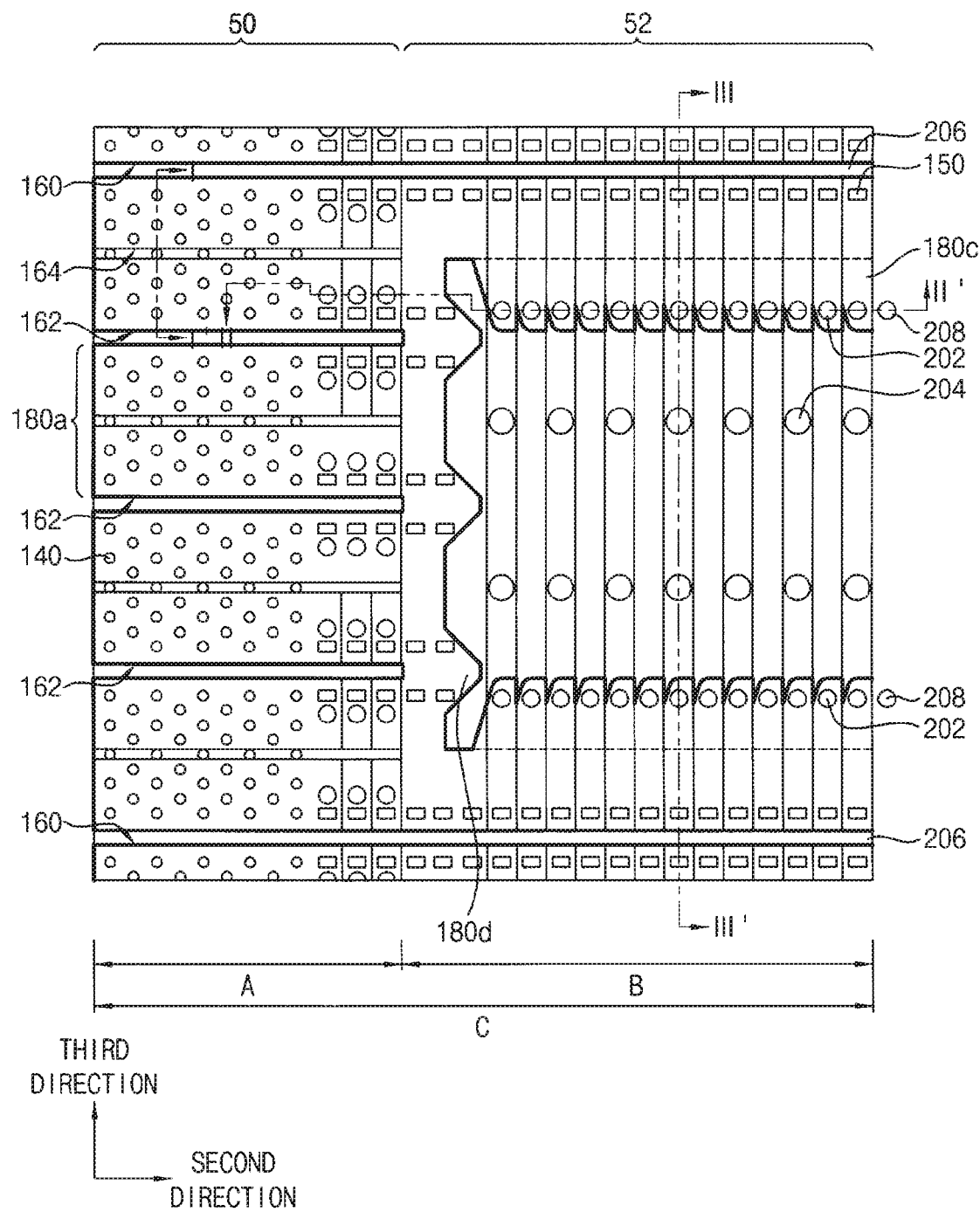
FIGS. 1 to 56 represent some non-limiting, example embodiments as described herein.
Figure 2:
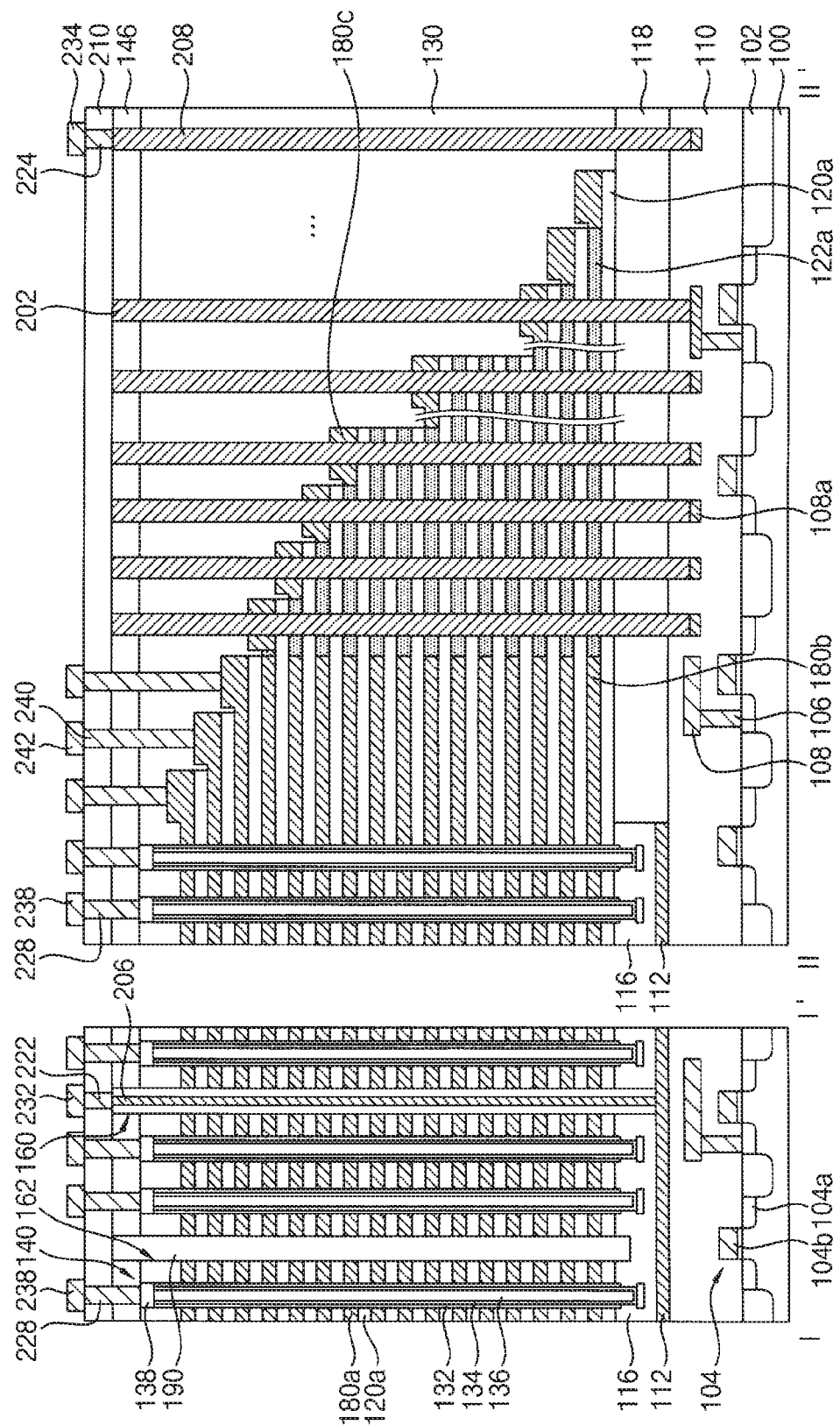
Figure 3:
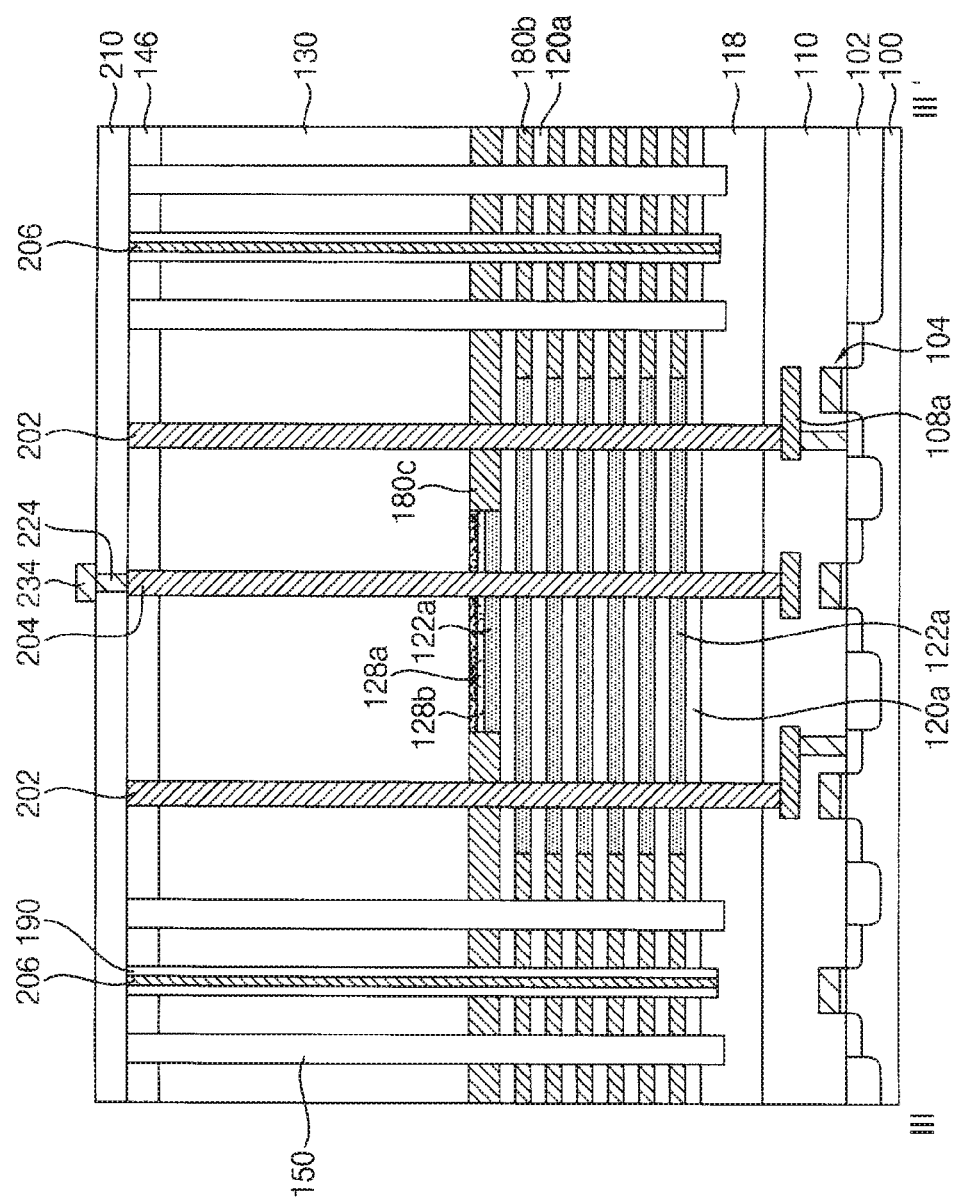
Figure 4:
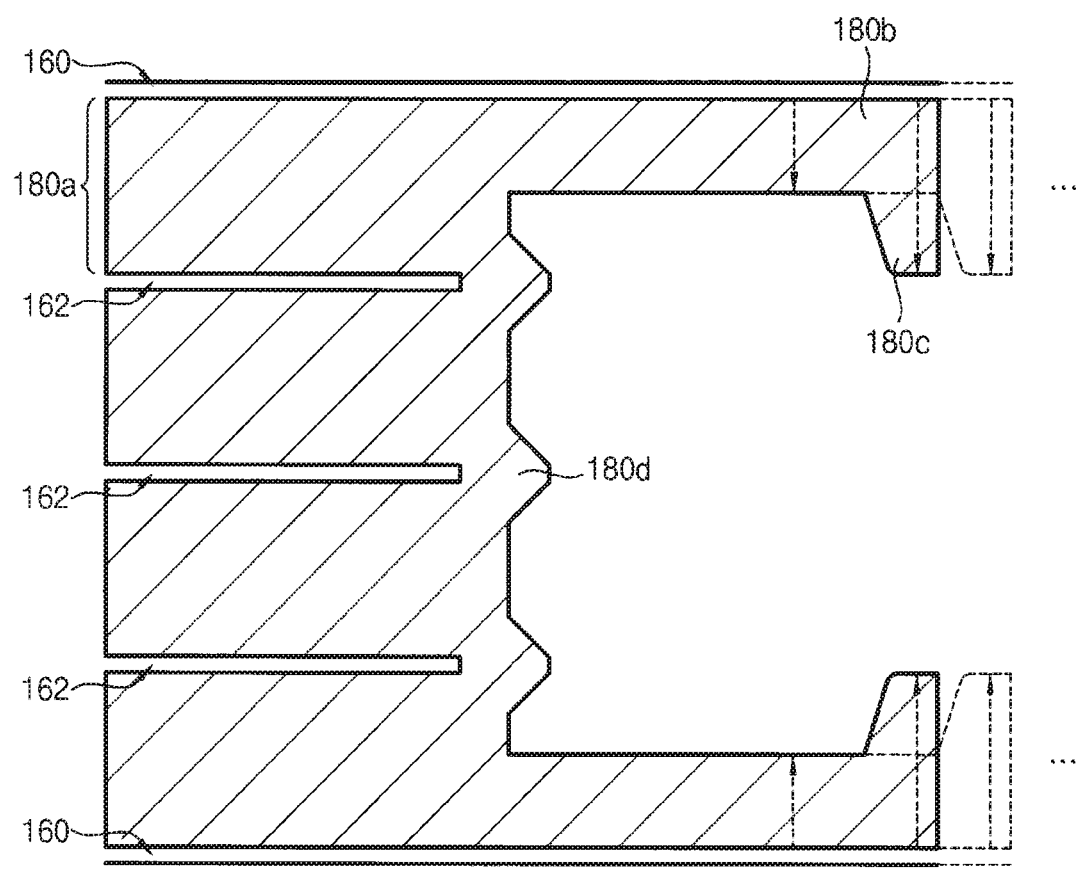
Figure 5:
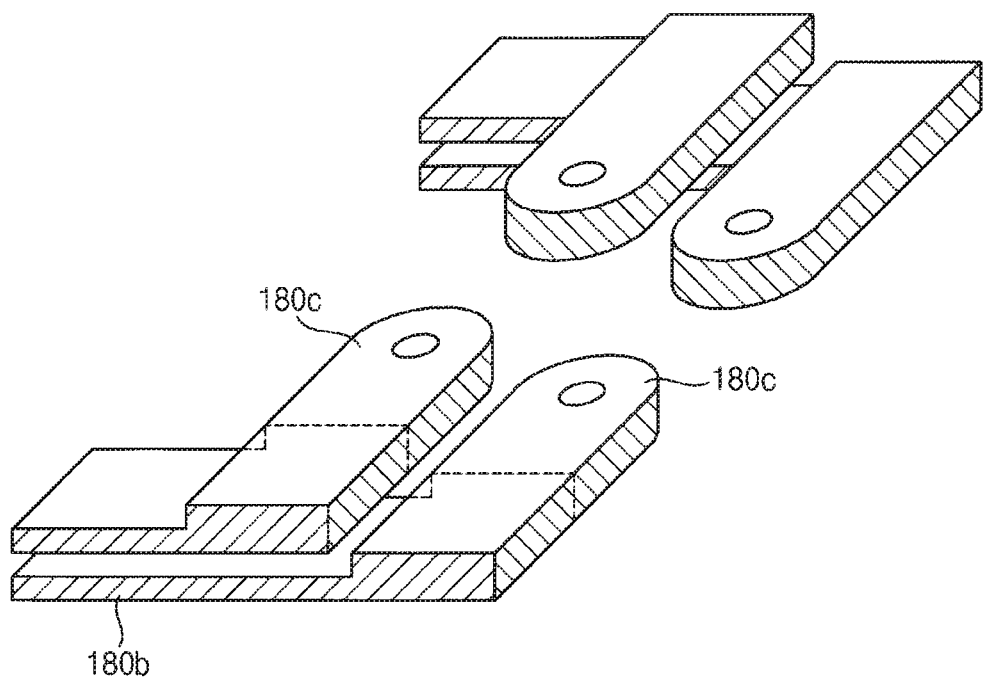
Figure 6:
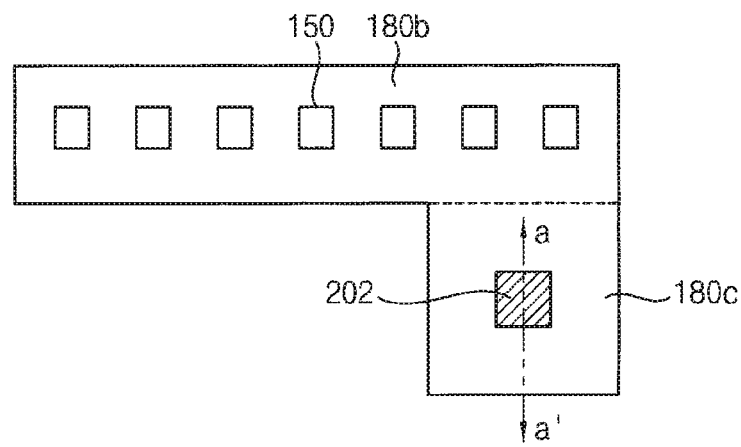
Figure 7:
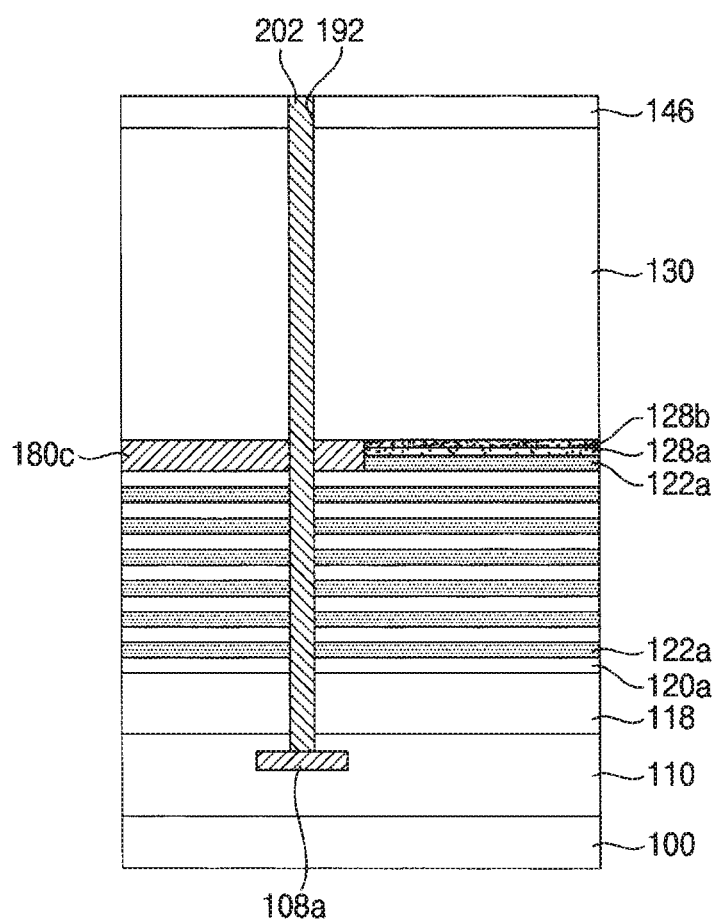

FIGS. 1 to 3 are a plan view and cross-sectional views illustrating a vertical memory device in accordance with some example embodiments. FIG. 4 is a plan view illustrating a portion of a conductive pattern at one level in the vertical memory device. FIG. 5 is a perspective view illustrating a portion of conductive lines and pad patterns in the vertical memory device. FIG. 6 is a plan view illustrating a portion of the conductive lines and the pad patterns at one level in the vertical memory device. FIG. 7 is a cross-sectional view illustrating a portion of the pad patterns in the vertical memory device.

Particularly, FIG. 1 is a plan view, and FIGS. 2 and 3 are cross-sectional views. FIG. 2 includes cross-sectional views taken along the line I-I' and II-II' of FIG. 1, and FIG. 3 includes a cross-sectional view taken along line III-III' of FIG. 1. FIG. 7 is a cross-sectional view taken along the line a-a' of FIG. 6.

Hereinafter, a direction substantially perpendicular to an upper surface of the substrate is defined as a first direction, and two directions crossing with each other in horizontal directions substantially parallel to the upper surface of the substrate are defined as second and third directions, respectively. In some example embodiments, the second and third directions may be perpendicular to each other.

Referring to FIGS. 1, 2 and 3, the vertical memory device may include a circuit pattern formed on a substrate 100, memory cells formed over the circuit pattern and a cell contact plug 202 for electrically connecting the circuit pattern and the memory cells.

The substrate 100 may include a semiconductor material, e.g., silicon, germanium, silicon-germanium, or III-V semiconductor compounds, e.g., GaP, GaAs, GaSb, etc. In some example embodiments, the substrate 100 may be a silicon-on-insulator (SOI) substrate or a germanium-on-insulator (GOI) substrate.

The substrate 100 may include a first region A, a second region B and a third region C. The first and second regions A and B may be memory cell regions. That is, the first region A may be a cell array region for forming a memory cell array, and the second region B may be a pad region for forming pads of gate electrodes. The third region C may be a peripheral region for forming peripheral circuits.

In some example embodiments, the vertical memory device may have a cell over peri (COP) structure. That is, the peripheral circuits for operating the memory cells may be formed on the substrate 100 under the memory cells. As the first and second regions A and B may be positioned over the third region C, the third region C may be vertically overlapped with the first and second regions A and B.

The circuit pattern may include lower transistors 104, lower contact plugs 106, and lower wirings 108, etc. In some example embodiments, the lower contact plug 106 and the lower wirings 108 may be formed to have multiple layers.

A lower insulating interlayer 110 covering the circuit pattern may be formed on the substrate 100. The lower contact plugs 106 may contact impurity regions 104a and/or gate structure 104b of the lower transistor 104.

The lower wirings 108 may include lower pad patterns 108a. The lower pad patterns 108a may be positioned opposite in the first direction to pad patterns 180c formed at actual pad regions of the cell block subsequently described. The lower pad patterns 108a may directly contact the cell contact plugs 202, respectively.

Base patterns 116 may be formed on the lower insulating interlayer 110. In some example embodiments, the base patterns 116 may be formed below the first region A. The base patterns 116 may include, e.g., a polysilicon layer or a single crystal silicon layer.

In some example embodiments, a lower conductive pattern 112 may be formed between the base patterns 116 and the lower insulating interlayer 110 in the first direction. For example, the lower conductive pattern 112 may be electrically connected to a common source line CSL.

A base insulation layer 118 may be formed on the lower insulating interlayer 110. In some example embodiments, the base insulation layer 118 may be positioned under the second region B. The base insulation layer 118 may include, e.g., silicon oxide.

A cell block structure including a plurality of memory cells may be formed on the base pattern 116 and the base insulation layer 118. The cell block structures may extend in the second direction, and the cell block structures may be arranged in parallel with the third direction. The cell block structures may be separated by a first opening 160 extending in the second direction. Thus, the first opening 160 may correspond to a block cut region. A second insulation pattern 190 (refer to FIG. 3) may fill the first opening 160, and the CSL 206 (refer to FIG. 3) may extend through the second insulation pattern 190. The first opening 160 may be positioned in the first and second regions A and B.

A first insulating interlayer 130 may be formed to cover the cell block structure. A second insulating interlayer 146 may be formed on the first insulating interlayer 130.

Hereinafter, the cell block structure formed on the first region A is referred to as a cell structure 50, and the cell block structure formed on the second region B is referred to as a merged pattern structure 52. The cell structure 50 and the merged pattern structure 52 may be connected to each other. Hereinafter, one of the cell block structures may be described as an example.

The cell structure 50 may include a plurality of gate electrodes 180a spaced apart from each other in the first direction, and first insulation patterns 120a formed between the gate electrodes 180a. That is, the gate electrodes 180a and the first insulation patterns 120a may be repeatedly and alternately formed in the first direction. Also, a channel structure 140 may be formed through the gate electrodes 180a and the first insulation patterns 120a.

The cell structure 50 may include a second opening 162 extending in the second direction. The second opening 162 may serve as a word line cutting region. That is, the gate electrodes 180a may be spaced apart from each other in the third direction by the second opening 162. Thus, the cell structure 50 may include the plurality of gate electrodes 180a arranged in the third direction. The second opening 162 may extend to an inner portion of the base pattern 116. In some example embodiments, the second opening 162 may be formed only in the first region A. Also, the second insulation pattern 190 may fill the second opening 162.

The gate electrodes 180a may include a first gate electrode, a second gate electrode and a third gate electrode sequentially stacked in the first direction. The first gate electrode may serve as a ground selection line (GSL), the second gate electrode may serve as a word line, and the third gate electrode may serve as a string selection line (SSL).

In some example embodiments, the first gate electrode may be formed at a lowermost layer, the third gate electrode may be formed at uppermost layer and at least one layer under the uppermost layer. The second gate electrode may be formed between the first and third gate electrodes. A third opening 164 may be formed between the third gate electrodes, and thus the third gate electrodes may be separated in the third direction by the third opening 164. The third opening 164 may serve as a cell selection line (SSL) cutting region. An insulation pattern may fill the third opening 164. In some example embodiments, one or more dummy lines may be further included between the second and third gate electrodes in the first direction.

The channel structure 140 may include a charge storage structure 132, a channel 134, a filling insulation pattern 136, and a capping pattern 138.

In some example embodiments, the channel structure 140 may be through the gate electrodes 180a and the first insulation patterns 120a, and may extend to the base pattern 116.

For example, the channel 134 extends to the inner portion of the base pattern 116, and may have a cup shape. The charge storage structure 132 may surround an outerwall of the channel 134. The charge storage structure 132 may include a first blocking pattern, a charge storage pattern, and a tunnel insulation pattern sequentially stacked. The filling insulation pattern 136 may have a pillar shape to fill an inner space formed by the channel 134. The capping pattern 138 may be formed on the filling insulation pattern 136 and the channel 134, and may include polysilicon. A bottom of the capping pattern 138 may be higher than an upper surface of the uppermost gate electrode 180a. In some example embodiments, an upper surface of the capping pattern 138 may be coplanar with an upper surface of the first insulating interlayer 130.

In some example embodiments, the third gate electrodes corresponding to the string selection line SSL may be positioned in the first region A, and an edge portion of the third gate electrodes may have a step shape. That is, the third gate electrodes may not extend to the second region B. An exposed portion of the step of the third gate electrodes may serve as a pad of SSL.

The merged pattern structure 52 includes a first structure and a second structure. The first structure may include conductive patterns extending from the gate electrodes 180a and first insulation patterns 120a alternatively and repeatedly stacked. The second structure may include a first sacrificial pattern 122a and the first insulation pattern 120a alternatively and repeatedly stacked. In example embodiments, a sidewall of the first structure and a sidewall of the second structure may contact to each other, so that the first and second structures may serve as the merged pattern structure 52. Particularly, as shown in FIG. 3, a side of the conductive pattern, e.g., 180b, of each level in the first structure may contact a side of the first sacrificial pattern 122a of each level in the second structure. Also, a side of the first insulation pattern 120a of each level in the first structure may contact a side of the first the first insulation pattern 120a of each level in the second structure. The merged pattern structure 52 may not include a trench or an opening extending in the second direction. Thus, the merged pattern structure 52 may not include a portion being spaced apart from each other in the third direction. That is, one merged pattern structure 52 may be formed in one cell block structure.

An edge portion in the second direction of the merged pattern structure 52 may have a step shape. Thus, the edge portions in the second direction of the merged pattern structure 52 may have different levels for each layer.

The first insulation pattern 120a of the merged pattern structure 52 may include a material substantially the same as that of the first insulation patterns 120a of the cell structure. That is, the first insulation patterns 120a of the merged pattern structure and the cell structure may be merged with each other, and thus extend in the second direction.

In some example embodiments, in the plan view, the merged pattern structure 52 of each level may include a conductive line region and an insulation structure region.

Hereinafter, the merged pattern structure of each level may be described in detail with reference to FIGS. 4 to 7.

As shown in FIGS. 4 to 7, a conductive line 180b, a pad pattern 180c, and a connection line 180d may be formed in the conductive line region at each level.

The conductive line 180b may be disposed at both edge portions in the third direction of the merged pattern structure 52, and may extend in the second direction.

The pad pattern 180c may be formed only at a step portion corresponding to an exposed edge in the second direction of the merged pattern structure 52 at each level. That is, the pad pattern 180c may not be formed at an unexposed portion that may be covered by an upper layer of the merged pattern structure 52.

Referring to FIGS. 4 and 5, the pad pattern 180c may protrude in the third direction from an end portion in the second direction of the conductive line 180b. The pad pattern 180c may be an actual pad region connecting to the gate electrode 180a and the lower wiring. In some example embodiments, the pad patterns 180c protruding from each of the conductive lines 180b may not contact each other. Thus, a space in the third direction between the pad patterns 180c at each level may be the insulation structure region. That is, the second structure may be disposed between the pad patterns 180c in the third direction at each level. The step portion of the merged pattern structure 52 at each level may expose the pad pattern 180c and the second sacrificial pattern 128a.

The connection line 180*d* may be formed in a second region B adjacent to the first region A, and the connection line 180*d* may extend in the third direction. Thus, the connection line 180*d* may be connected to the gate electrodes 180*a* and the conductive line 180*b* of the same level in the cell block structure.

In the same level, the gate electrodes 180*a* may be electrically connected to the connection line 180*d*, the conductive line 180*b*, and the pad pattern 180*c*.

In some example embodiments, in the plan view, the connection line 180*d* and the conductive line 180*b* of each level may have a □-shape.

In some example embodiments, the connection line 180*d*, the conductive line 180*b*, and the pad pattern 180*c* may include a conductive material substantially the same as that of the gate electrode 180*a* formed in the first region A.

In some example embodiments, in the plan view, a step end portion in the second direction of the pad pattern 180*c* may have a straight line shape, and an opposite portion of the step end portion in the second direction of the pad pattern 180*c* may have a diagonal line shape or rounded shape. In some example embodiments, in the plan view, each of the step end portion in the second direction of the pad pattern 180*c* and the opposite portion of the step end portion of the pad pattern 180*c* may have a straight line shape. In this case, as shown in FIG. 6, the pad pattern 180*c* may have a rectangular shape, in a plan view. However, the shape of the pad pattern 180*c* is not limited thereto.

In some example embodiments, a first sacrificial pattern may be formed in the insulation structure region of each level. The second structure including first sacrificial pattern 122*a* and the first insulation patterns 120*a* repeatedly stacked may be disposed under the insulation structure region of each level in the first direction. The first sacrificial pattern 122*a* may include a material having a high etch selectivity with respect to the first insulation patterns 120*a*. For example, the first insulation pattern 120*a* may include silicon oxide, and the first sacrificial pattern 122*a* may include silicon nitride, silicon oxynitride, etc.

In some example embodiments, the second structure may be formed under the pad pattern 180*c* of each level in the first direction. That is, the first sacrificial patterns 122*a* and the first insulation patterns 120*a* may be alternately repeatedly stacked under the pad pattern 180*c* in the first direction.

In some example embodiments, the pad pattern 180*c* may have a height higher than a height of the gate electrodes 180*a* formed at the same level, and thus the pad pattern 180*c* may have a thickness greater than a thickness of the gate electrode 180*a*.

A support 150 may be through the second insulating interlayer 146, the first insulating interlayer 130, and the merged pattern structure, and may extend in the first direction. In some example embodiments, the support 150 may extend through a step portion disposed at an edge in the third direction of the merged pattern structure. In some example embodiments, the support 150 may extend to an inner portion of the base insulation layer 118.

In some example embodiments, the support 150 may include silicon oxide, and the support may have a pillar shape. In some example embodiments, the support 150 may have a shape substantially the same as a shape of the channel structure 140 formed in the first region A.

In some example embodiments, the gate electrode 180*a*, the conductive line 180*b*, the pad pattern 180*c*, and the connection line 180*d* may include the same metal material. The gate electrode 180*a*, the conductive line 180*b*, the pad pattern 180*c*, and the connection line 180*d* may include a barrier pattern and a metal pattern. The barrier pattern may surround a surface of the metal pattern. The metal pattern may include a metal having low resistance, e.g., tungsten, titanium, tantalum, platinum, cobalt, etc., and the barrier pattern may include a metal nitride, e.g., titanium nitride, tantalum nitride, etc.

The CSL 206 may extend in the second direction. Also, the CSL 206 may extend in the first direction so that the CSL 206 may be connected to the lower conductive pattern 112 below the base pattern 116. In some example embodiments, the CSL 206 may be connected to the base pattern 116. The upper surface of the CSL 206 may be substantially coplanar with an upper surface of the second insulating interlayer 146. As the CSL 206 extends through the second insulation pattern 190, a sidewall of the CSL 206 may be surrounded by the second insulation pattern 190.

In some example embodiments, as shown in FIGS. 6 and 7, the cell contact plug 202 may extend through the second insulating interlayer 146, the first insulating interlayer 130 and the pad pattern 180*c* in the second region, the merged pattern structure and the base insulation pattern 117 thereunder, so that the cell contact plug 202 may contact an upper surface of the lower pad pattern 108*a* in the lower insulating interlayer 110.

In some example embodiments, as the cell contact plug 202 extends through the pad pattern 180*c*, the pad pattern 180*c* may include a hole. Also, the cell contact plug 202 may contact a sidewall of the hole included in the pad pattern 180*c*.

Thus, the first and second insulating interlayer 130 and 146 may be disposed on the pad pattern 180*c* of each level, and the second structure including the first sacrificial pattern 122*a* and the first insulation pattern 120*a* stacked in the merged pattern structure may be disposed under the pad pattern 180*c* of each level. Thus, the cell contact plug 202 may extend through an insulating material disposed on and under the pad pattern 180*c*, and may be electrically connected to the pad pattern 180*c* and the lower pad pattern 108*a*. Therefore, gate electrode 180*a* of each level and the peripheral circuits may be electrically connected by only the cell contact plugs 202.

In some example embodiments, upper wirings may not be formed on the cell contact plug 202. An upper surface of the cell contact plug 202 may only contact an insulating material, for example, the third insulating interlayer 210. That is, the cell contact plug 202 connecting each of the gate electrodes 180*a* in the cell block structure may directly contact the lower pad pattern 108*a*. Thus, wirings connecting the gate electrodes 180*a* may be very simplified.

In some example embodiments, in the merged pattern structure 52, the second structure may be positioned at a lateral portion of the connection line 180*d* between the conductive lines 180*b* in the third direction. That is, insulation materials may be only formed at the portion, and conductive patterns may not be formed at the portion.

In some example embodiments, a through via contact 204 may be further formed to extend through the second insulating interlayer 146, the first insulating interlayer 130, the second structure and the base insulation layer 118 in the second region, so that the through via contact 204 may contact the lower wiring 108 in the lower insulating interlayer 110.

In some example embodiments, a via contact 208 may be further formed to extend through the second insulating interlayer 146, the first insulating interlayer 130 and the base insulation layer 118 in a lateral portion of the merged pattern structure 52 beside the second region B, so that the via contact 208 may contact the lower wiring 108 in the lower insulating interlayer 110.

The through via contact 204 and the via contact 208 may not be electrically connected to the gate electrodes 180a. Each of the through via contacts 204 and the via contacts 208 may be connected to the peripheral circuits and elements except for the gate electrode 180a.

A third insulating interlayer 210 may be formed on the second insulating interlayer 146.

A first upper contact 222 and a second upper contact 224 may be formed through the third insulating interlayer 210. The third upper contact 228 may be formed through the third insulating interlayer 210 and the second insulating interlayer 146.

In some example embodiments, the first upper contact 222 may contact an upper surface of the CSL 206. The second upper contacts 224 may contact upper surfaces of the through via contact 204 and the via contact 208, respectively. The third upper contact 228 may contact an upper surface of the capping pattern 138.

The first upper contact 222 may be connected to the first upper wiring 232. The second upper contact 224 may be connected to the second upper wiring 234. The third upper contact 228 may be electrically connected to the third upper wiring 238. The third upper wiring 238 may serve as a bit line.

In some example embodiments, a SSL contact 240 may be further formed to extend through the third insulating interlayer 210, the second insulating interlayer 146, and the first insulating interlayer 130, so that the SSL contact 240 may contact the pad portion of the third gate electrode. A fourth upper wiring 242 may be further formed on the SSL contact 240.

In this case, a contact plug and a wiring may not be formed on the cell contact plug 202.

In some example embodiments, a fourth insulating interlayer (not shown) may be further formed to cover the first to fourth upper wirings 232, 234, 238, and 242.

In the vertical memory device, the gate electrode of each memory cell and the circuit pattern may be electrically connected by the cell contact plug. That is, the cell contact plug may extend through the pad pattern connected to one of the gate electrodes, so that the gate electrode and the circuit pattern may be electrically connected to each other. In this case, as only the insulation materials are stacked over and below the pad pattern, the cell contact plug may pass through the insulation materials. Thus, the cell contact plug may not be electrically connected to other gate electrodes except for the gate electrode connecting the pad pattern.

FIGS. 8 to 30 are plan views and cross-sectional views illustrating stages of a method of manufacturing a vertical memory device in accordance with some example embodiments.

FIGS. 12, 18, 21 and 24 are plan views, and FIGS. 8-11, 13-17, 19, 20, 22, 23 and 25-30 are cross-sectional views. FIGS. 8-11, 13-16, 19, 22, 25, and 27 are cross-sectional views taken along lines I-I' and II-II' of FIG. 1. FIGS. 17, 20, 23, 26, 28, and 30 are cross-sectional views taken along a line III-III' of FIG. 1.

Figure 8:
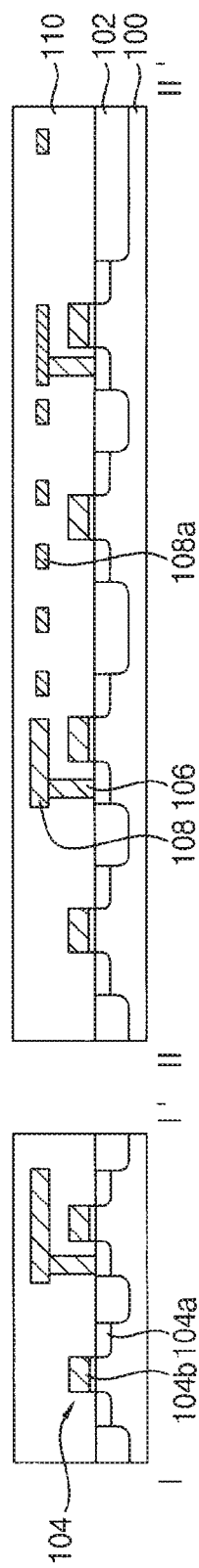
FIGS. 8 to 30 are plan views and cross-sectional views illustrating stages of a method of manufacturing a vertical memory device in accordance with some example embodiments.

Referring to FIG. 8, a plurality of circuit patterns constituting a peripheral circuit may be formed on a substrate 100, and a lower insulating interlayer 110 may be formed to cover the circuit patterns.

A trench isolation process may be performed on the substrate 100 to form a field region having an isolation pattern 102 and an active region having no isolation pattern 102.

The circuit patterns may include lower transistors 104, lower contact plugs 106, lower wirings 108, etc. Each of the lower transistors 104 may include a gate structure 104b and impurity regions 104a. The lower contact plugs 106 may contact the gate structure 104b and/or the impurity regions 104a, respectively. The lower wirings 108 may be electrically connected to the lower contact plugs 106.

Some of the lower wirings 108 may be faced in the first direction the pad patterns subsequently formed, which may be referred to as lower pad patterns 108a. In some example embodiments, the lower contact plugs 106 and the lower wirings 108 may be formed to have multiple layers.

Figure 9:
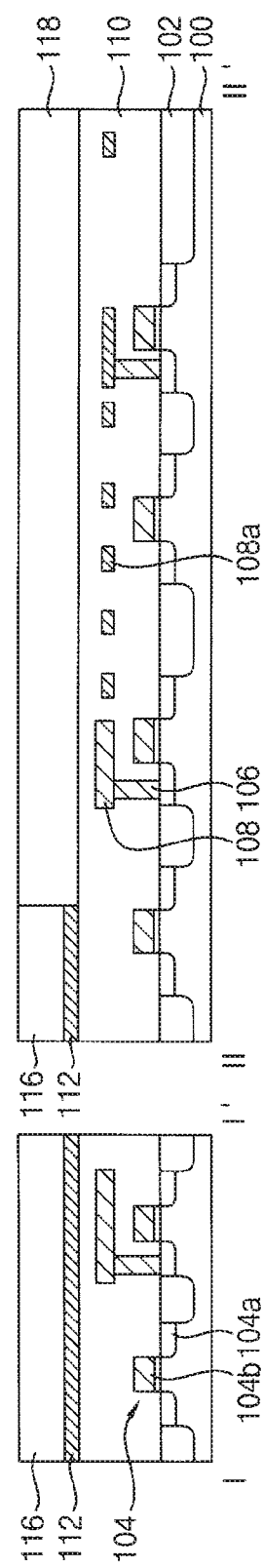

Referring to FIG. 9, a lower conductive pattern 112 and a base pattern 116 may be sequentially formed on the lower insulating interlayer 110 facing the first region A. A base insulation layer 118 covering sidewalls of the lower conductive pattern 112 and the base pattern 116 may be formed on the lower insulating interlayer 110 facing the second region B. In some example embodiments, upper surfaces of the base pattern 116 and the base insulation layer 118 may be coplanar with each other.

Figure 10:
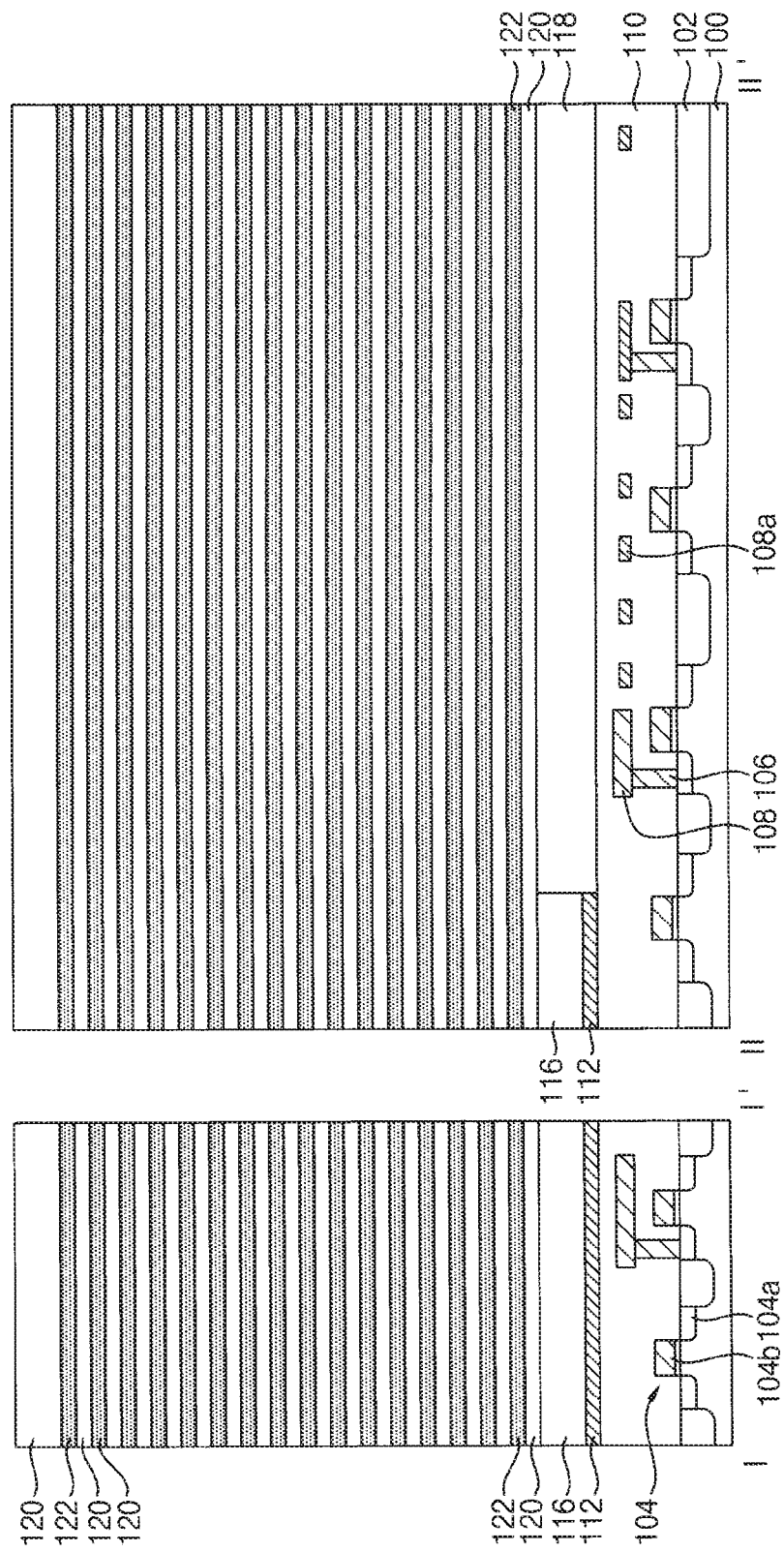

Referring to FIG. 10, first insulation layers 120 and first sacrificial layers 122 may be alternately and repeatedly formed on the base pattern 116 and the base insulation layer 118. The first insulation layer 120 may be formed to include silicon oxide. The first sacrificial layer 122 may be formed to include a material having an etch selectivity with respect to the first insulation layer 120, e.g., a nitride such as silicon nitride.

Figure 11:
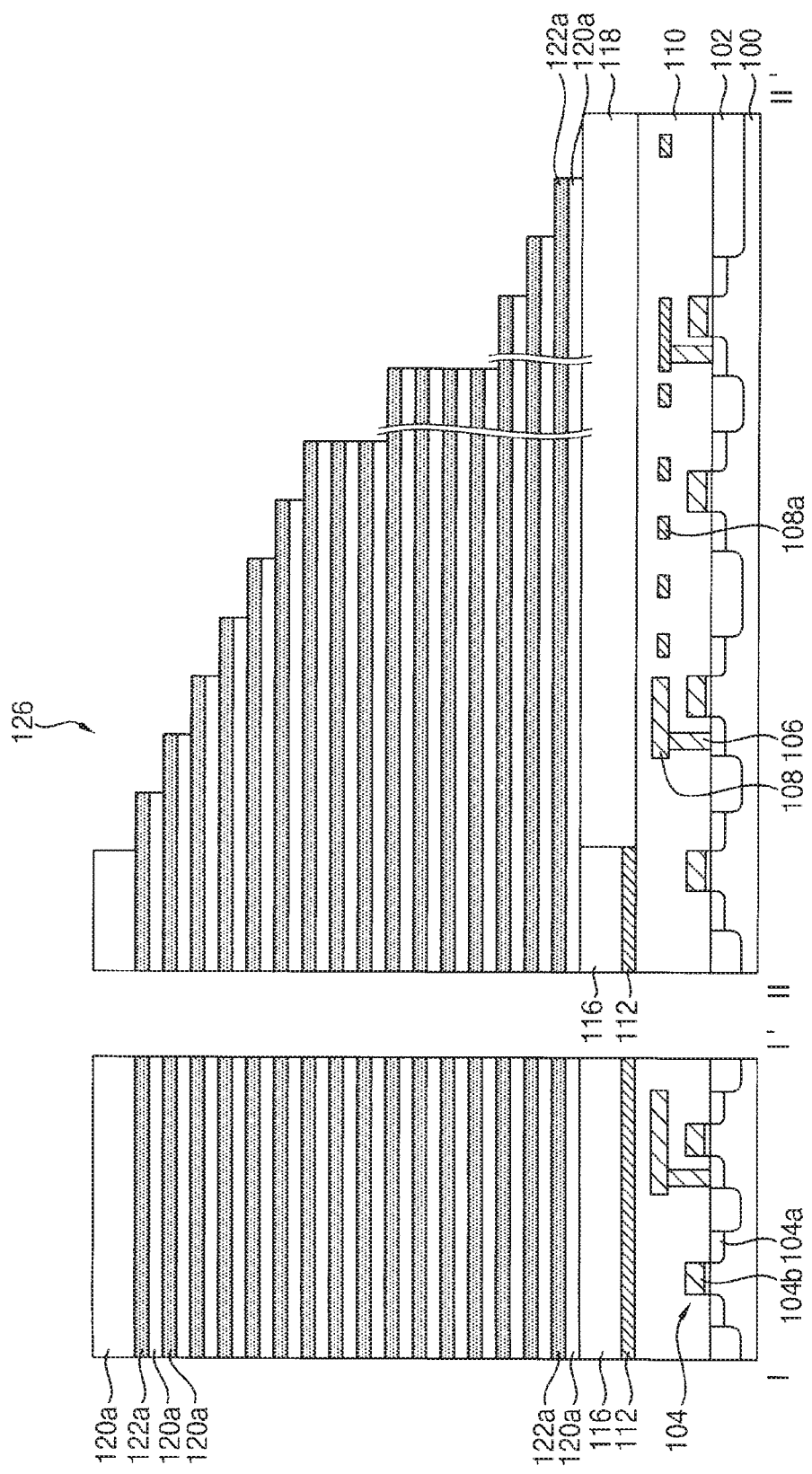
Figure 12:
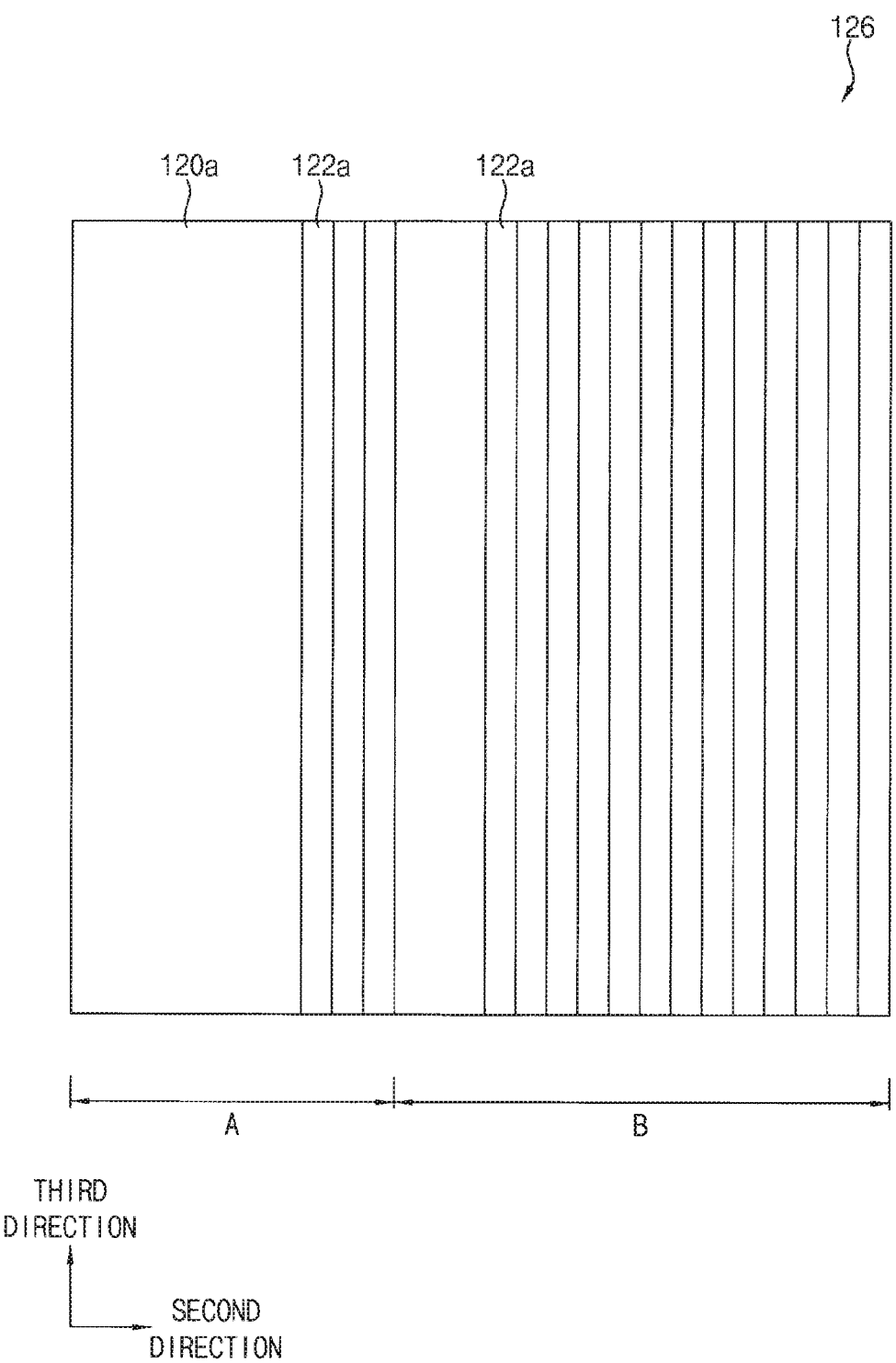

Referring to FIGS. 11 and 12, a structure including the first insulation layers 120 and the first sacrificial layers 122 repeatedly stacked may be patterned to form a preliminary mold structure 126 having a step shape in the second region B.

For forming the preliminary mold structure 126, first, a photoresist pattern (not shown) partially covering an uppermost one of the first insulation layers 120 may be formed on the uppermost one of the first insulation layers 120, and the uppermost one of the first insulation layers 120 and an uppermost one of the first sacrificial layers 122 thereunder may be etched using the photoresist pattern as an etching mask. Edge portions of the photoresist pattern may be partially removed to form a reduced photoresist pattern, and a trimming process in which the exposed one of the first insulation layers 120 and one of the first sacrificial layers 122 thereunder may be etched using the reduced photoresist pattern as an etching mask may be performed. As the trimming process is repeatedly performed, a preliminary mold structure 126 including a plurality of steps may be formed.

In some example embodiments, each step of the preliminary mold structure 126 may have a structure including the first insulation pattern 120a and the first sacrificial pattern 122a stacked. In some example embodiments, the first sacrificial pattern 122a may be exposed at an upper surface of each step of the preliminary mold structure 126.

In some example embodiments, steps being served as pads electrically connected to SSL and/or dummy lines may be formed at an edge portion in the second direction of the first region A. That is, a plurality of steps (for example, two to four steps) positioned at a top portion of preliminary mold structure may be formed in the first region A. Also, as shown in FIG. 12, an upper surface of the step formed between the first and second regions A and B may have a relatively wide width in the second direction.

Figure 13:
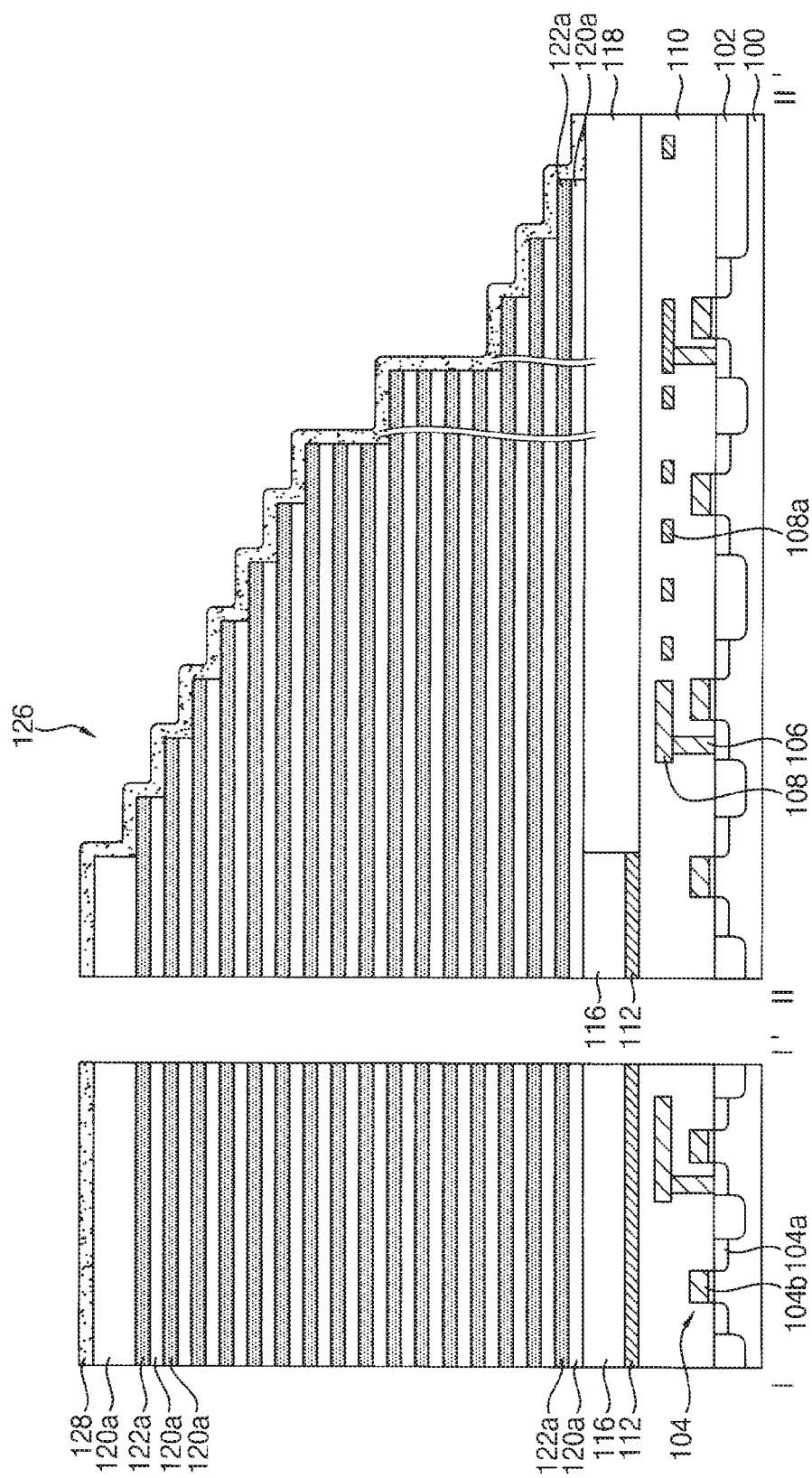

Referring to FIG. 13, a second sacrificial layer 128 may be formed on a surface of the preliminary mold structure 126. The second sacrificial layer 128 may include a silicon nitride material as similar to a material of the first sacrificial pattern 122a, but the second sacrificial layer 128 may have an etching rate higher than an etching rate of first sacrificial pattern 122a. That is, in the same wet etching process, the second sacrificial layer 128 may be etched faster than the first sacrificial pattern 122a. For example, the second sacrificial layer 128 may be formed using a precursor different from a precursor of the first sacrificial pattern 122a. For example, the second sacrificial layer 128 may be formed by a deposition process different from a deposition process for forming the first sacrificial pattern 122a.

The second sacrificial layer 128 may be conformally formed on a top surface of the preliminary mold structure 126 and upper surfaces and sidewalls of the steps of the preliminary mold structure 126.

Figure 14:
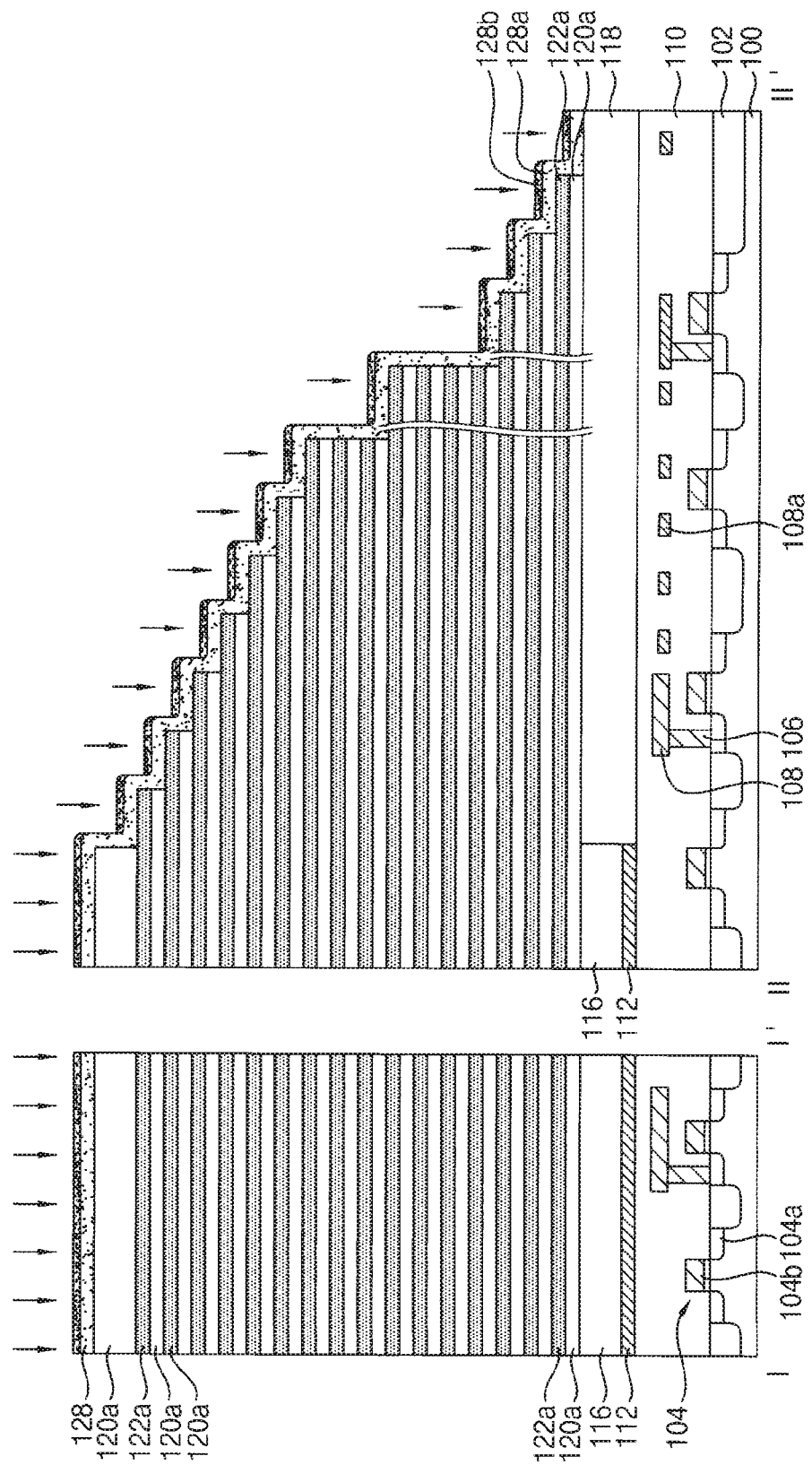

Referring to FIG. 14, a plasma surface treatment process may be performed on a surface of the second sacrificial layer 128. The plasma surface treatment process may be performed so that plasma damage may be applied to a given thickness from the upper surface of the second sacrificial layer 128.

When the plasma surface treatment process is performed, the plasma may be applied in the first direction. Thus, the plasma damage may hardly occur at the second sacrificial layer 128 formed on the sidewalls of the steps.

An upper portion of the second sacrificial layer 128 on the upper surface of the steps may serve as a third sacrificial pattern 128b having the plasma damage, and a lower portion of the second sacrificial layer 128 on the upper surface of the steps may serve as a second sacrificial pattern 128a having no plasma damage.

The plasma-treated third sacrificial pattern 128b may have a density higher than a density of the second sacrificial pattern 128a, and the third sacrificial pattern 128b may have an impurity concentration higher than an impurity concentration of the second sacrificial pattern 128a. Thus, the third sacrificial pattern 128b may have an etching rate lower than that of the second sacrificial pattern 128a. That is, in the same wet etching process, the third sacrificial pattern 128b may be etched more slowly than the second sacrificial pattern 128a.

Figure 15:
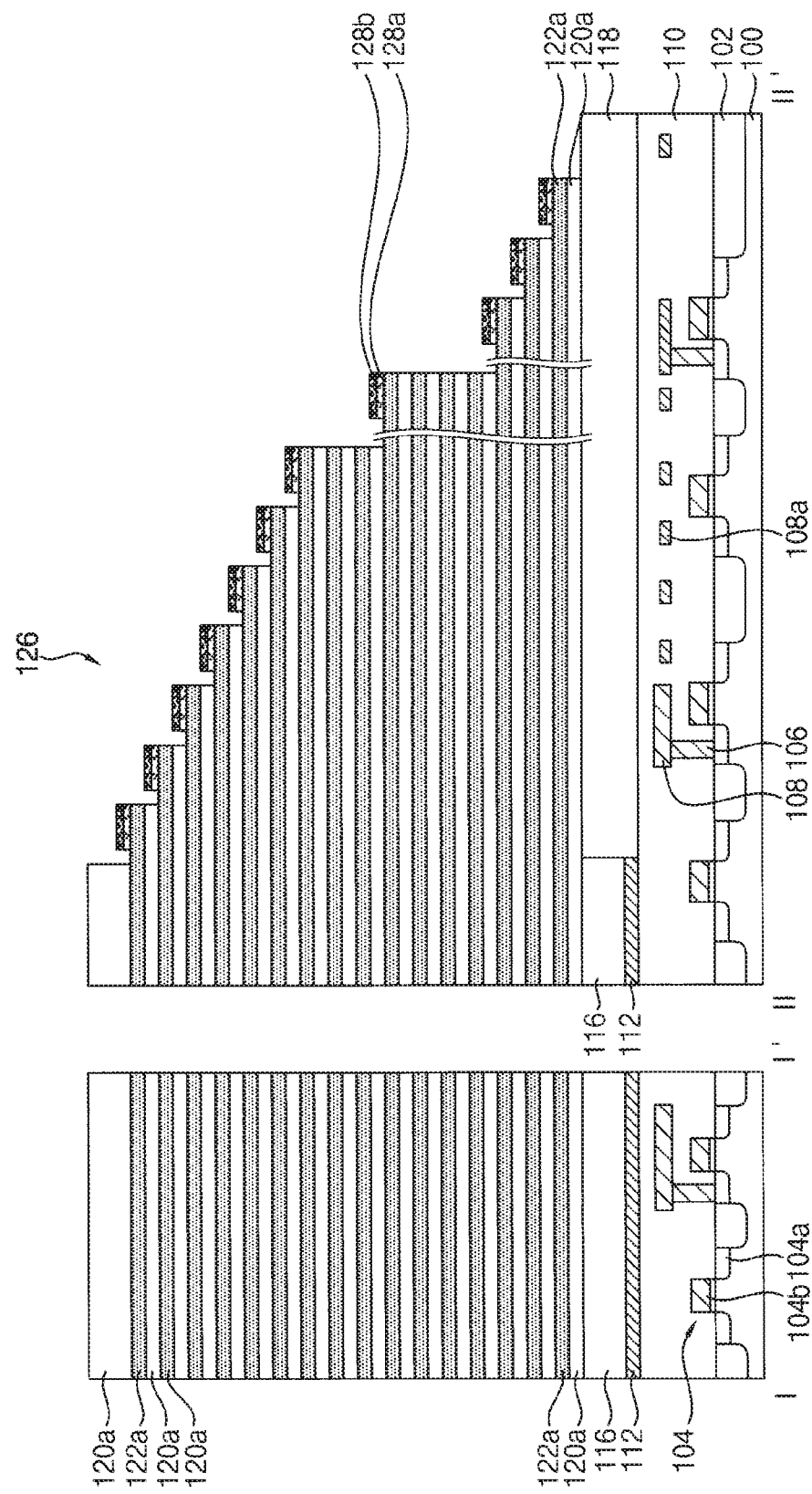

Referring to FIG. 15, the second sacrificial layer 128 formed on the sidewall of each step may be selectively removed. The removal process may include a wet etching process.

The second sacrificial layer 128 formed on the sidewall of each step may have a higher etching rate than that of the third sacrificial pattern 128b, so that the second sacrificial layer 128 formed on the sidewall of each step may be etched faster than the third sacrificial pattern 128b. Thus, only the second sacrificial layer 128 formed on the sidewall of each step may be selectively etched, and the third sacrificial pattern 128b and the second sacrificial pattern 128a thereunder may not be substantially etched.

By the etching process, the step portion (e.g., an exposed edge portion) of the preliminary mold structure 126 may include the first insulation pattern 120a, the first sacrificial pattern 122a, the second sacrificial pattern 128a, and the third sacrificial pattern 128b stacked.

In some example embodiments, the first sacrificial pattern 122a may have a first etching rate, and the second sacrificial pattern 128a may have a second etching rate higher than the first etching rate. Also, the third sacrificial pattern 128b may have a third etching rate lower than the first etching rate.

In the preliminary mold structure 126 of the second region B, an unexposed portion which may be covered by an upper layer may include the first insulation patterns 120a and the first sacrificial patterns 122a stacked. That is, the unexposed portion may be disposed below the step portion in the first direction.

Thus, the second sacrificial pattern 128a and the third sacrificial pattern 128b may be further formed on an edge portion in the second direction of the first sacrificial pattern 122a, so that the edge portion in the second direction may have a height higher than a height of the upper surface of the other portions.

Figure 16:
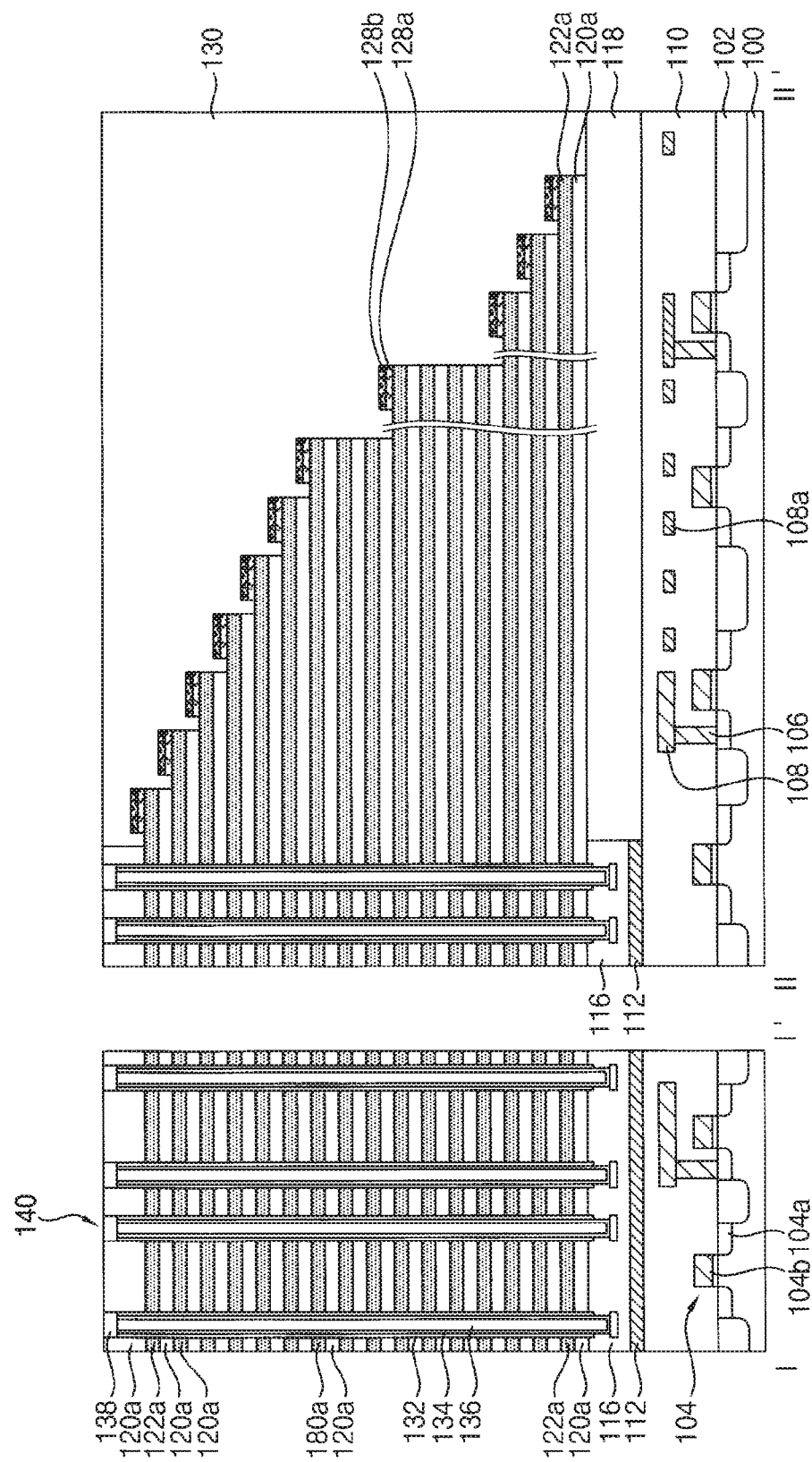

Referring to FIG. 16, an insulation layer covering the preliminary mold structure 126 may be formed, and an upper surface of the insulation layer may be planarized to form a first insulating interlayer 130. Thereafter, a channel structure 140 may be formed through the first insulating interlayer 130 and the preliminary mold structure 126, so that the channel structure 140 may contact the base pattern 116. In some example embodiments, the channel structure 140 may be formed through the preliminary mold structure 126 in the first region A. The channel structure 140 may include a charge storage structure 132, a channel 134, a filling insulation pattern 136, and a capping pattern 138.

Particularly, the first insulation patterns 120a and the first sacrificial patterns 122a may be etched, and then the base pattern 116 may be partially etched to form channel holes extending in the base pattern 116.

The charge storage structure 132 including a tunnel insulation pattern, a charge storage pattern, and a blocking pattern may be formed on a sidewall of the channel hole. Then, a channel layer may be formed on the charge storage structure 132 and the base pattern 116, and a filling insulation layer may be formed on the channel layer to fill the channel hole. Upper surfaces of the filling insulation layer and the channel layer may be planarized to form the channel pattern and the filling insulation layer in the channel hole. Upper portions of the filling insulation layer and the channel pattern may be partially removed to form the filling insulation pattern 136 and the channel 134, respectively. The capping pattern 138 may be formed on the filling insulation pattern 136 and the channel 134 to fill a recess on the filling insulation pattern 136 and the channel 134. The capping pattern 138 may include polysilicon.

Figure 17:
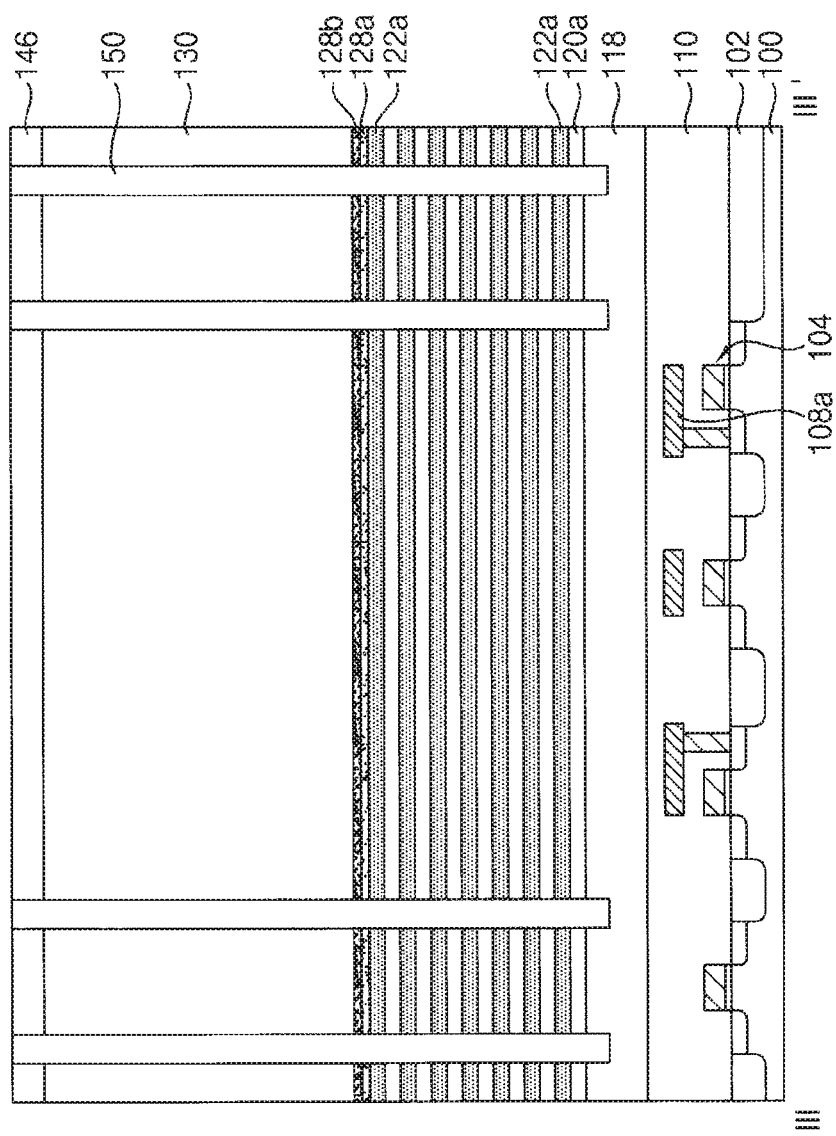
Figure 18:
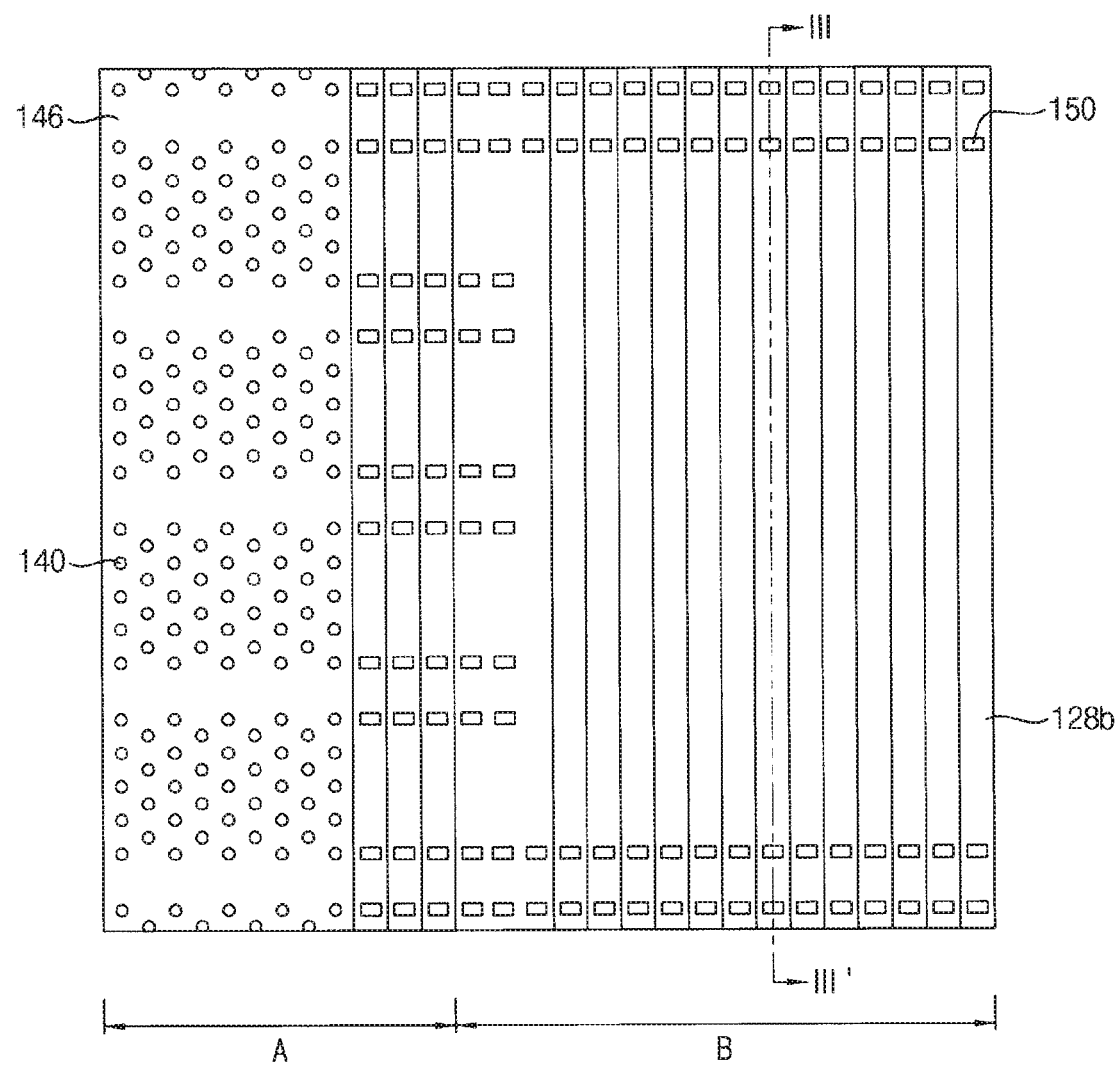

Referring to FIGS. 17 and 18, a second insulating interlayer 146 may be formed on the first insulating interlayer 130. A support 150 extending in the first direction may be formed through the second insulating interlayer 146, the first insulating interlayer 130 and the preliminary mold structure 126 in the second region B.

Particularly, the second insulating interlayer 146, the first insulating interlayer 130, the first insulation patterns 120a, and the first sacrificial patterns 122a in the second region B may be etched to form dummy holes extending to an inner portion of the base insulation layer 118.

In some example embodiments, the dummy holes may be disposed at an edge portion in the second direction of a region for forming a cell block structure. That is, the dummy holes may be adjacent to a block cutting region, that is, a CSL forming region. The dummy holes may be arranged in the second direction. In some example embodiments, the dummy holes may be further formed at a pad region of the SSL adjacent to the word line cutting region.

Thereafter, an insulation layer may be formed to fill the dummy holes, and the insulation layer may be planarized until an upper surface of the second insulating interlayer 146 may be exposed to form the support 150 filling the dummy hole. In some example embodiments, the support 150 may include silicon oxide, and may have a pillar shape.

In some example embodiments, the process of forming the support 150 may not be performed. In this case, the channel structures 140 may be formed in the preliminary mold structure 126 in each of the first and second regions A and B. The channel structure formed in the second region B may not serve as an actual memory cell but may serve as a support for supporting a stepped structure.

Figure 19:
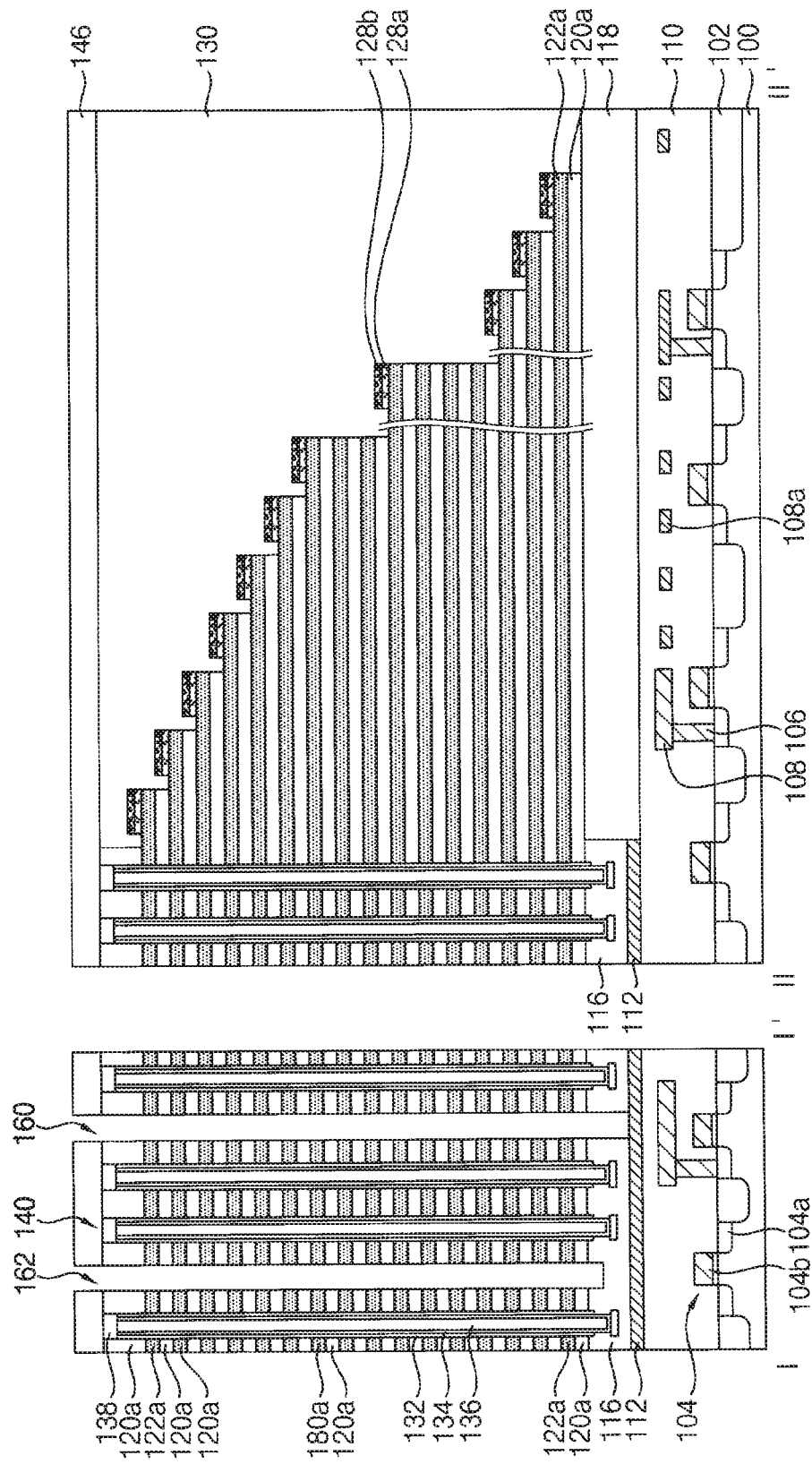
Figure 20:
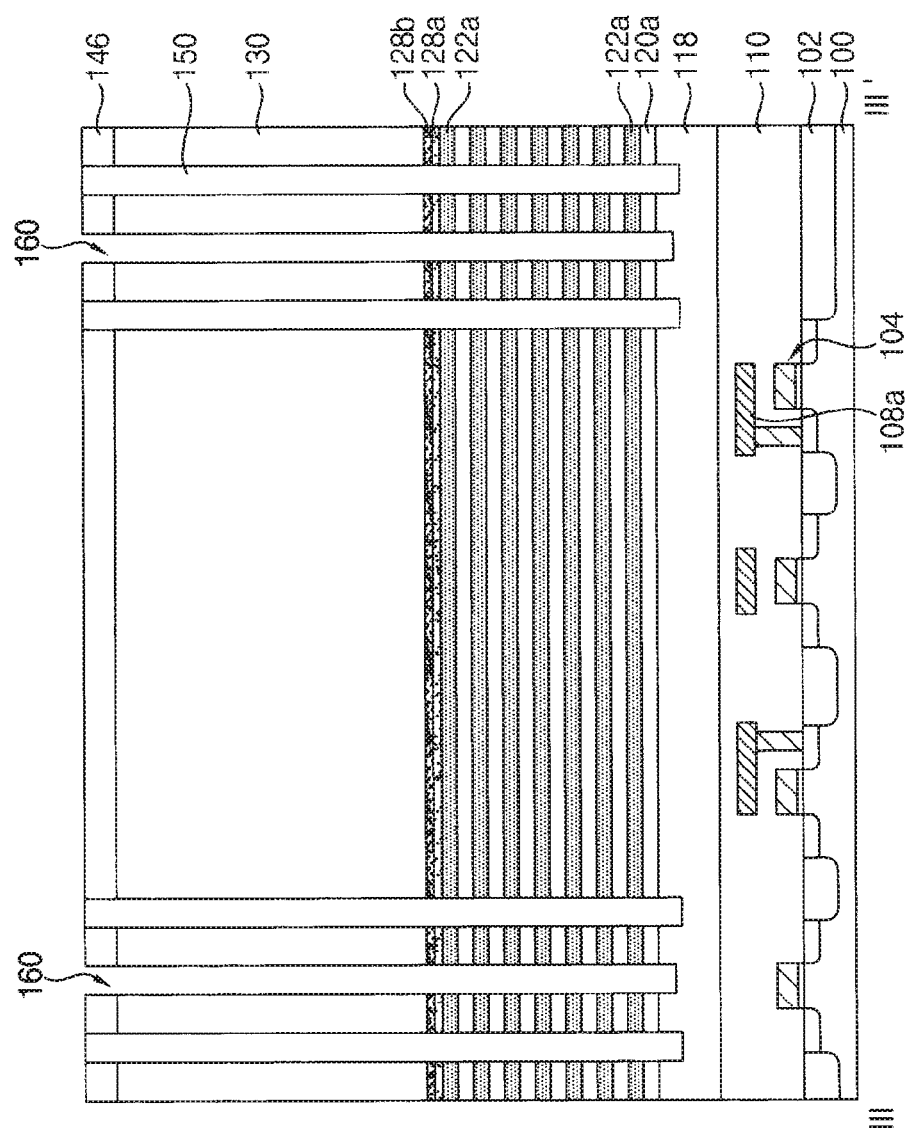
Figure 21:
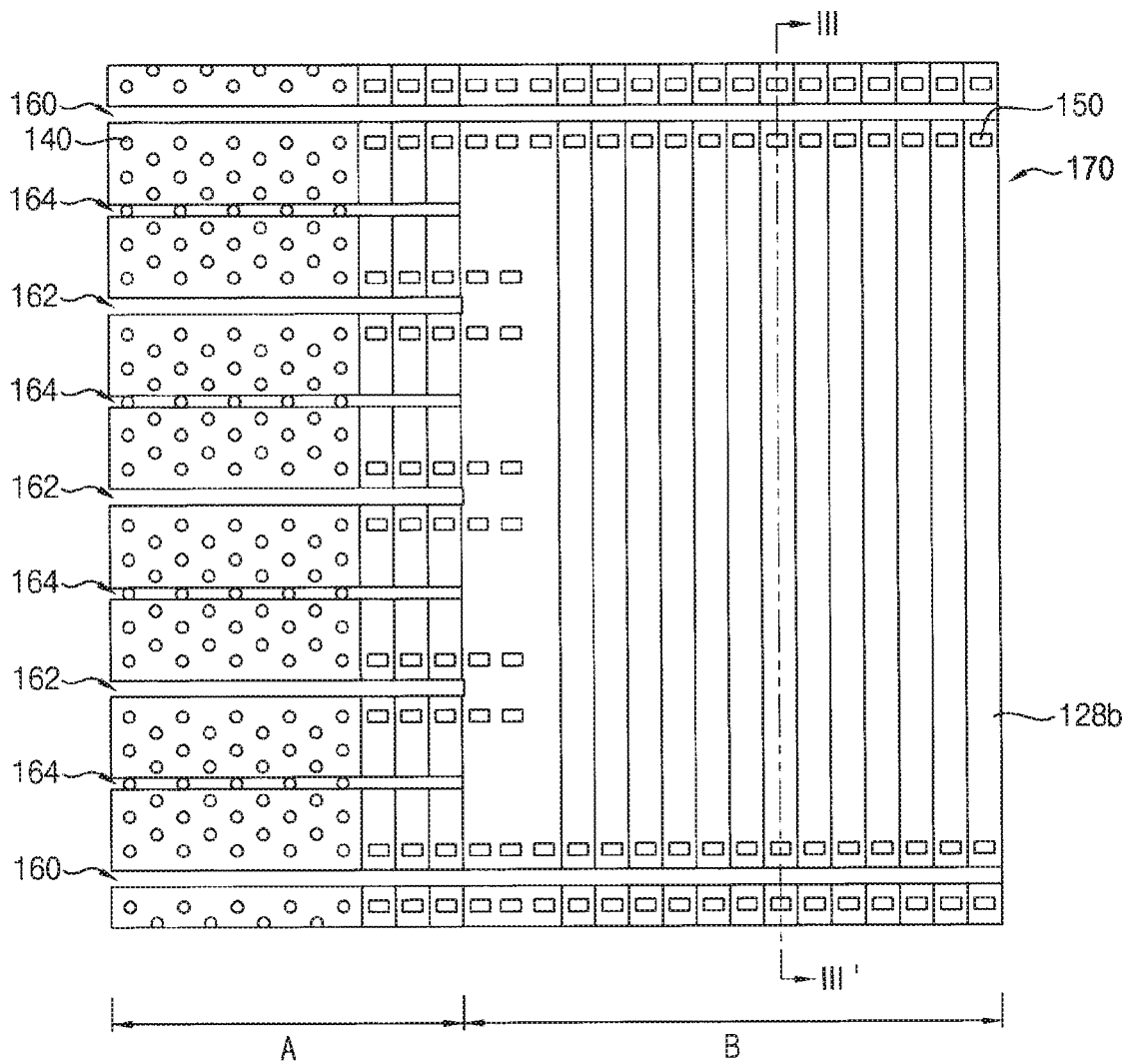

Referring to FIGS. 19 to 21, an etching mask may be formed on the second insulating interlayer 146, and a first opening 160 and a second opening 162 may be formed through the first and second insulating interlayers 130 and 146 and the first insulation patterns 120a and the first sacrificial patterns 122a. Thus, the preliminary mold structure may be converted to the mold structure 170.

The first opening 160 may be formed in the first and second regions A and B to extend in the second direction. The first opening 160 may serve as a block cutting region for separating of cell blocks. In some example embodiments, the first opening 160 may be formed by etching the first and second insulating interlayers 130 and 146, the base pattern 116, the first insulation patterns 120a, the first sacrificial patterns 122a and the base insulation layer 118. An upper surface of the lower conductive pattern 112 may be exposed by the first opening 160.

The second opening 162 may be formed only in the first region A, and may extend in the second direction. The second opening 162 may serve as the word line cutting region for separating of the gate electrodes serving as word lines. In some example embodiments, the second opening 162 may be formed through the first and second insulating interlayers 130 and 146, the first insulation patterns 120a, and the first sacrificial patterns 122a, and may extend to an inner portion of the base pattern 116. Thus, the base pattern 116 may be exposed by the second opening 162.

As described above, cell blocks may be separated by the first opening 160. In one of the cell blocks, the first insulation patterns 120a and the first sacrificial patterns 122a may be separated in the third direction by the second openings 162. The second opening may be formed on only the first region A, the first insulation patterns 120a and the first sacrificial patterns 122a in the second region B may not be separated to have a merged shape.

In some example embodiments, uppermost ones of the first insulation patterns 120a and first sacrificial patterns 122a may be etched to form a third opening 164. The third opening 164 may be a trench extending in the second direction. An insulation pattern (not shown) may be formed to fill the third opening 164. The third opening 164 may be an SSL cutting region for forming the SSL. However, since only the SSL is separated in the third direction by the third opening 164, the first sacrificial patterns 122a corresponding to word lines under the SSL may not be separated from each other by the third opening 164.

Figure 22:
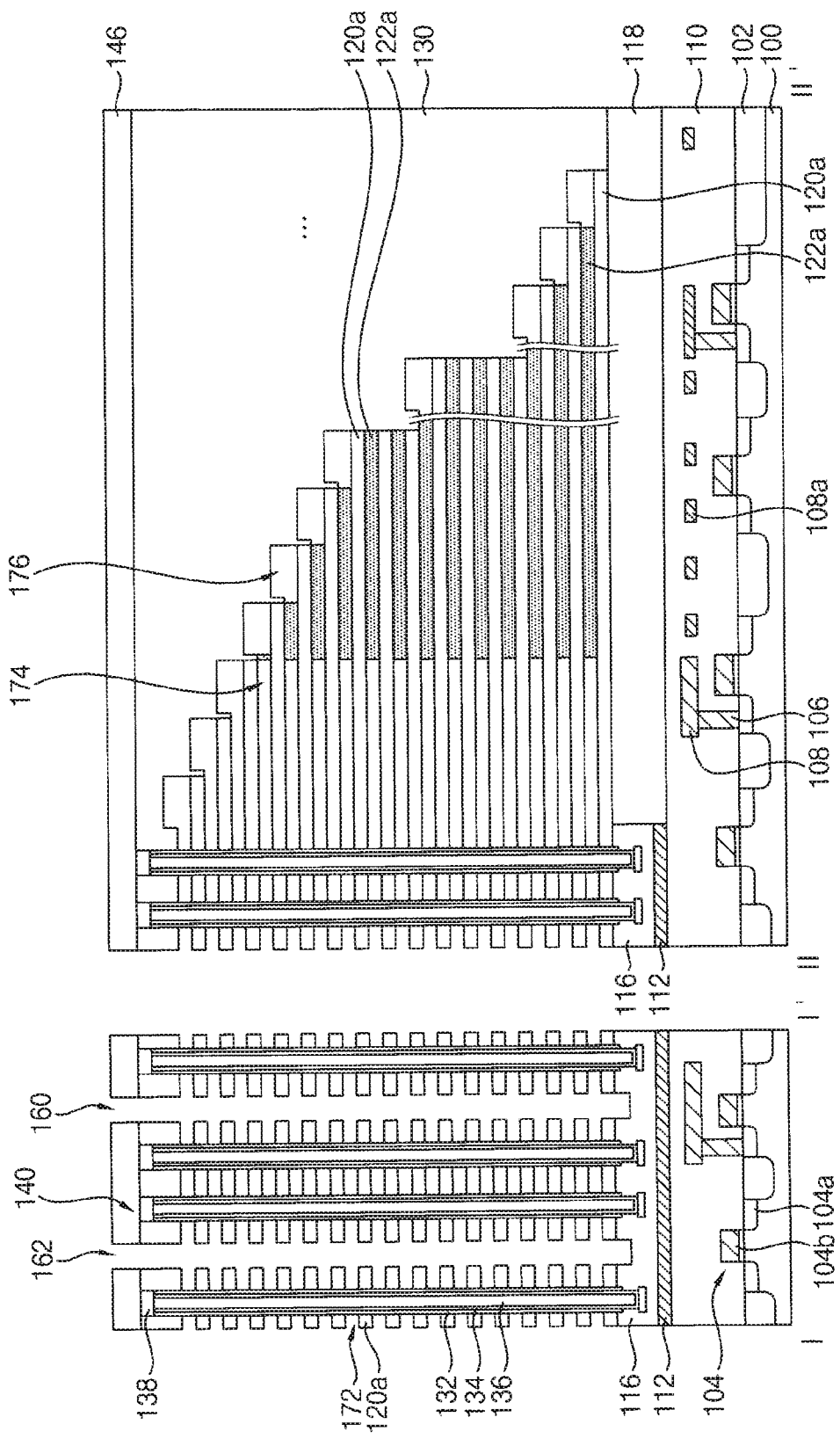
Figure 23:
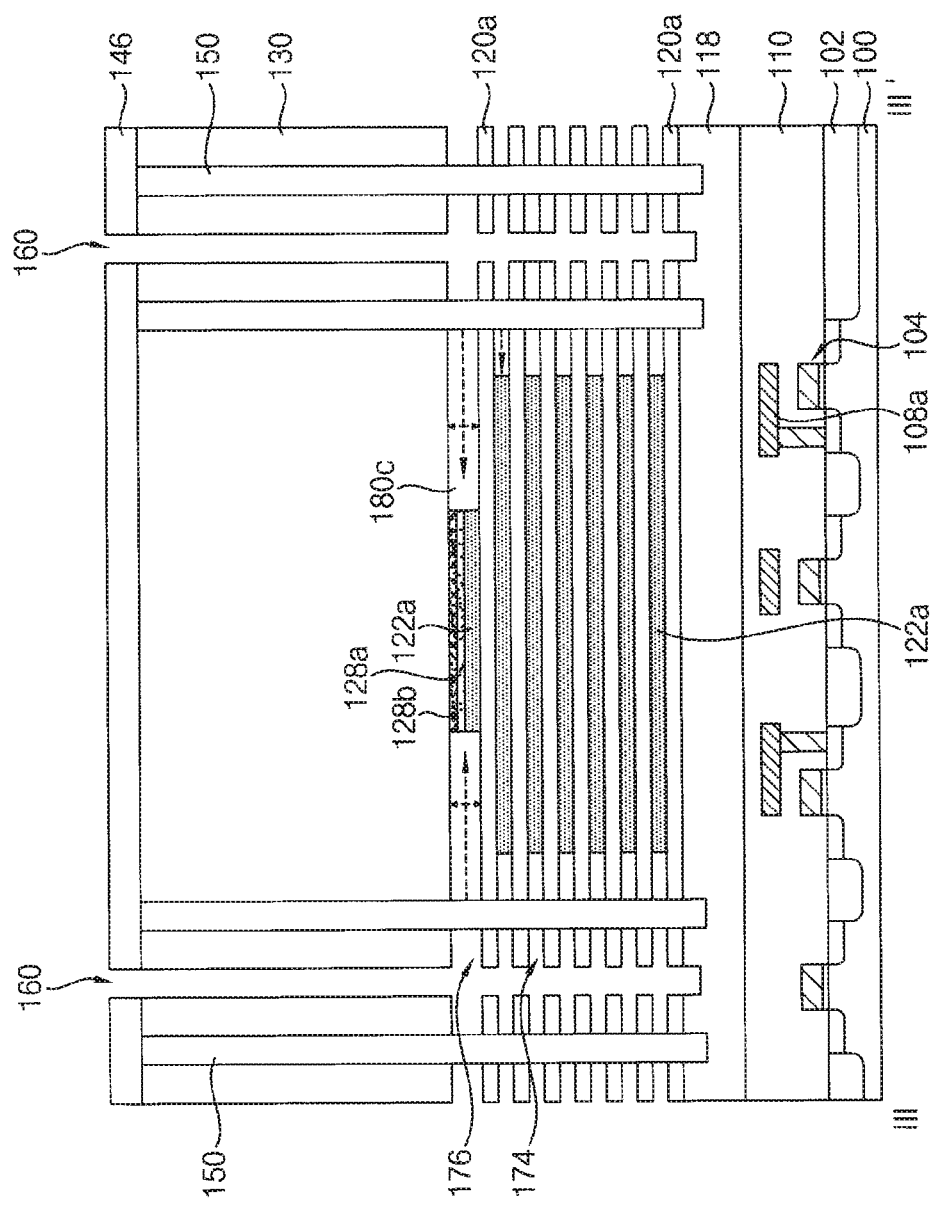
Figure 24:
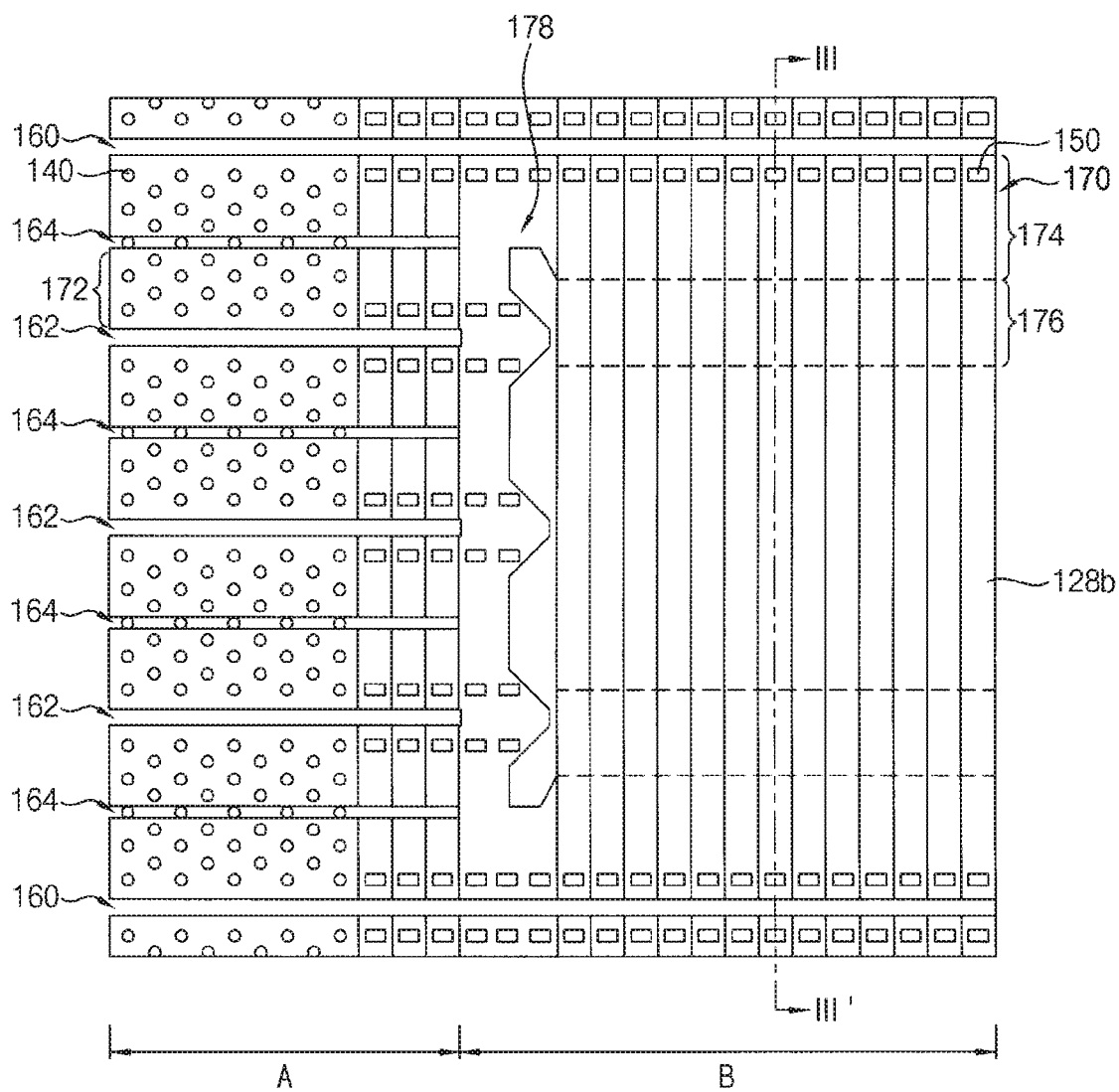

Referring to FIGS. 22 to 24, at least portions of the first sacrificial patterns 122a exposed by the first and second openings 160 and 162 may be removed to form a first gap 172, a second gap 174, a third gap 176 and a fourth gap 178 between the first insulation patterns 120a. The removing process may include a wet etching process.

Particularly, in the first region A, the first sacrificial patterns 122a may be exposed by a sidewall of the first opening 160 and a sidewall of the second opening 162. In the etching process, all of the first sacrificial patterns 122a in the first region A may be removed. Thus, the first gap 172 may be formed between the first insulation patterns 120a in the first region A.

Meanwhile, as the second opening 162 may not be formed in the second region B, the first sacrificial pattern 122a may be only exposed by the sidewall of the first openings 160. Also, the first to third sacrificial patterns 122a and 128a and 128b may be exposed by the sidewall of the first opening 160 corresponding to an upper surface of each step.

As spacing in the third direction between the first opening 160 is relatively great, the first to third sacrificial patterns 122a, 128a and 128b between the first opening 160 may not be all removed. Thus, the first to third sacrificial patterns 122a, 128a and 128b may be partially removed in the third direction by the etching process, so that each of the second and third gaps 174 and 176 may be formed.

The second gap 174 may be formed by removing the first sacrificial patterns 122a of both sides of the mold structure 170. The third gap 176 may be formed by removing the first to third sacrificial patterns 122a, 128a, and 128b exposed at both sides of the mold structure.

The second gap 174 may be formed at both edge portions in the third direction of the mold structure 170. The first insulation patterns 120a and the first sacrificial patterns 122a may remain stacked between the second gaps 174 in the third directions.

The third gap 176 may have a height in the first direction higher than a height in the first direction of the second gap 174. In the etching process, the second sacrificial pattern 128a exposed by the sidewall of the first opening 160 may be removed faster than the first sacrificial pattern 122a and the third sacrificial pattern 128b. Thus, a gap formed by etching the second sacrificial pattern 128a may be long in the third direction. In addition, an etchant may be further penetrated in the first direction to the gap, so that the first and third sacrificial patterns 122a and 128b formed on and under the second sacrificial pattern may be additionally etched. Thus, the third gap 176 may protrude in the third direction farther than the second gap 174.

In some example embodiments, the third gap 176 may be formed at both edge portions in the third direction of the mold structure 170. Thus, the first insulation patterns 120a and the first sacrificial patterns 122a may remain stacked between the third gaps in the third direction.

In the etching process, etchant may flow to a portion adjacent to an end portion in the second direction of the second opening 162 from the second opening 162, so that the fourth gap 178 may be formed at the portion. That is, the fourth gap 178 may be formed in the second region B adjacent to the first region A. The fourth gap 178 of each level may be through the mold structure 170 in the third direction. Therefore, in the same level, the first gap to the fourth gap 172, 174, 176, and 178 may be communicated with each other.

Figure 25:
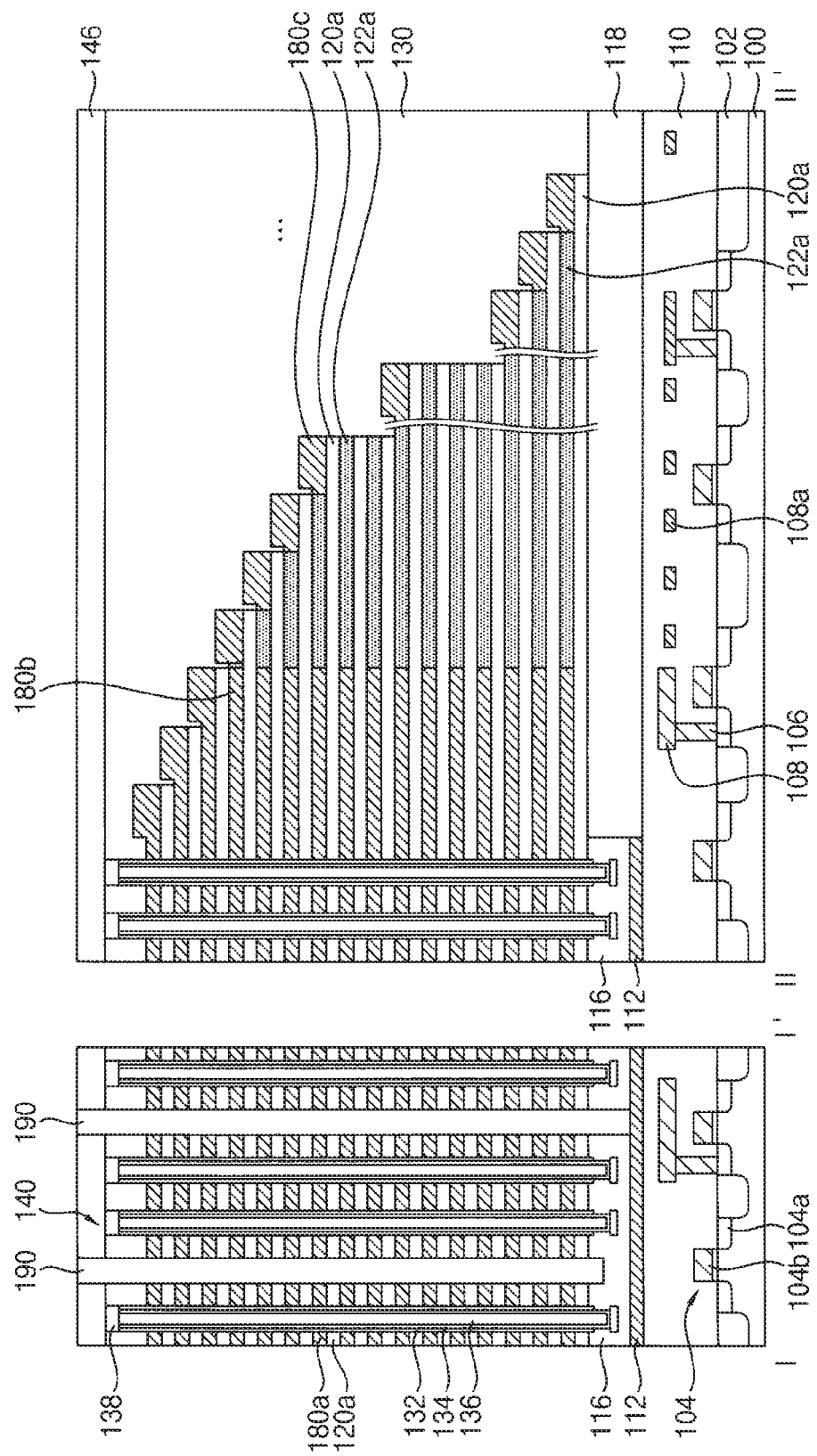
Figure 26:
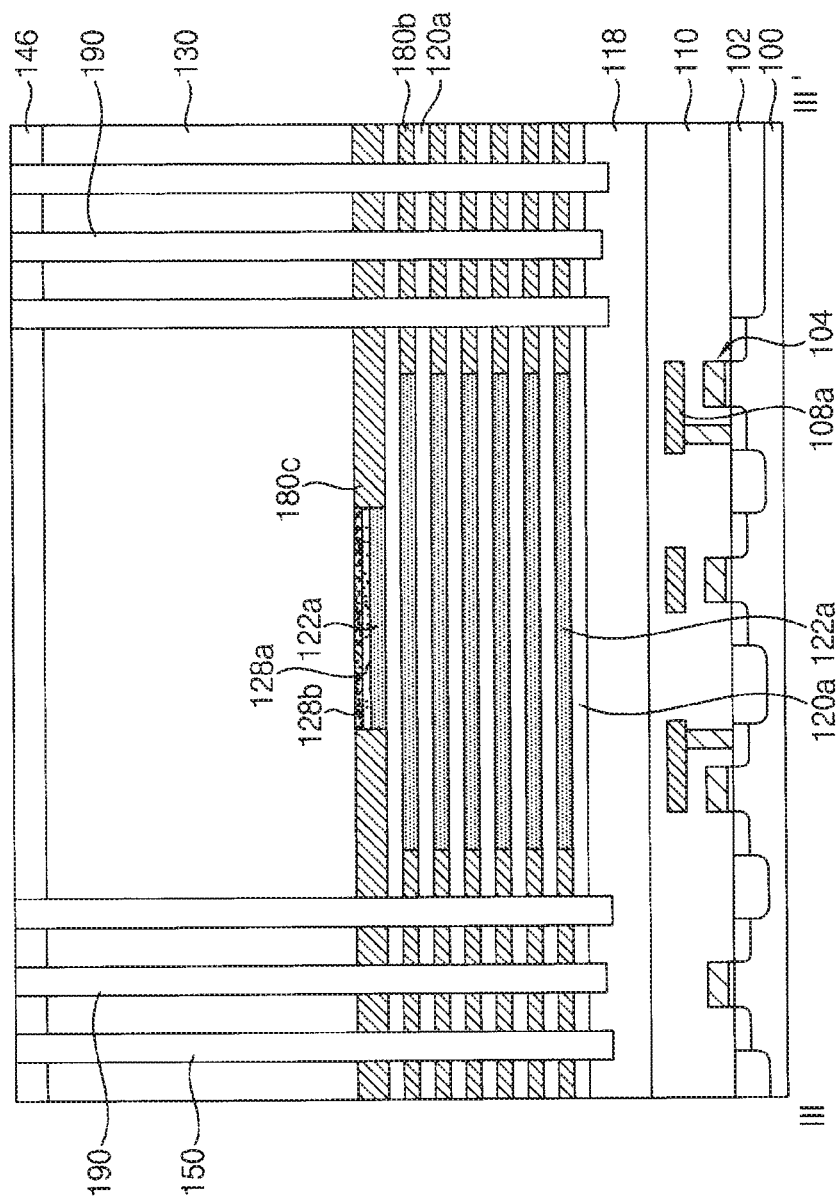

Referring to FIGS. 25 and 26, a first conductive layer may be formed to fill the first and second openings 160 and 162, and the first to fourth gaps 172, 174, 176, and 178. The first conductive layer may include a metal material, e.g., tungsten, copper, aluminum, etc. before forming the first conductive layer. Before forming the first conductive layer, a barrier metal layer may be further formed on surfaces of the first and second openings 160 and 162 and the first to fourth gaps 172, 174, 176, and 178.

The first conductive layer filling the first and second openings 160 and 162 may be removed to form a conductive pattern filling each of the first to fourth gaps 172, 174, 176, and 178.

In some example embodiments, the conductive pattern filling the first gap 172 may serve as a gate electrode 180a. The gate electrode 180a may extend in the second direction.

The conductive pattern filling the second gap 174 may serve as a conductive line 180b (refer to FIG. 3) extending in the second direction from the edge portion of the cell block in the second region B.

The conductive pattern filling the third gap 176 may serve as a pad pattern 180c protruding in the third direction from an end portion in the second direction of the conductive line 180b.

The conductive pattern filling the fourth gap 178 may serve as a connection line 180d (refer to FIG. 3) for connecting the gate electrodes 180a of the same level formed in the cell block in the second region B adjacent to the first region A.

Thus, the gate electrode 180a, the conductive line 180b, the pad pattern 180c, and the connection line 180d of the same level, which may be formed in the first to fourth gaps 172, 174, 176, and 178 of the same level, may be connected to each other.

In the second region B, portions for forming the conductive line 180b, the pad pattern 180c, and the connection line 180d of each level may be a conductive line region. The pad pattern may serve as an actual pad region.

Meanwhile, in the second region B, portions where the second to fourth gaps 174, 176 and 178 are not formed may not be replaced with conductive materials, so that the first insulation patterns 120a and the first sacrificial patterns 122a stacked may remain. Therefore, in the second region B, a region except for the conductive line region may be an insulation structure region including insulating materials stacked.

By the process, a merged pattern structure may be formed in the second region B. The merged pattern structure of each level may include the conductive line region and the insulating structure region. The merged pattern structure may include a first structure and a second structure. The first structure may include the conductive patterns extending from the gate electrodes 180a and the first insulation patterns 120a repeatedly stacked. The second structure may include the first sacrificial patterns 122a and the first insulation patterns 120a repeatedly stacked.

Then, a second insulation pattern 190 may be formed to fill the first and second openings 160 and 162.

Figure 27:
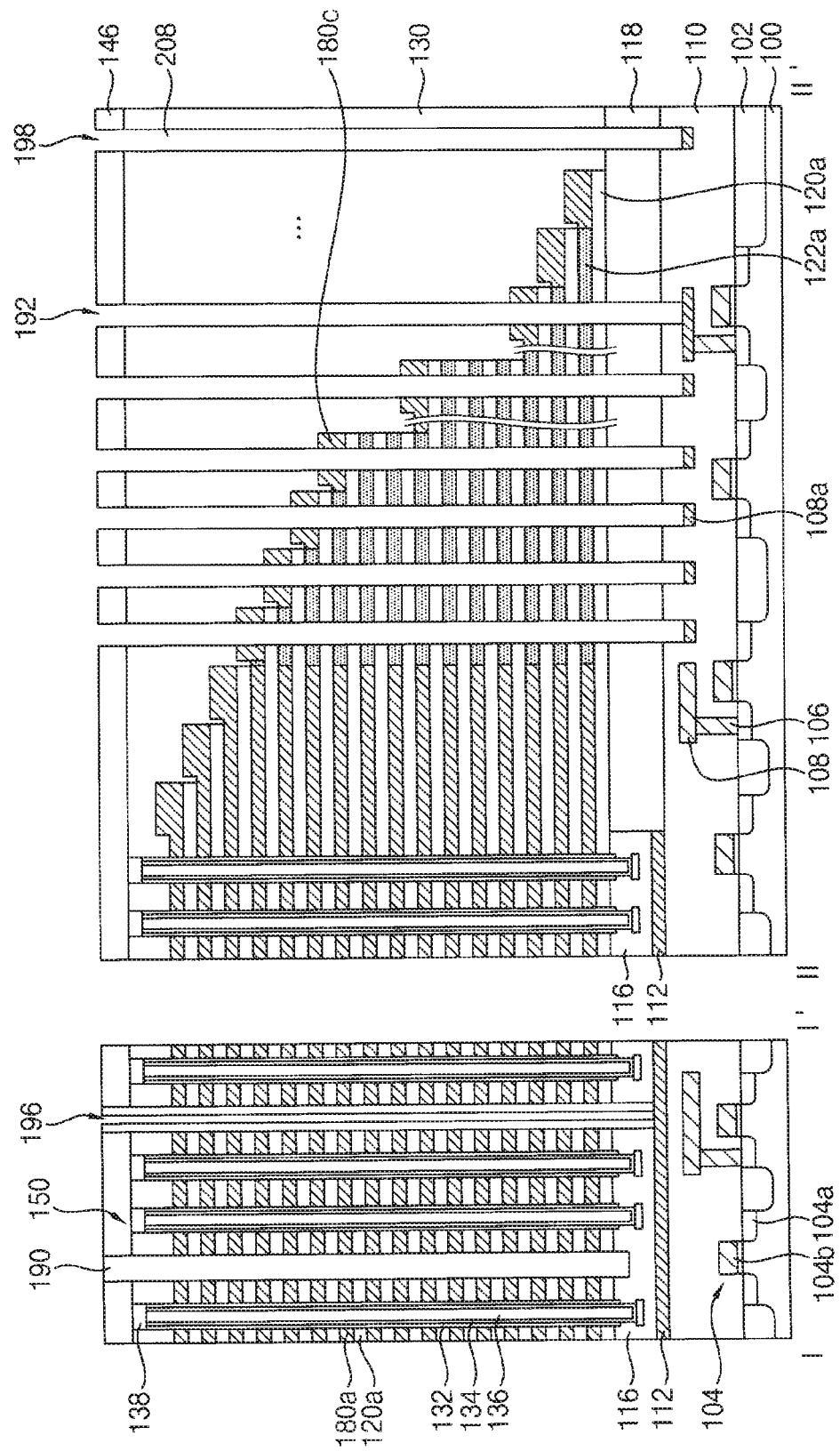
Figure 28:
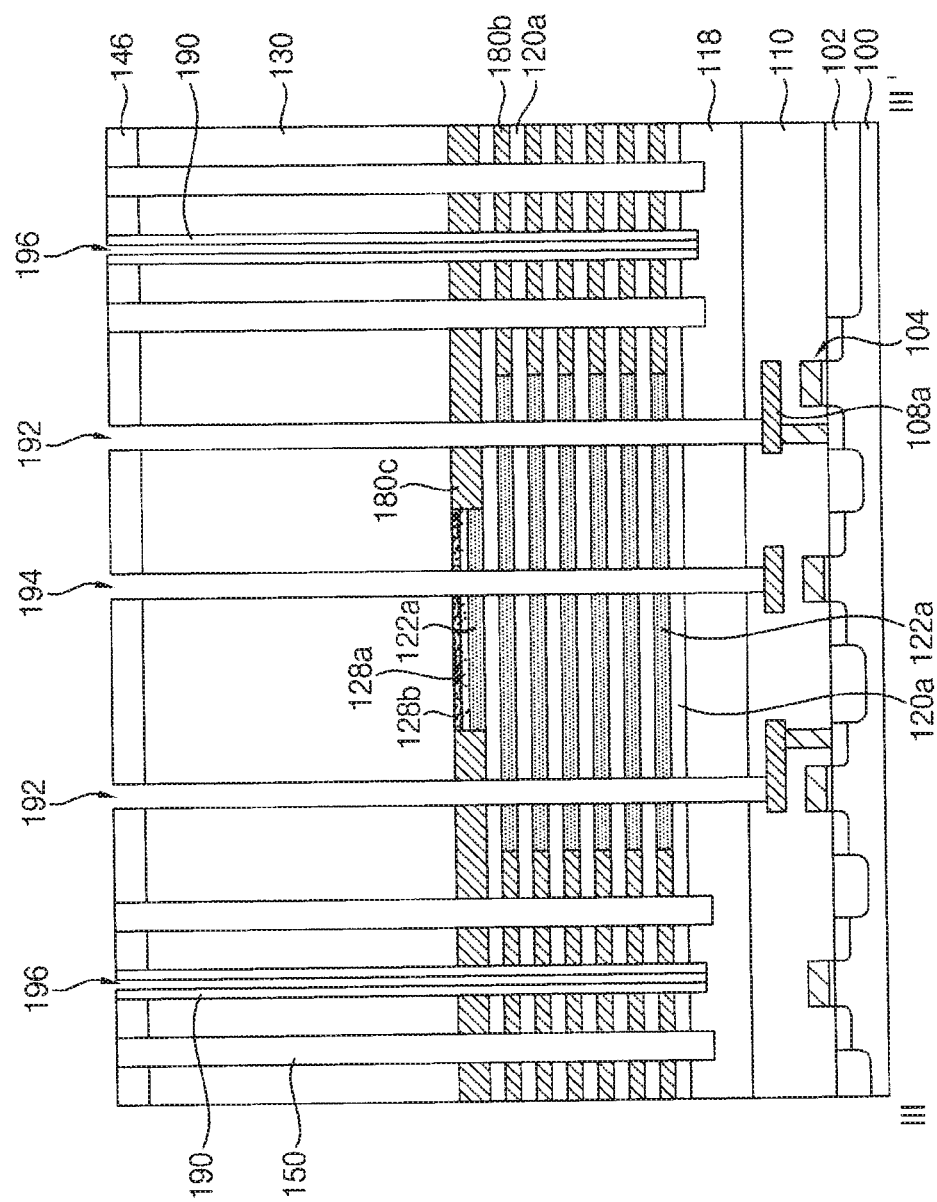

Referring to FIGS. 27 and 28, first through holes 192 may be formed through the first and second insulating interlayers 130 and 146 and the pad pattern 180c of the merged pattern structure. Further, a fourth opening 196 may be formed through the second insulation pattern 190 filling the first opening 160.

In some example embodiments, second through holes 194 may be further formed through only the first and second insulating interlayers 130 and 146 and the second structure of the merged pattern structure. In some example embodiments, a third through hole 198 may be further formed through only the first and second insulating interlayers 130 and 146 adjacent to the merged pattern structure in a lateral direction.

The first through holes 192 may extend in the first direction to expose an upper surface of the lower pad pattern 108a. In some example embodiments, the first through holes 192 may pass through the pad patterns 180c and insulation material layers formed on and below the pad patterns 180c.

In some example embodiments, the pad pattern 180c of each level may be formed at both sides in the third direction of the cell block. The first through holes 192 may pass through one of the pad patterns 180c of each level, and the first through holes 192 may expose an upper surface of the lower pad pattern 108a.

The second and third through holes 194 and 198 may extend in the first direction to expose an upper surface of the lower wiring 108 connecting the peripheral circuit. The second and third through holes 194 and 198 may be through only the insulating materials, and the second and third through holes 194 and 198 may not be through conductive material.

The fourth opening 196 may be formed for forming a CSL, and thus the lower conductive pattern 112 may be exposed by a bottom of the fourth opening 196.

Figure 29:
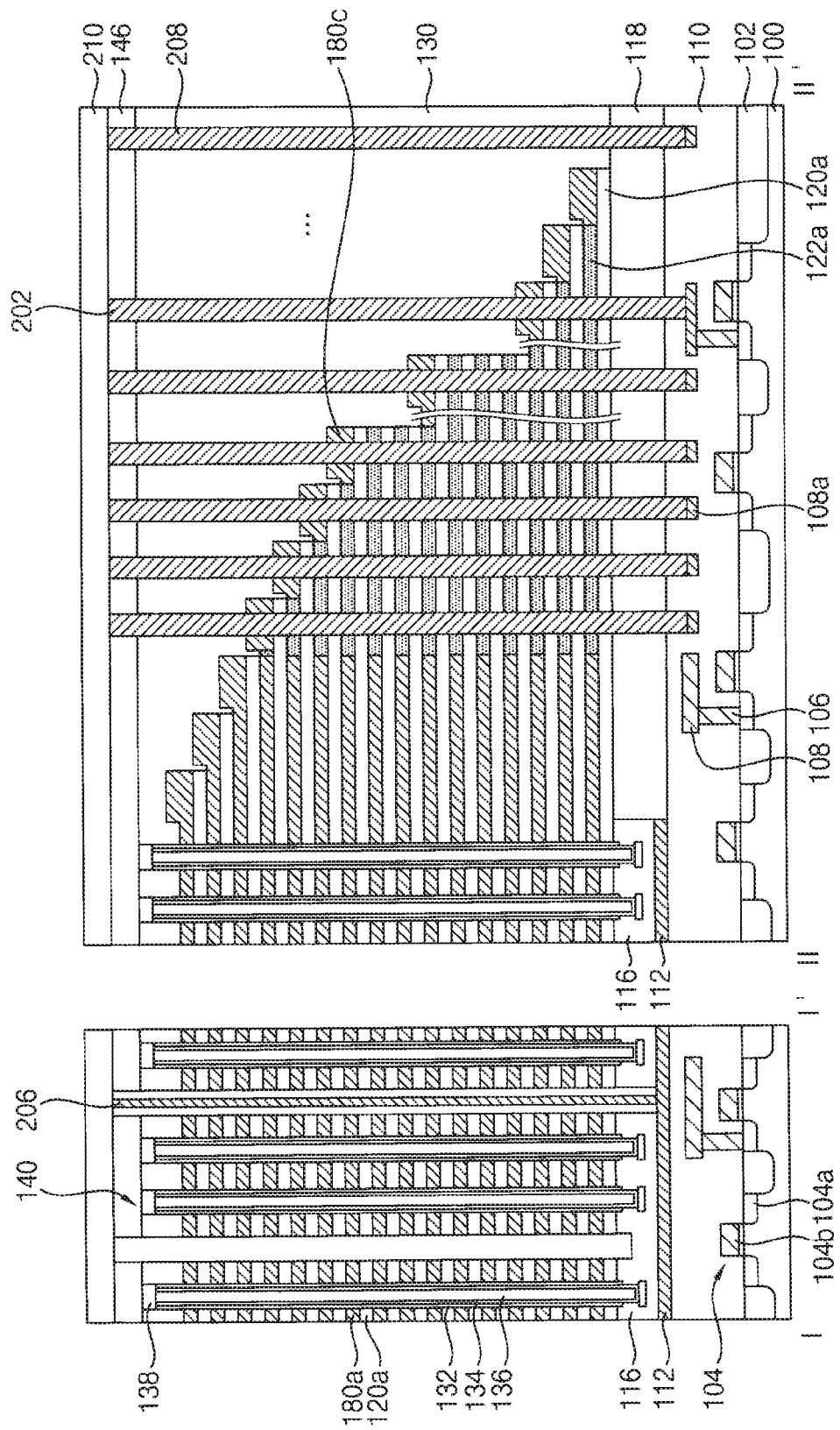
Figure 30:
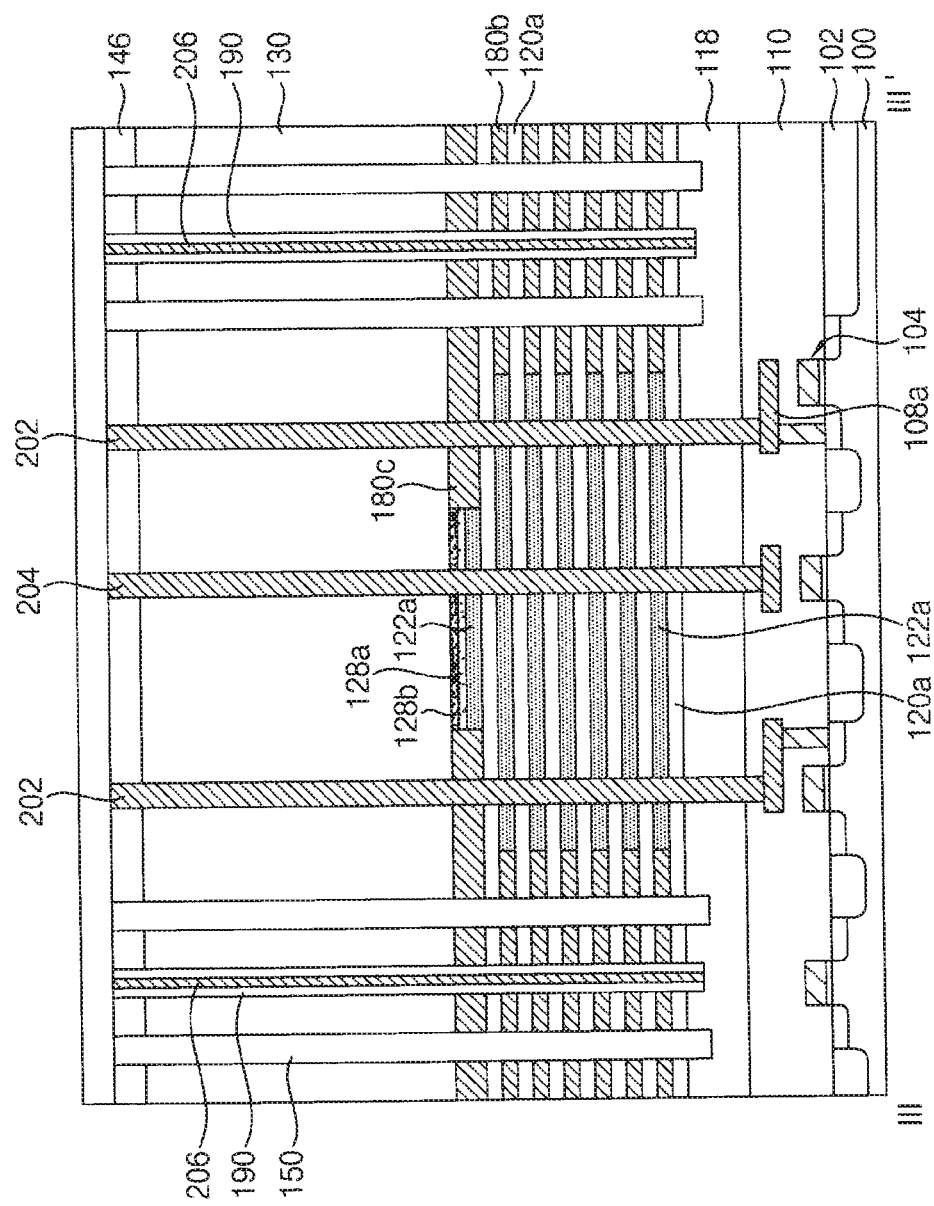

Referring to FIGS. 29 and 30, a conductive layer may be formed to fill the first through hole 192, the second through hole 194, the fourth opening 196, and the third through hole 198, and an upper surface of the conductive layer may be planarized. Thus, a cell contact plug 202, a through via contact 204, a CSL 206 and a via contact 208 may formed in the first through hole 192, the second through hole 194, the fourth opening 196, and the third through hole 198, respectively. Before forming the conductive layer, a second barrier layer (not shown) may be further formed.

In some example embodiments, the CSL 206 may extend in the second direction.

In some example embodiments, the cell contact plug 202 may be electrically connected to the pad pattern 180c, and cell contact plug 202 may extend through the merge structure and the base insulation layer 118. Thus, the cell contact plug 202 may be electrically connected to the lower pad pattern 108a in the lower insulating interlayer 110. The second structure including only insulation material may be disposed below the pad pattern 180c, so that the cell contact plug 202 may not be electrically connected to the gate electrode or the conductive pattern of other levels. That is, the cell contact plug 202 may be formed through the pad pattern 180c, the conductive line 180b and the connection line 180d to connect the gate electrode corresponding to the pad pattern 180c. However, the cell contact plug 202 may not be electrically connected to the gate electrode below the gate electrode corresponding to the pad pattern 180c.

In some example embodiments, the through via contact 204 may be through the second structure of the merged pattern structure and the base insulation layer 118, so that the through via contact 204 may be connected to a wiring connecting the peripheral circuits in the lower insulating interlayer 110. For example, the through via contact 204 may be electrically connected to the peripheral circuit and elements except for the gate electrode of the memory cell.

In some example embodiments, the via contact 208 may be through the first and second insulating interlayers 130 and 146 and the base insulation layer 118, so that the via contact 208 may be electrically connected to the wiring connecting the peripheral circuits in the lower insulating interlayer 110.

Referring to FIGS. 1 to 3 again, a third insulating interlayer 210 may be formed on the second insulating interlayer 146, the cell contact plug 202, the through via contact 204, the CSL 206, and the via contact 208.

A first upper contact 222 may be formed through the third insulating interlayer 210, so that the first upper contact 222 may contact the CSL. Also, a second upper contact 224 may be formed through the third insulating interlayer 210, so that the second upper contact 224 may contact the through via contact 204 and the via contact 208. A third upper contact 228 may be formed through the second and third insulating interlayers 146 and 210, so that the third upper contact 228 may contact an upper surface of the capping pattern 138. In some example embodiments, the first upper contact 222 contacting the CSL, the second upper contact 224 contacting the through via contact 204, and the third upper contact 228 contacting the via contact 208 may be formed through the third insulating interlayer 210, respectively.

In this case, an upper contact may not be formed on the cell contact plug 202.

Then, a first upper wiring 232, a second upper wiring 234 and a third upper wiring 238 may be formed to be electrically connected to the first upper contact 222, the second upper contact 224, and the third upper contact 228, respectively.

In some example embodiments, an SSL contact 240 may be formed through the first and second insulating interlayers 130 and 146, so that the SSL contact 240 may contact a top surface of the gate electrode corresponding to an SSL. Also, a fourth upper wiring 242 may be formed to be connected to the SSL contact 240.

A fourth insulating interlayer (not shown) may be formed on the third insulating interlayer 210 to cover the first to third upper wirings 232, 234, and 238.

Then, additional upper wirings may be formed, so that the vertical memory device may be manufactured.

As described above, in the vertical memory device of the COP structure, the cell contact plug may be directly connected to one of the gate electrodes and the lower pad electrode connecting the peripheral circuits. Thus, additional wiring or contact plugs may not be formed on the cell contact plug. Therefore, an arrangement of the wirings of the memory cell may be simplified.

In the above description, the cell contact plug may be connected to the lower pad pattern through the pad pattern. However, a shape of the cell contact plug may not be limited thereto.

Each of the vertical memory devices in accordance with some example embodiments described below is substantially the same as or similar to the vertical memory device shown in FIGS. 1 to 7 except for the shape of the cell contact plug formed in the cell block. Accordingly, a description of the same elements is omitted, and only the cell contact plug, the pad pattern, and the lower pad pattern are mainly described. In each of plan views, the pad pattern included in the merged pattern structure may have a rectangular shape, but may not be limited thereto.

Figure 31:
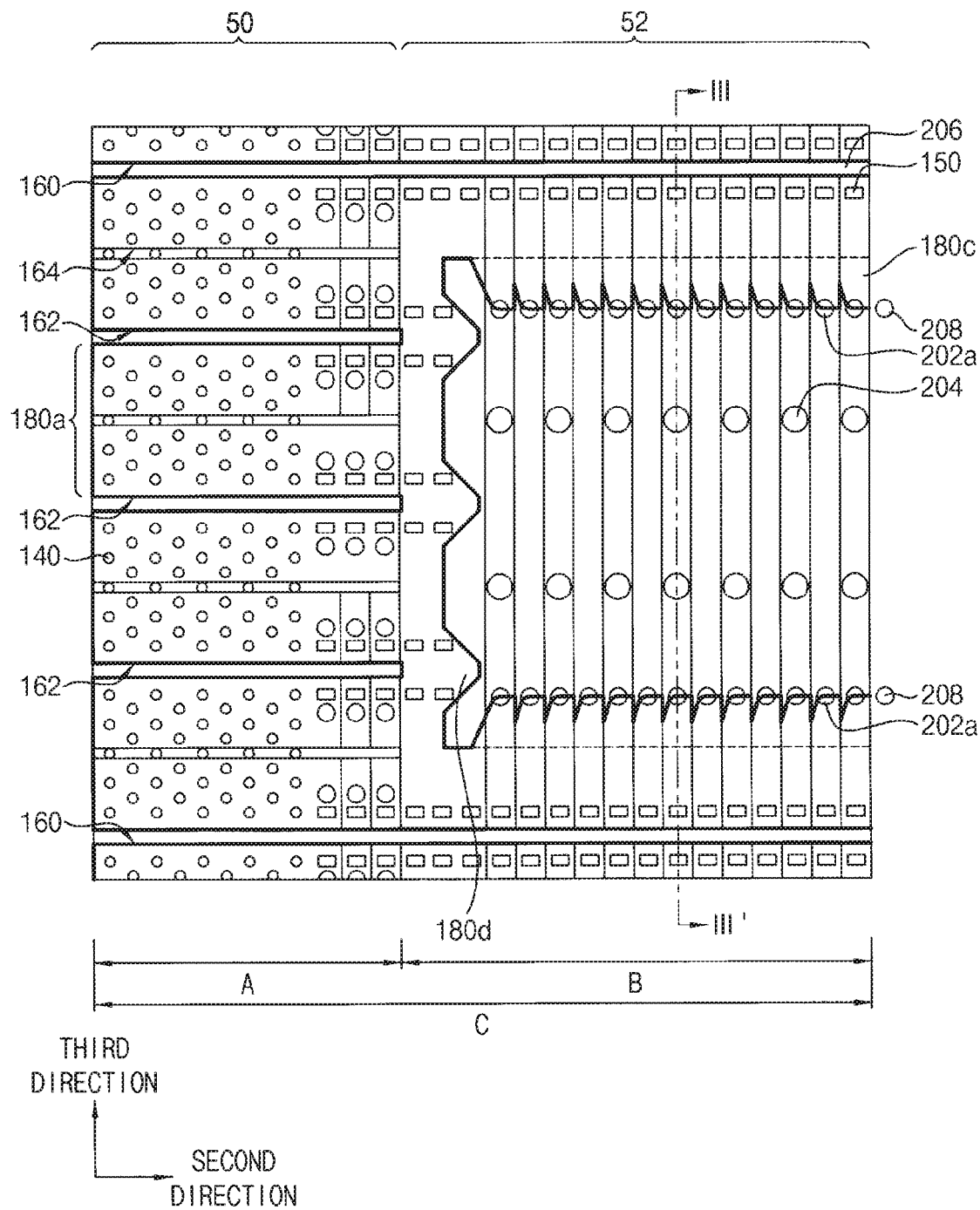
FIGS. 31, 32 and 33A are a plan view and cross-sectional views illustrating a vertical memory device in accordance with some example embodiments.
Figure 32:
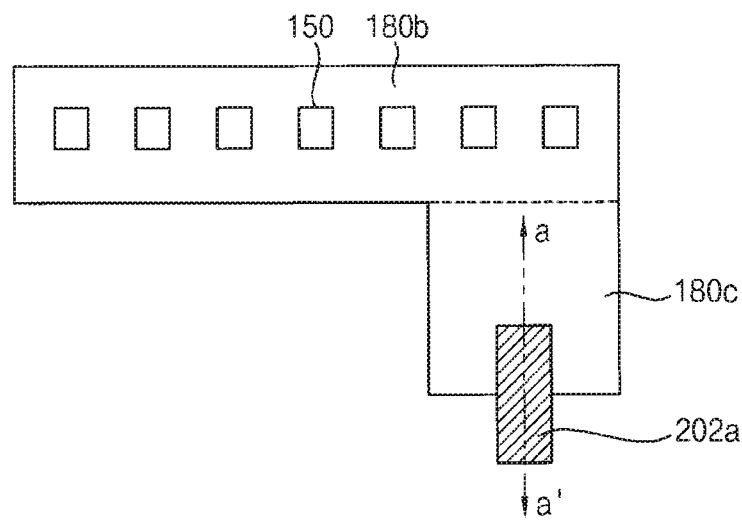
Figure 33A:
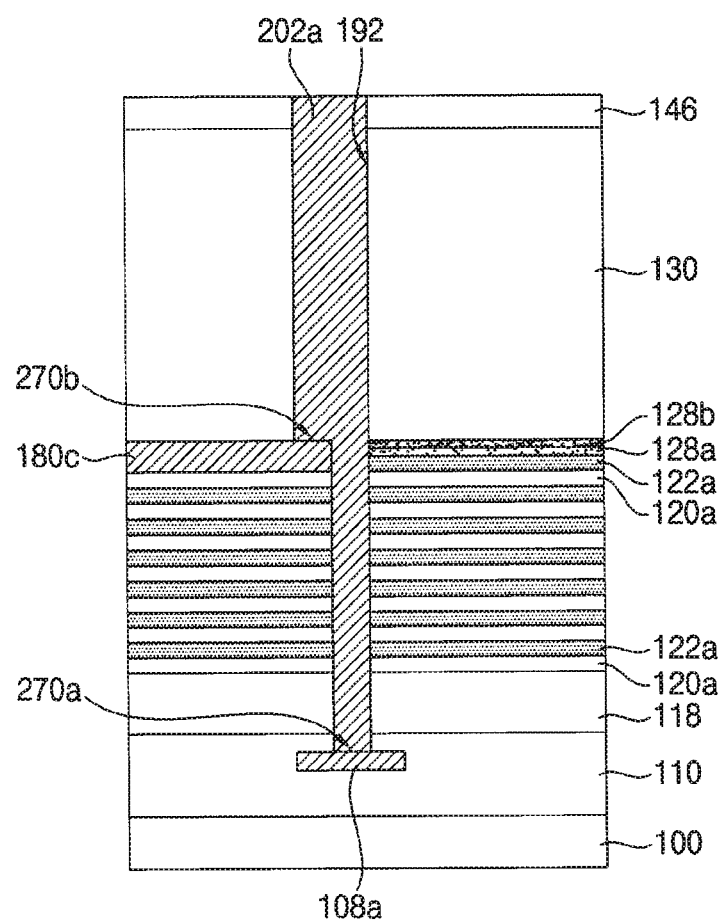
Figure 33B:
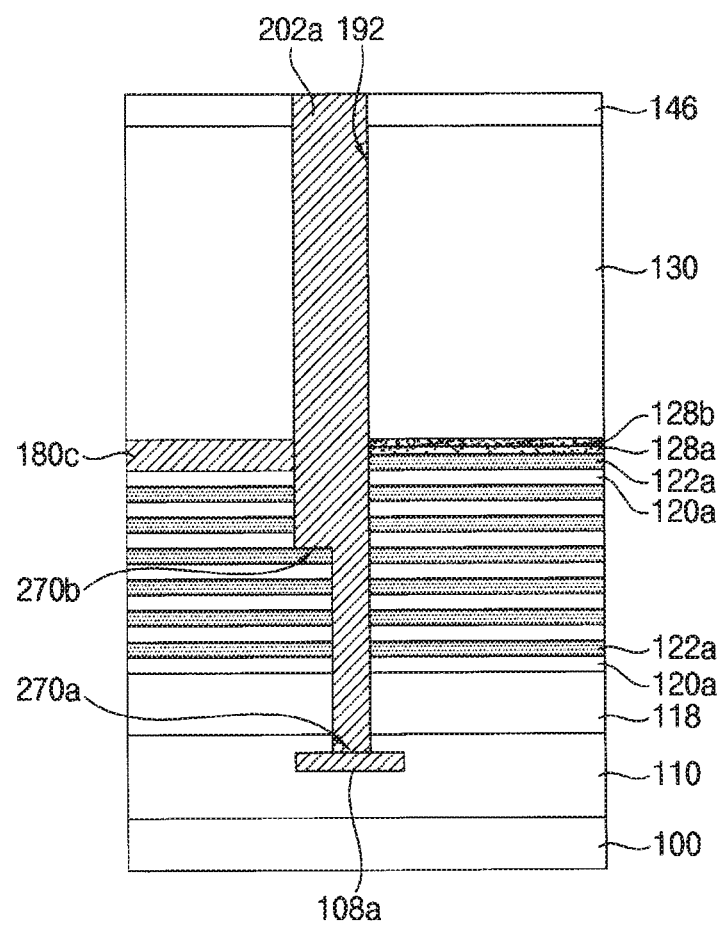
FIG. 33B is a cross-sectional view illustrating a vertical memory device in accordance with some example embodiments.

FIG. 31 is a plan view illustrating a vertical type memory device in accordance with some example embodiments. FIG. 32 is a plan view illustrating a portion of conductive line and pad pattern of one level in the vertical type memory device. FIG. 33A is a cross-sectional view illustrating a portion of a pad pattern in a vertical type memory device in accordance with some example embodiments. FIG. 33B is a cross-sectional view illustrating a portion of a pad pattern in a vertical type memory device in accordance with some example embodiments.

FIGS. 33A and 33B are sectional views taken along the line a-a' in FIG. 32.

Referring to FIGS. 31, 32 and 33A, the cell contact plug 202a may extend from the second insulating interlayer 146 formed in the second region B to an upper surface of the lower pad pattern 108a in the first direction.

The cell contact plug 202a may be through the second insulating interlayer 146, the first insulating interlayer 130, the merged pattern structure 52 adjacent to the pad pattern 180c in the third direction, and the base insulation layer 118, so that the cell contact plug 202a may extend to inside of the lower insulating interlayer 110. Thus, the cell contact plug 202a may not be through the pad pattern 180c, so that the pad pattern 180c may have no hole.

In some example embodiments, a bottom of the cell contact plug 202a may have a first bottom portion 270a contacting the lower pad pattern 108a and a second bottom portion 270b not contacting the lower pad pattern 108a. The second bottom portion 270b may be higher than the first bottom portion 270a. The cell contact plug 202a may be divided into an upper portion above the second bottom portion 270b and a lower portion below the second bottom portion 270b. The upper portion of the cell contact plug 202a may be through at least the first and second insulating interlayers 130 and 146, and may be overlapped with the pad pattern 180c and a second structure of the merged pattern structure adjacent to the pad pattern 180c in the third direction. The lower portion of the cell contact plug 202a may be formed in the second structure of the merged pattern structure 52 adjacent to the pad pattern 180c in the third direction. Therefore, the upper portion of the cell contact plug 202a may have a width greater than a width of the lower portion of the cell contact plug 202a.

In some example embodiments, the second bottom portion 270b of the cell contact plug 202a may contact an upper surface of the pad pattern 180c. In this case, the cell contact plug 202a may contact the upper surface and a sidewall of the pad pattern 180c, so that the pad pattern 180c and the lower pad pattern 108a may be electrically connected each other.

In some example embodiments, as shown in FIG. 33B, the second bottom portion 270b of the cell contact plug 202a may contact any one layer formed between the pad pattern 180c and the lower pad pattern 108a. For example, the second bottom portion 270b may contact any one layer of the merged pattern structure under the pad pattern 180c or a base insulation layer 118. In this case, the cell contact plug 202a may contact the sidewall of the pad pattern 180c so that the pad pattern 180c and the lower pad pattern 108a may be electrically connected each other.

The vertical memory device shown in FIGS. 31, 32 and 33A may be manufactured by processes the same as or similar to as the processes described with reference to FIGS. 8 to 30.

However, in processes described with reference to FIGS. 27 and 28, the etching mask for forming the first through hole may be formed to expose the upper surface of the pad pattern 180c and a portion facing to the second structure adjacent to the pad pattern 180c in the third direction. When the etching process for forming the first through hole using the etching mask may be performed, the second structure including only the insulating material may be etched faster than the pad pattern including the conductive material. Thus, the first through hole 192 may be formed through the second structure, and the first through hole 192 may extend to the lower pad pattern 108a.

The first through hole 192 may be through the second structure adjacent to the pad pattern 180c in the third direction, and may expose an upper surface of the pad pattern 180c. In this case, the vertical memory device shown in FIG. 33A may be manufactured.

In some example embodiments, when the first through hole 192 is formed, the pad pattern 180c may be etched to expose any one layer formed between the pad pattern 180c and the lower pad pattern 108a. In this case, the vertical memory device shown in FIG. 33B may be manufactured.

Figure 34:
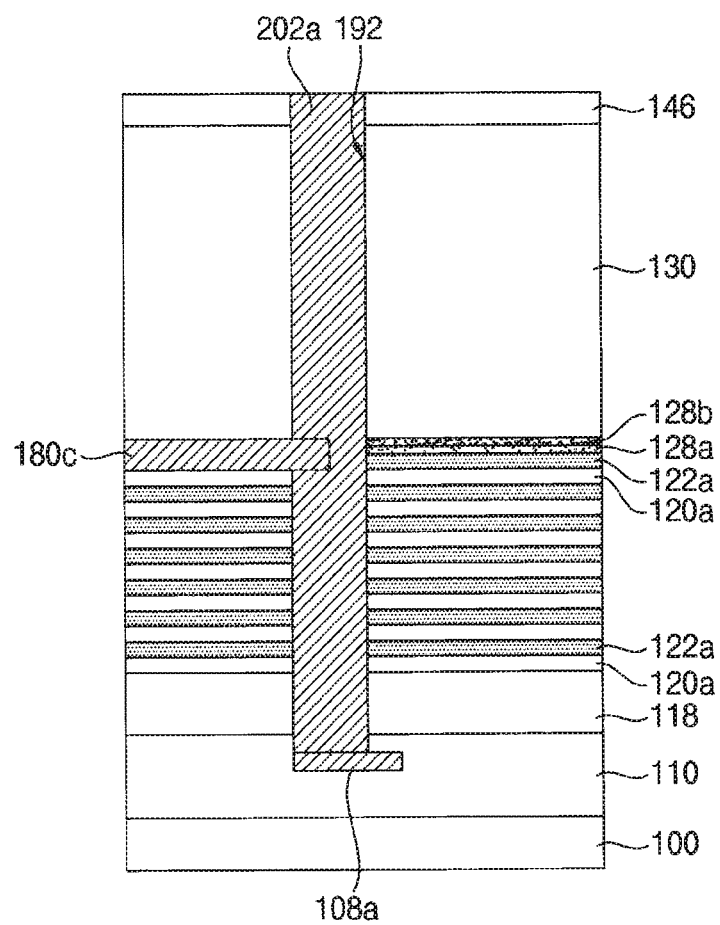
FIG. 34 is a cross-sectional view illustrating a portion of a pad pattern in a vertical memory device in accordance with some example embodiments.

FIG. 34 is a cross-sectional view illustrating a portion of a pad pattern in a vertical type memory device in accordance with some example embodiments. A plan view of the cell contact plug portion of the vertical type memory device of FIG. 34 may be substantially the same as that of FIG. 32.

Referring to FIG. 34, the cell contact plug 202*a* may extend in the first direction from the second insulating interlayer 146 in the second region B to an upper surface of the lower pad pattern 108*a*.

The cell contact plug 202*a* may contact an upper surface, a sidewall, and a lower surface of the pad pattern 180*c*, and may be through the second insulating interlayer 146, the first insulating interlayer 130, and the merge pattern structure adjacent to the pad pattern 180*c* in the third direction and the base insulation layer 118. Thus, the cell contact plug 202*a* may extend to an inner portion of the lower insulating interlayer.

In some example embodiments, a top width of the cell contact plug 202*a* may be substantially similar to a bottom width of the cell contact plug 202*a*. In some example embodiments, a width of the cell contact plug 202*a* may be gradually decreased toward the bottom of the cell contact plug 202*a*.

Figure 35:
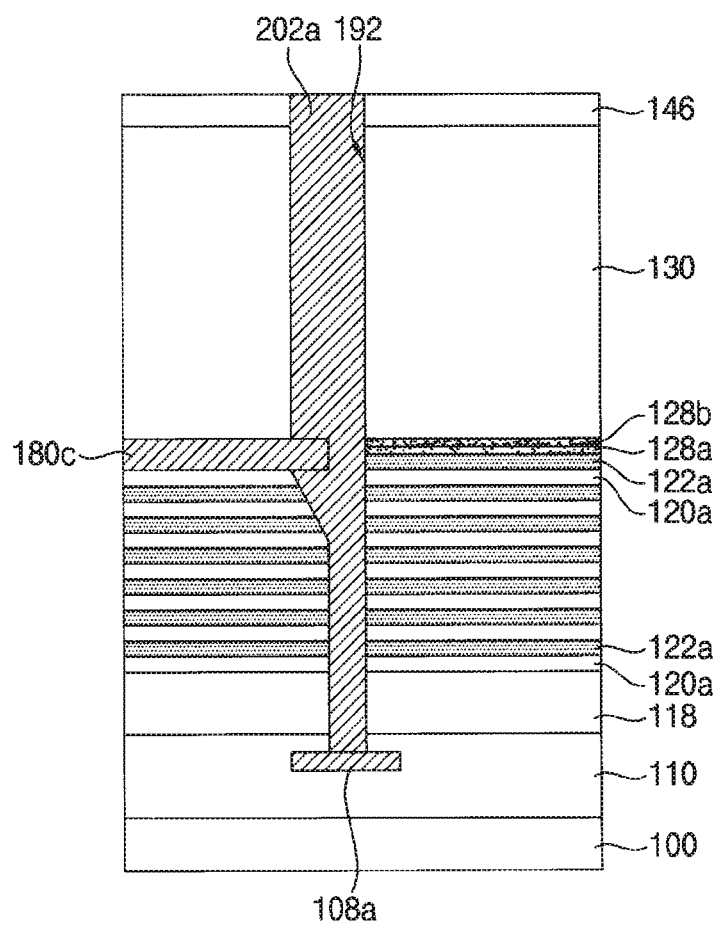
FIG. 35 is a cross-sectional view illustrating a portion of a pad pattern in a vertical memory device in accordance with some example embodiments.

FIG. 35 is a cross-sectional view illustrating a portion of a pad pattern in a vertical type memory device in accordance with some example embodiments. The plan view of the cell contact plug portion of the vertical type memory device of FIG. 35 may be substantially the same as that of FIG. 32.

Referring to FIG. 35, the cell contact plug 202*a* may contact an upper surface, a sidewall, and a lower surface of the pad pattern 180*c*, and may be through the second insulating interlayer 146, the first insulating interlayer 130, the merged pattern structure 52 adjacent to the pad pattern 180*c* in the third direction and the base insulation layer 118. Thus, the cell contact plug 202*a* may extend to an inner portion of the lower insulating interlayer 110. A lower sidewall of the cell contact plug 202*a* below the bottom of the pad pattern 180*c* may be inclined in oblique direction.

The vertical memory device shown in FIGS. 34 and 35 may be manufactured by the same as or similar to as the processes for manufacturing the vertical memory device shown in FIGS. 31, 32 and 33A. However, in the etching process for forming the first through holes, the merged pattern structure and/or the base insulation layer 118 under the pad pattern 180*c* and the lower insulating interlayer 110 may be further etched to form the first through hole having different shape.

Figure 36:
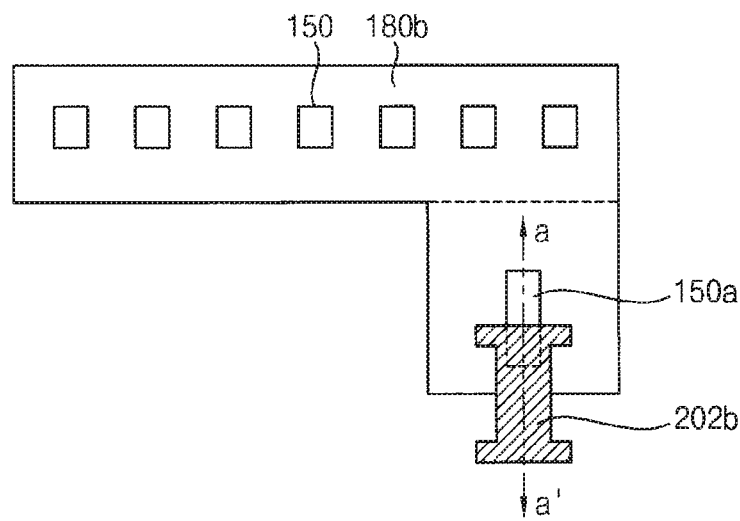
FIGS. 36 and 37A are a plan view and a cross-sectional view illustrating a vertical memory device in accordance with some example embodiments.
Figure 37A:
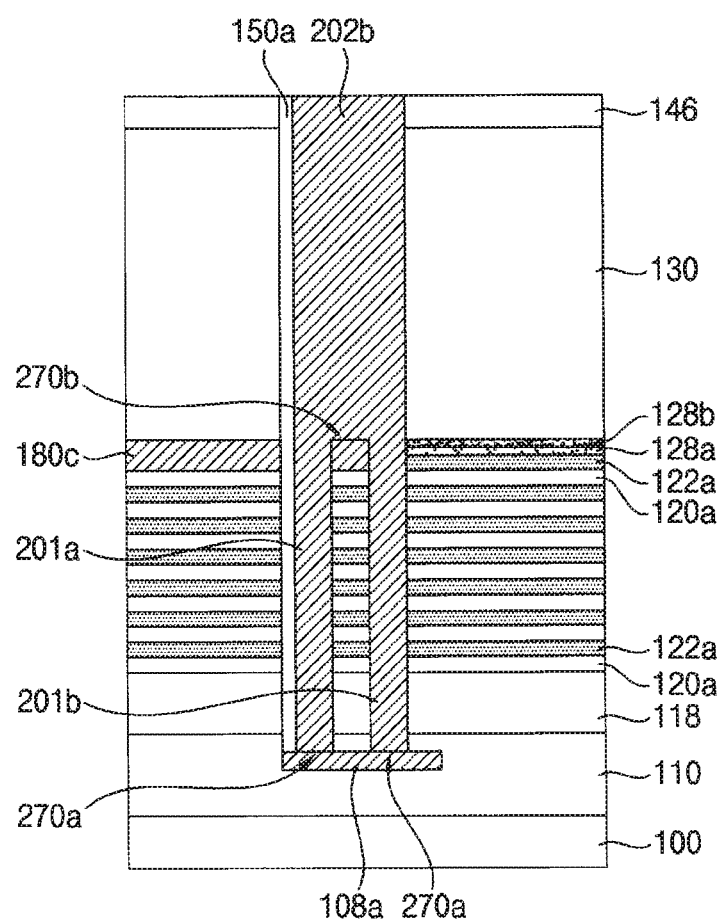
Figure 37B:
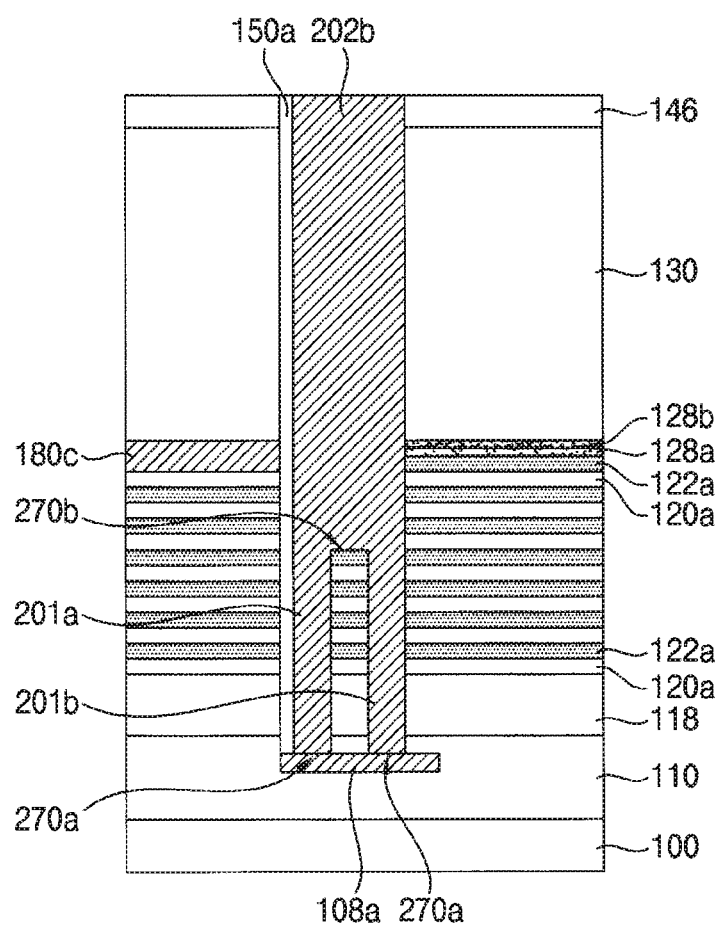
FIG. 37B is a cross-sectional view illustrating a vertical memory device in accordance with some example embodiments.
Figure 38:
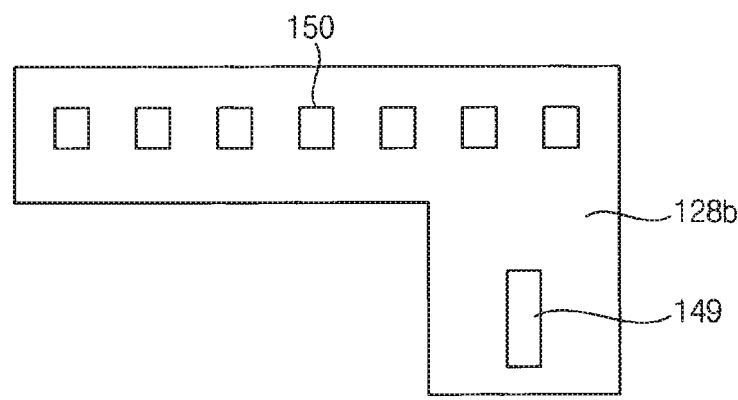
FIGS. 38 to 41 are plan views and cross-sectional views illustrating stages of a method of manufacturing a vertical memory device in accordance with some example embodiments.
Figure 39:
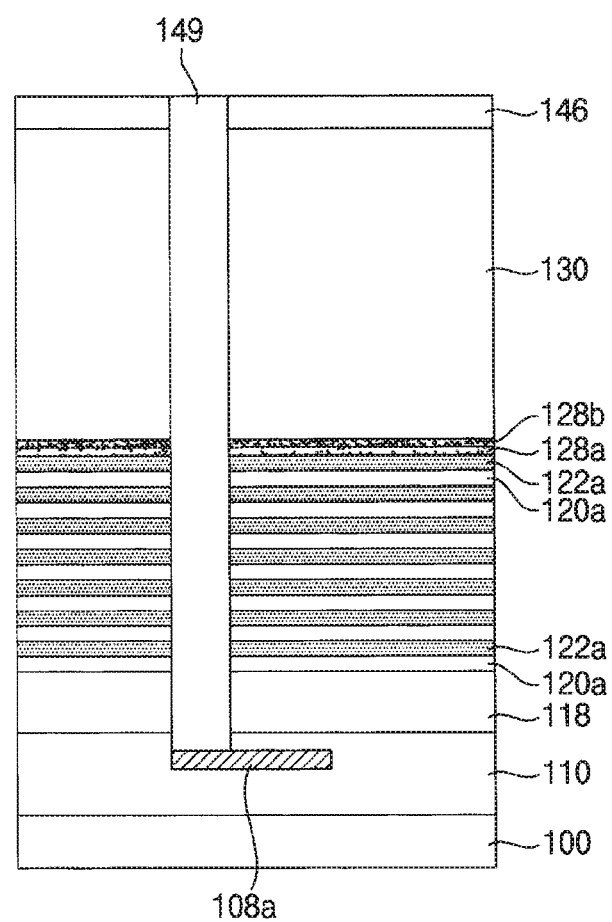

FIG. 36 is a plan view illustrating a portion of a conductive line and a pad pattern of one level in a vertical type memory device in accordance with some example embodiments. FIG. 37A is a cross-sectional view illustrating a portion of a pad pattern in a vertical type memory device in accordance with some example embodiments. FIG. 37B is a cross-sectional view illustrating a portion of a pad pattern in a vertical memory device in accordance with some example embodiments.

Referring to FIGS. 36 and 37A, the cell contact plug 202*b* may extend in the first direction from the second insulating interlayer 146 in the second region B to the upper surface of the lower pad pattern 108*a*.

In some example embodiments, a second support 150*a* may be further formed through the pad pattern 180*c*, and the second support 150*a* may contact a side of the cell contact plug. The second support 150*a* may extend in the first direction from the second insulating interlayer 146 to an inner portion of the lower insulating interlayer 110.

In some example embodiments, the pad pattern may include a hole. A portion of the cell contact plug 202*b* and the second support 150*a* may be formed in the hole. For example, the second support 150*a* may be formed on a sidewall in the third direction of the cell contact plug 202*b*.

A bottom of the cell contact plug 202*b* may include a first bottom portion 270*a* contacting the lower pad pattern 108*a* and a second bottom portion 270*b* not contacting the lower pad pattern 108*a*. In some example embodiments, in the cell contact plug 202*b*, an upper portion of the cell contact plug 202*b* positioned above the second bottom portion 270*b* may be formed through at least the first and second insulating interlayers 130 and 146, and may be overlapped with the pad pattern 180*c* and the merged pattern structure 52 adjacent to the pad pattern 180*c* in the third direction.

In some example embodiments, the second bottom portion 270*b* of the cell contact plug 202*a* may contact an upper surface of the pad pattern 180*c*. In this case, the cell contact plug 202*b* may contact the upper surface of the pad pattern 180*c*, a sidewall of the pad pattern 180*c* exposed by the hole, and an edge sidewall in the third direction of the pad pattern 180*c*. Thus, the cell contact plug 202*b* may be electrically connected with the pad pattern 180*c* and the lower pad pattern 108*a*.

In some example embodiments, as shown in FIG. 37B, the second bottom portion 270*b* of the cell contact plug 202*b* may contact any one layer formed between the pad pattern 180*c* and the lower pad pattern 108*a*. In this case, the cell contact plug 202*b* may contact a side wall of the pad pattern 180*c* exposed by the hole. Thus, the cell contact plug 202*b* may be electrically connected to the pad pattern 180*c* and the lower pad pattern 108*a*. In some example embodiments, the cell contact plug 202*b* may include a first portion 201*a* extending in the first direction through the hole formed in the pad pattern 180*c* and a second portion 201*b* extending in the first direction through the second structure of the merged pattern structure 52 adjacent to the pad pattern 180*c* in the third direction.

In some example embodiments, at least one of the first portion 201*a* and the second portion 201*b* may contact the upper surface of the lower pad pattern 108*a*. For example, as illustrated, the first portion 201*a* and the second portion 201*b* may contact the upper surface of the lower pad pattern 108*a*.

That is, the cell contact plug 202*b* may include the first and second portions 201*a* and 201*b* and a third portion connecting upper portions of the first and second portions 201*a* and 201*b* to each other.

FIGS. 38 to 41 are plan views and cross-sectional views illustrating stages of a method of manufacturing a vertical memory device shown in FIGS. 36 and 37A.

The vertical memory device shown in FIGS. 36 and 37A may be manufactured by processes similar to processes described with reference to FIGS. 8 to 30. However, in the process of forming the support, a preliminary second support may be formed together. Also, in the process of forming the first through hole, the first through hole may be formed through at least a portion of the preliminary second support. Particularly, first, processes described with reference to FIGS. 8 to 16 may be performed. Then, referring to FIGS. 38 and 39, a second insulating interlayer 146 may be formed on the first insulating interlayer 130. Also, the support 150 extending in the first direction may be formed through the second insulating interlayer 146, the first insulating interlayer 130, and the preliminary mold structure in the second region B. In the process of forming the support 150, a preliminary second support 149 may be further formed so that at least a portion of the preliminary second support 149 may be overlapped with a portion for forming the first through hole. That is, the preliminary second support 149 may be formed to extend through the first to third sacrificial patterns 122a, 128a, and 128b corresponding to portions for forming the pad pattern in a subsequent process. Also, the preliminary second support 149 may be formed to contact the upper surface of the lower pad pattern 108a.

Subsequently, the same processes as those described with reference to FIGS. 19 to 26 may be performed.

Figure 40:
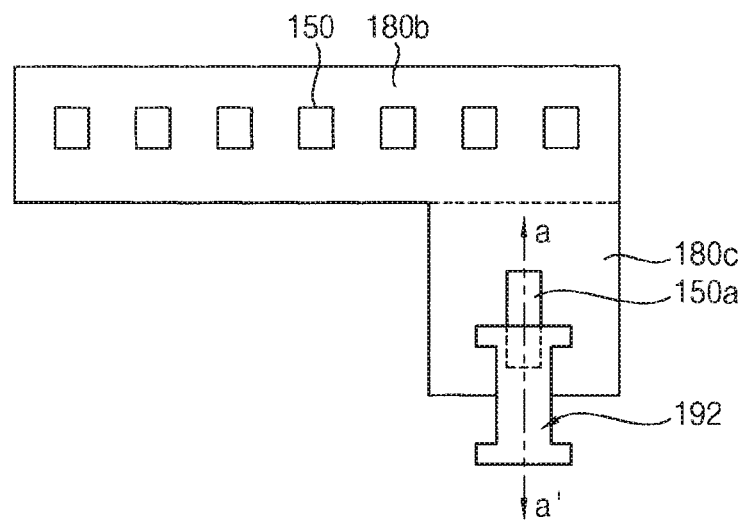
Figure 41:
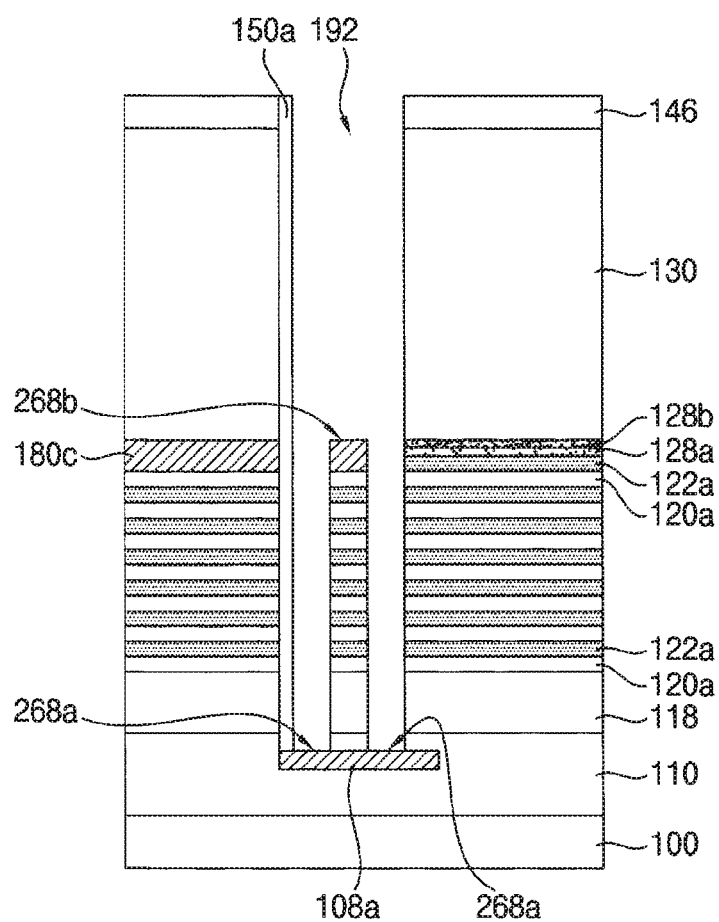

Referring to FIGS. 40 and 41, a portion of the preliminary second support 149 passing through the pad pattern 180c, the first and second insulating interlayers 130 and 146 on an upper surface of the pad pattern 180c and a second structures of the merged pattern structure 52 adjacent to the pad pattern 180c in the third direction may be etched to form a first through holes 192. In the etching process, the preliminary second support 149 may be partially etched to form a second support 150a.

Thus, a portion of the preliminary second support may be etched to form the first through hole 192 penetrating the pad pattern 180c without directly etching the pad pattern.

In some example embodiments, as shown in FIG. 41, the first through hole 192 may be formed to expose the upper surface of the pad pattern 180c. In this case, the first bottom portion 268a of the first through hole 192 may expose the lower pad pattern 108a, and the second bottom portion 268b of the first through hole 192 may expose the upper surface of the pad pattern 180c. Thus, the vertical memory device shown in FIG. 37A may be manufactured by performing subsequent processes.

In some example embodiments, although not shown, when the first through hole 192 is formed, the pad pattern 180c may be etched to expose any one layer formed between the pad pattern 180c and the lower pad pattern 108a. In this case, the first bottom portion of the first through hole 192 may expose the lower pad pattern 108a, and the second bottom portion of the first through hole 192 may expose any one layer formed between the pad pattern 180c and the lower pad pattern 108a. Thus, the vertical memory device shown in FIG. 37B may be manufactured by performing subsequent processes. In the etching process, the preliminary second support 149 including silicon oxide may be etched faster than the pad pattern 180c including a conductive material. Also, the second structure including insulating materials may be etched faster than the pad pattern 180c.

As described above, before forming the first through hole 192, the preliminary second support 149 may be formed to overlap a portion for forming the first through hole 192. Thus, the first through hole 192 may be easily formed.

In the process of forming the first through hole 192, as described with reference to FIGS. 27 and 28, the fourth opening, the second and the third through holes may be formed together.

Thereafter, the vertical memory device may be manufactured by performing the same processes as those described with reference to FIGS. 29, 30 and 1 to 3.

Figure 42:
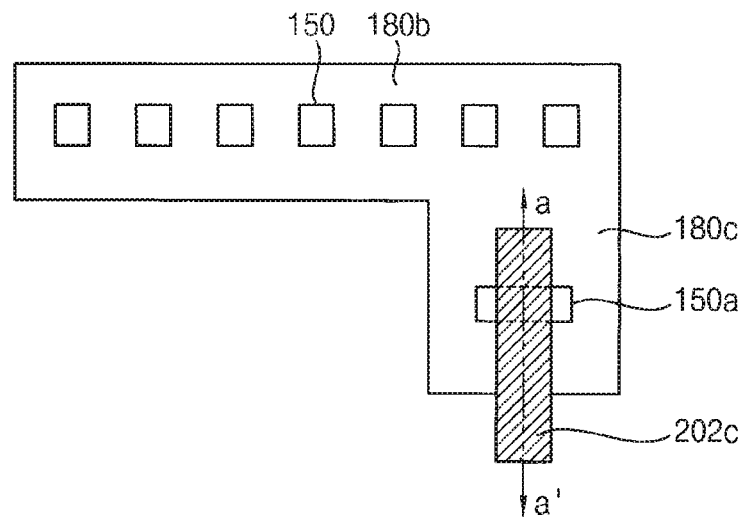
FIGS. 42 and 43 are a plan view and cross-sectional views illustrating a vertical memory device in accordance with some example embodiments.
Figure 43:
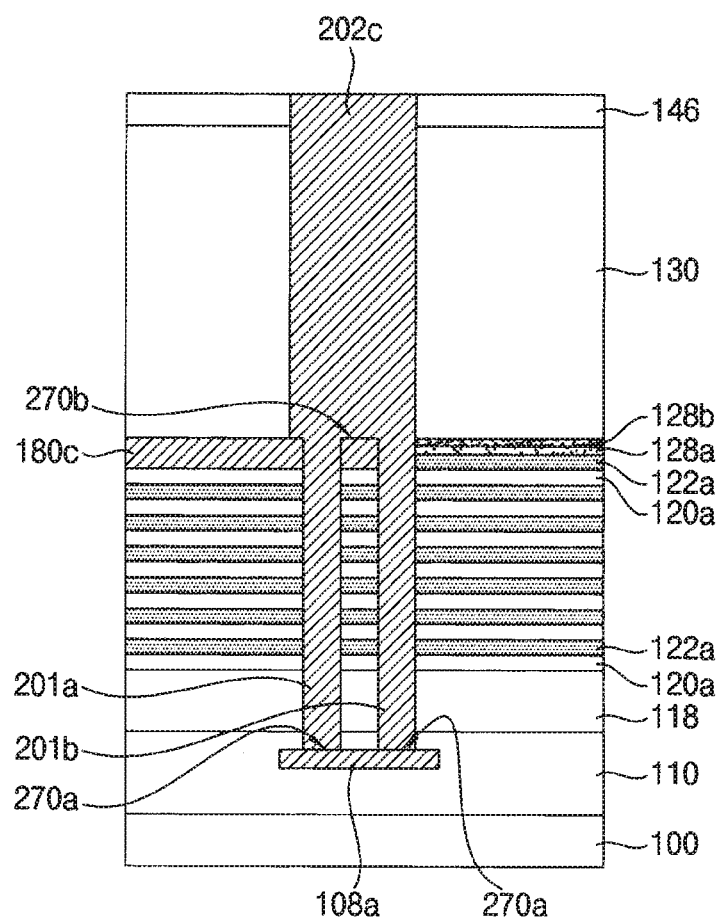

FIG. 42 is a plan view illustrating a portion of a conductive line and a pad pattern of one level in a vertical type memory device in accordance with some example embodiments. FIG. 43 is a cross-sectional view illustrating a portion of a pad pattern in a vertical type memory device in accordance with some example embodiments.

The vertical memory device may be similar to the vertical memory device shown in FIGS. 36 and 37, except for a position of the second support.

Referring to FIGS. 42 and 43, the pad pattern 180c may include holes. A portion of the cell contact plug 202c and a second support 150a may be formed in the hole. The second support 150a may be formed on both sides in the second direction of the cell contact plug 202c.

In some example embodiments, the second bottom portion 270b of the cell contact plug 202c may contact an upper surface of the pad pattern 180c.

In some example embodiments, similarly to the structure shown in FIG. 33B, the second bottom portion of the cell contact plug 202c may contact any one layer formed between the pad pattern 180c and the lower pad pattern 108a.

The vertical memory device may be manufactured by processes similar to processes described with reference to FIGS. 38 to 41. However, in the process of forming the preliminary second support, the preliminary second support may be formed to intersect with the pad pattern.

Figure 44:
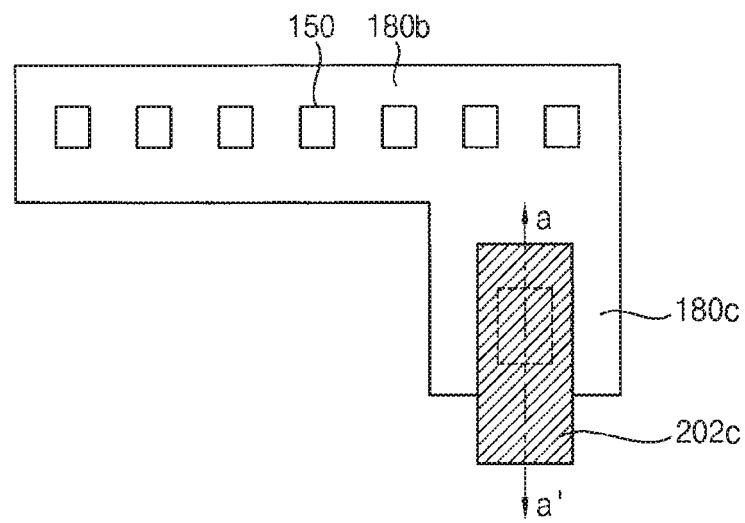
FIG. 44 is a plan view illustrating a portion of a conductive line and a pad pattern in a vertical type memory device in accordance with some example embodiments.

FIG. 44 is a plan view illustrating a portion of a conductive line and a pad pattern of one level in a vertical type memory device in accordance with some example embodiments.

A cross-sectional view taken along the line a-a' of the vertical memory device shown in FIG. 44 may be substantially the same as that of FIG. 43.

The vertical memory device may be similar to the vertical memory device shown in FIGS. 36 and 37 except that the second support is not formed.

Referring to FIG. 44, the pad pattern 180c may include a hole. A portion of the cell contact plug 202c may be formed in the hole. In this embodiment, the second support may not be formed in the hole.

Figure 45:
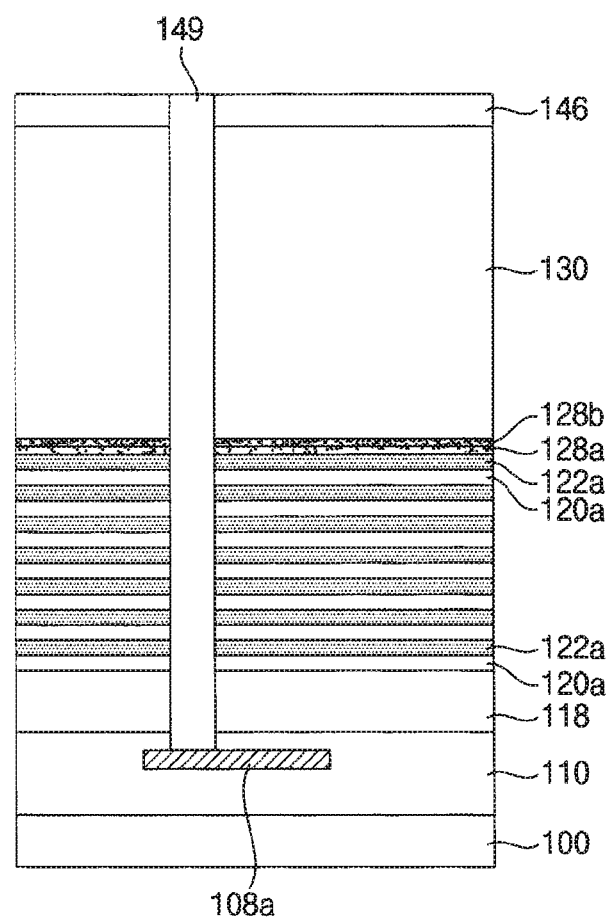
FIGS. 45 and 46 and a cross-sectional views illustrating stages of a method of manufacturing a vertical memory device in accordance with some example embodiments.
Figure 46:
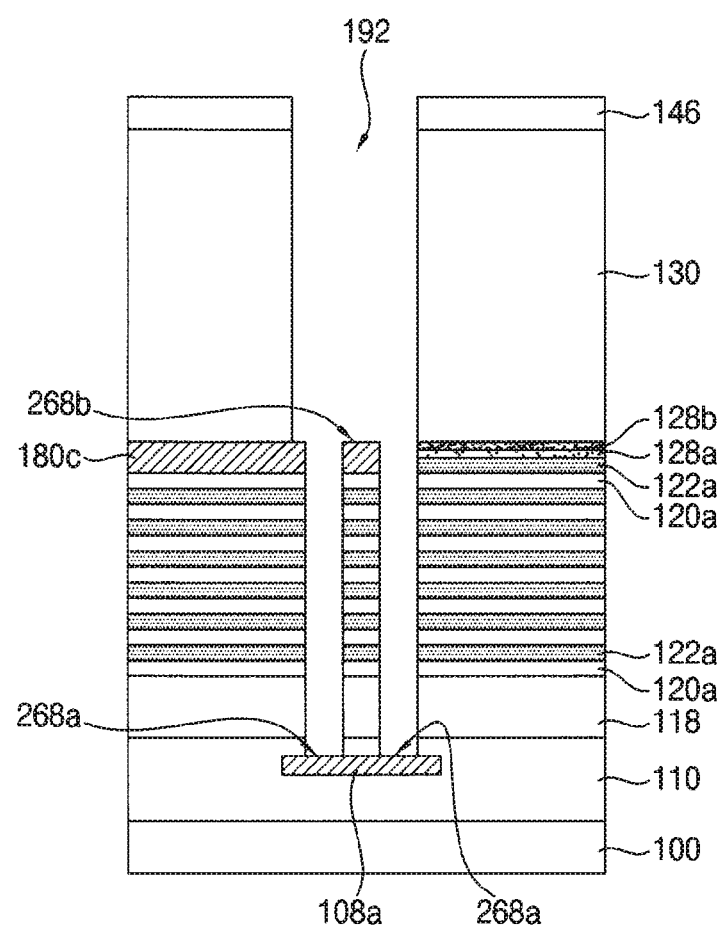

FIGS. 45 and 46 are cross-sectional views illustrating stages of a method of manufacturing a vertical memory device in accordance with some example embodiments.

First, the processes described with reference to FIGS. 8 to 16 may be performed. Referring to FIG. 45, a second insulating interlayer 146 may be formed on the first insulating interlayer 130. A support 150 extending in the first direction may be formed through the second insulating interlayer 146, the first insulating interlayer 130, and the preliminary mold structure in the second region B. Further, a preliminary second support 149 may be formed to overlap with a portion for forming the first through hole. That is, the preliminary second support 149 may be formed through the first to third sacrifice patterns 122a, 128a, and 128b corresponding a portion for forming the pad pattern. Also, the preliminary second support 149 may be formed to contact an upper surface of the lower pad pattern 108a.

Subsequently, the same processes as those described with reference to FIGS. 19 to 26 are performed. Then, referring to FIG. 46, a preliminary second support 149 (refer to FIG. 45) passing through the pad pattern 180c, first and second insulating interlayers 130 and 146 on the upper surface of the pad pattern 180c, and an insulation structure adjacent to the pad pattern 180c in the third direction may be etched to form the first through hole 192. That is, an exposed portion of the etching mask used in the etching process may be completely overlapped with the preliminary second support. Thus, in the etching process, the preliminary second support 149 may be completely etched.

In some example embodiments, the first bottom portion 268a of the first through hole 192 may expose the lower pad pattern 108a and the second bottom portion 268b of the first through hole 192 may expose an upper surface of the pad pattern 180c.

In some example embodiments, although not shown, when the first through hole 192 is formed, the pad pattern 180c may be partially etched to expose any one layer formed between the pad pattern 180c and the lower pad pattern 108a. Thus, the first bottom portion of the first through hole 192 may expose the lower pad pattern 108a, and the second bottom portion of the first through hole 192 may expose an upper surface of any one layer formed between the pad pattern 180c and the lower pad pattern 108a. That is, the first through hole 192 passing through the pad pattern 180c may be formed by etching the preliminary second support 149.

In the process of forming the first through hole 192, as described with reference to FIGS. 27 and 28, the fourth opening, the second through hole, and the third through hole may be formed together.

Thereafter, the vertical memory device may be manufactured by performing the same processes as those described with reference to FIGS. 29, 30 and 1 to 3.

Figure 47:
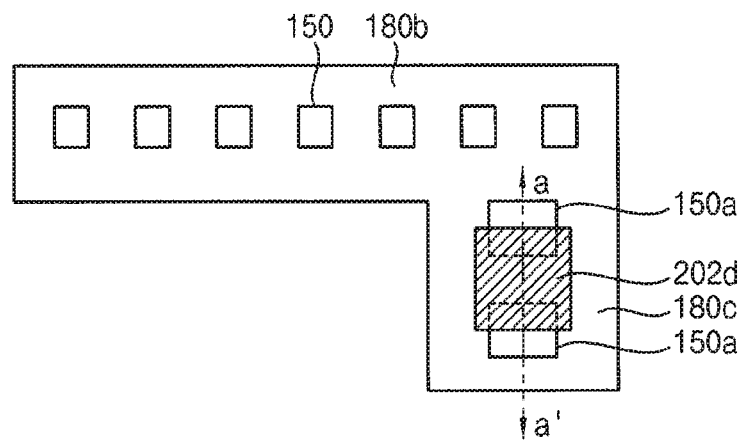
FIGS. 47 and 48 are a plan view and a cross-sectional view illustrating a vertical memory device in accordance with some example embodiments.
Figure 48:
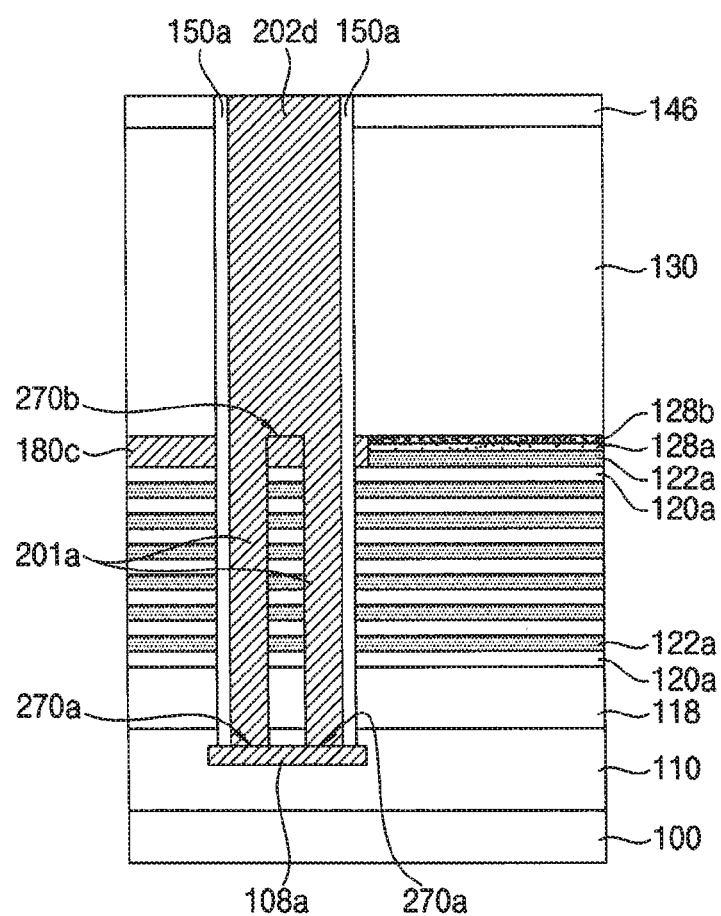

FIG. 47 is a plan view illustrating a portion of a conductive line and a pad pattern of one level in a vertical type memory device in accordance with some example embodiments. FIG. 48 is a cross-sectional view illustrating a portion of a pad pattern in a vertical type memory device in accordance with some example embodiments.

Referring to FIGS. 47 and 48, the pad pattern 180c may include a plurality of holes. Portions of the second support 150a and the cell contact plug 202d may be formed in the plurality of holes.

In some example embodiments, the second support 150a may contact a side wall of the cell contact plug 202d, and may be through the pad pattern 180c. The second support 150a may extend in the first direction from the second insulating interlayer 146 to an inner portion of the lower insulating interlayer 110.

In some example embodiments, although not shown, the second support may not be formed. In this case, a portion of the cell contact plug 202d may be formed in each of the plurality of holes in the pad pattern.

The first bottom portion 270a of the cell contact plug 202d may contact the lower pad pattern 108a. In some example embodiments, the second bottom portion 270b of the cell contact plug 202d may contact the upper surface of the pad pattern 180c. In this case, the cell contact plug 202d may contact a sidewall of the hole in the pad pattern 180c and the upper surface of the pad pattern 180c. In some example embodiments, the cell contact plug 202d may contact the upper surface of the pad pattern 180c adjacent to the hole.

In some example embodiments, similar to the structure shown in FIG. 33B, the second bottom portion of the cell contact plug 202d may contact any one layer formed between the pad pattern 180c and the lower pad pattern 108a. In this case, the cell contact plug 202d may contact a sidewall of the hole in the pad pattern 180c. In some example embodiments, an upper portion of the cell contact plug 202d may extend through the first and second insulating interlayers 130 and 146, and may be overlapped with the upper surface of the pad pattern 180c.

In some example embodiments, the lower portion of the cell contact plug 202d may include first portions 201a extending in the first direction through a plurality of holes in the pad pattern 180c. At least one of the first portions may contact an upper surface of the lower pad pattern 108a. For example, as illustrated, all of the first portions 201a may contact the upper surface of the lower pad pattern 108a. In some example embodiments, the cell contact plug 202d may not be overlapped with the second structure of the merged pattern structure adjacent to the pad pattern 180c in the third direction, and the cell contact plug 202d may be only disposed in the pad pattern 180c.

Figure 49:
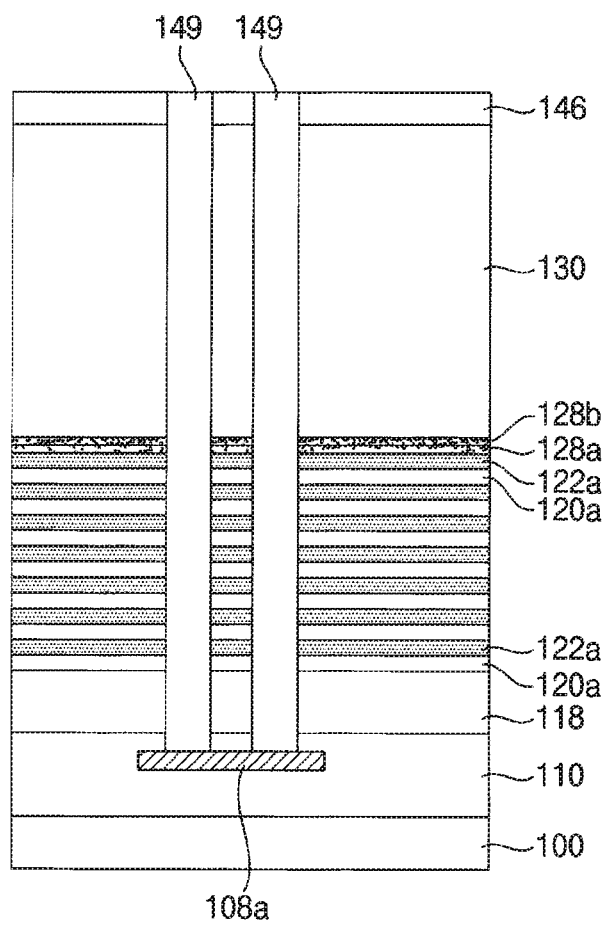
FIGS. 49 and 50 cross-sectional views illustrating stages of a method of manufacturing a vertical memory device in accordance with some example embodiments.
Figure 50:
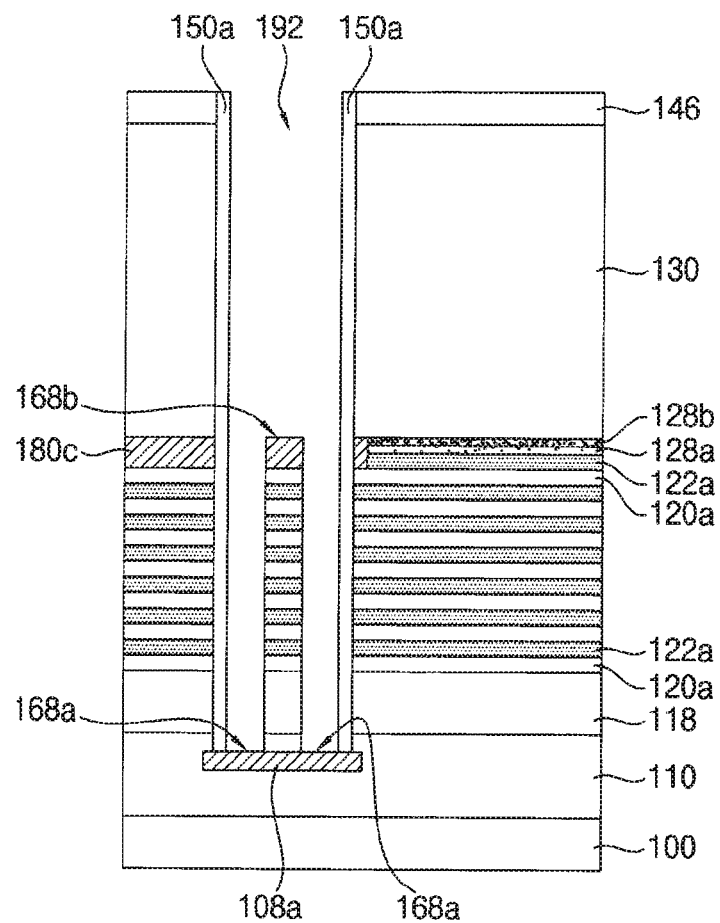

FIGS. 49 and 50 are cross-sectional views illustrating stages of a method of manufacturing a vertical memory device in accordance with some example embodiments.

First, the processes described with reference to FIGS. 8 to 16 are performed. Referring to FIGS. 49 and 50, a second insulating interlayer 146 may be formed on the first insulating interlayer 130. Then, a support 150 extending in the first direction may be formed through the second insulating interlayer 146, the first insulating interlayer 130, and the preliminary mold structure in the second region B. Further, a preliminary second support 149 may be formed to overlap a portion of forming the first through holes.

As shown in FIG. 49, a plurality of preliminary second supports 149 may be formed through the first to third sacrificial patterns 122a, 128a, and 128b corresponding to the portion for forming the pad pattern 180c.

Subsequently, the same processes as those described with reference to FIGS. 19 to 26 are performed. Then, referring to FIG. 50, a portion or all of the preliminary second support 149 and the first and second insulating interlayers 130 and 146 formed on the pad pattern 180c between the preliminary second supports 149 may be etched to form a first through hole 192. The second bottom of the first through hole 192 may expose an upper surface of the pad pattern 180c.

In some example embodiments, when the first through hole 192 is formed, the pad pattern 180c and an underlying layer between the preliminary second supports 149 may be partially etched together. In this case, the second bottom portion of the first through hole 192 may expose any one layer formed between the pad pattern 180c and the lower pad pattern 108a.

In some example embodiments, an exposed portion of an etching mask used in the etch process for forming the first through hole 192 may be overlapped with a portion of the preliminary second support 149 and a portion between the preliminary second supports 149. Thus, in the etching process, the preliminary second support 149 may be partially removed to form the second support 150a.

In some example embodiments, an exposed portion of an etching mask used in the etch process for forming the first through hole 192 may be overlapped with an entire upper surface of the preliminary second support 149 and a portion between the preliminary second support 149. In this case, the preliminary second support 149 may be completely removed by the etching process, so that the second support may not be formed.

In the process for forming the first through hole 192, as described with reference to FIGS. 27 and 28, the fourth opening, the second, and the third through holes may be formed together.

Thereafter, the vertical memory device may be manufactured by performing the same processes as those described with reference to FIGS. 29, 30 and 1 to 3.

Figure 51:
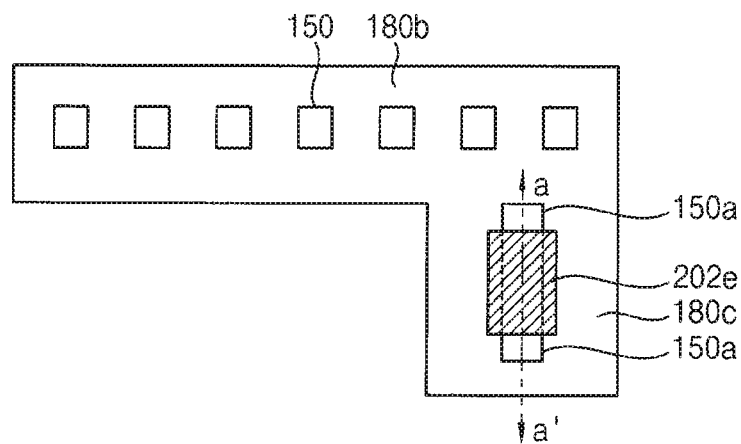
FIGS. 51 and 52 are a plan view and a cross-sectional view illustrating a vertical memory device in accordance with some example embodiments.
Figure 52:
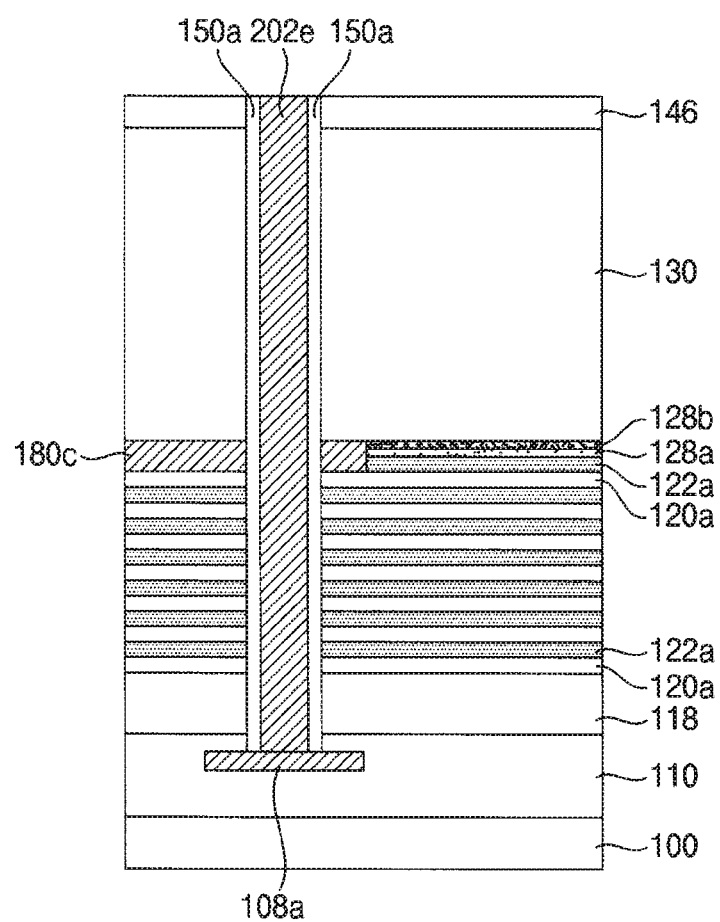

FIG. 51 is a plan view illustrating a portion of a conductive line and a pad pattern of one level in a vertical type memory device in accordance with some example embodiments. FIG. 52 is a cross-sectional view illustrating a portion of a pad pattern in a vertical type memory device in accordance with some example embodiments.

Referring to FIGS. 51 and 52, the pad pattern 180c may include hole. The second support 150a and a portion of the cell contact plug 202e may be formed in the hole.

In some example embodiments, the second support 150a may contact a sidewall of the cell contact plug 202e, and may be through the pad pattern 180c. The second support 150a may extend in the first direction from the second insulating interlayer 146 to an inner portion of the lower insulating interlayer 110. In some example embodiments, the second support may not be formed.

The cell contact plug 202e may contact a sidewall of the hole in the pad pattern 180c, the upper surface of the pad pattern 180c and a sidewall in the third direction of the pad pattern. In some example embodiments, the cell contact plug 202e may contact the upper surface of the pad pattern 180c adjacent to the hole in the second direction.

In some example embodiments, the cell contact plug 202e may be through the first and second insulating interlayers 130 and 146, and may be overlap with the upper surface of the pad pattern 180c. Thus, the cell contact plug 202e may contact a portion of an upper surface of the pad pattern 180c.

In some example embodiments, the cell contact plug 202e may extend in the first direction through a hole in the pad pattern 180c.

Thus, the cell contact plug 202e may not be overlapped with the second structure of the merged pattern structure, and the cell contact plug 202e may be only formed in the pad pattern 180c.

Figure 53:
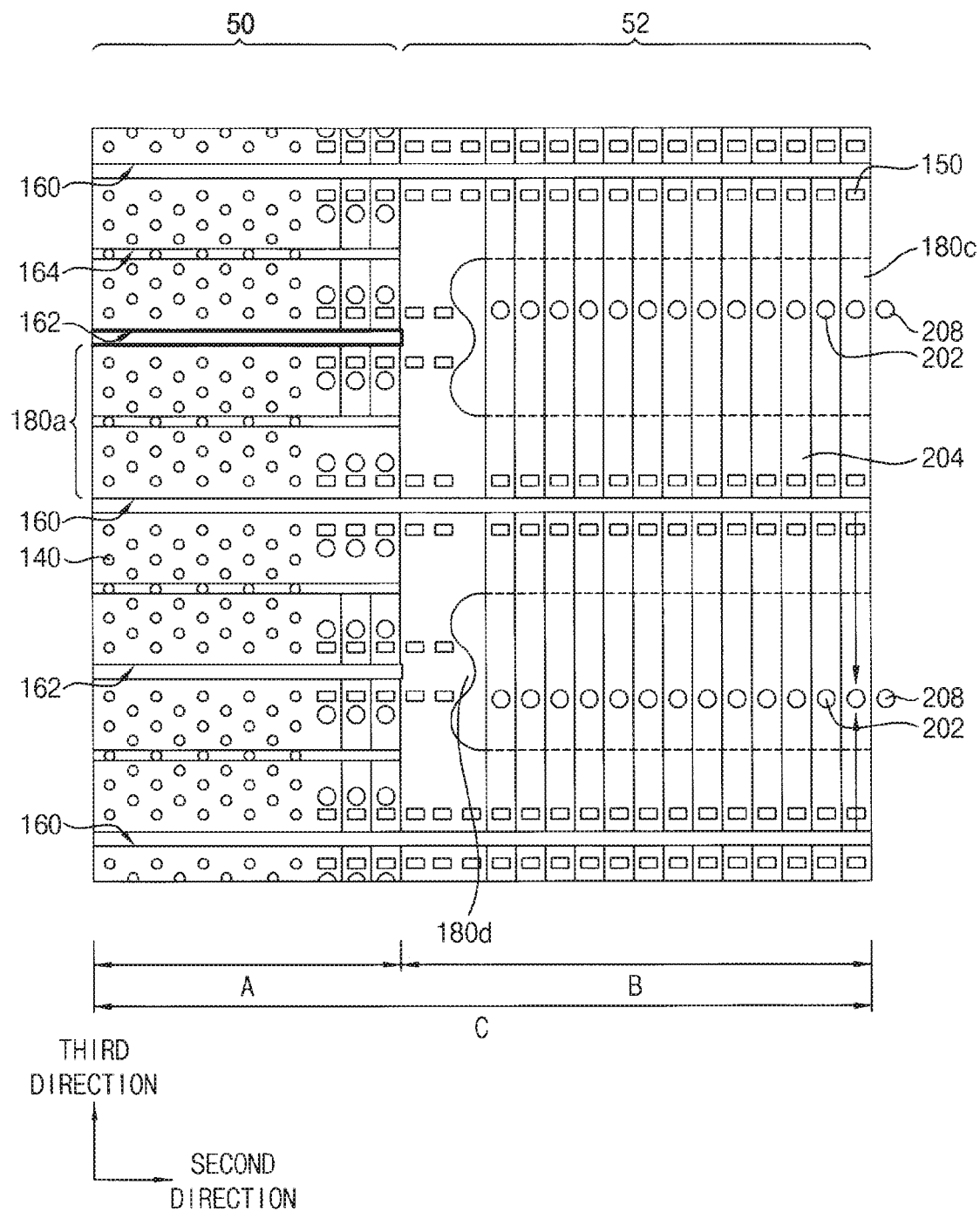
FIGS. 53 and 54 are a plan view and a perspective view illustrating a vertical memory device in accordance with some example embodiments.
Figure 54:
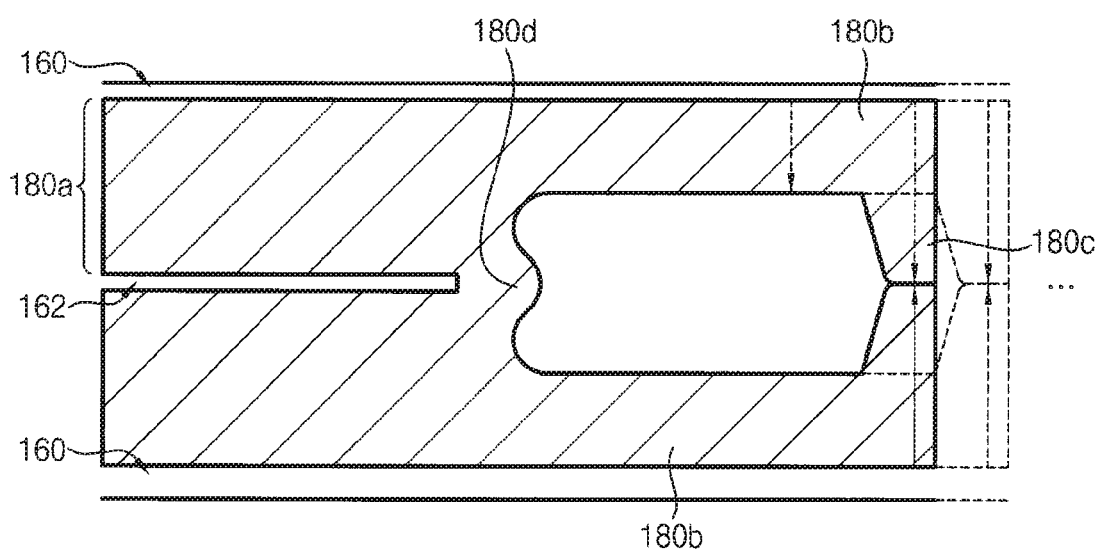
Figure 55:
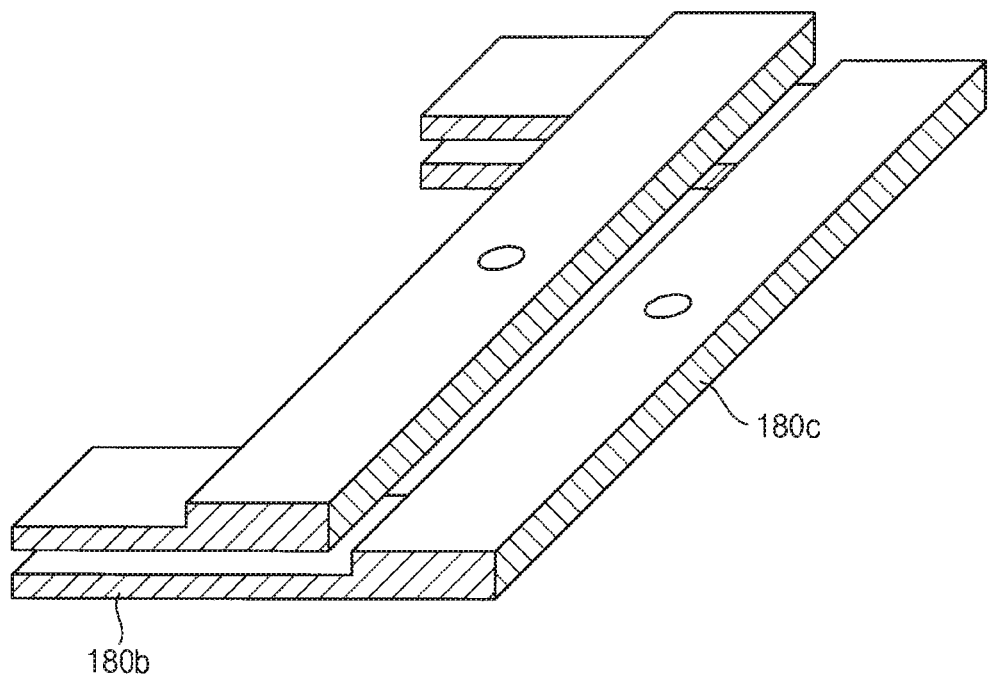
FIG. 55 is a perspective view illustrating a portion of a conductive line and a pad pattern of one level in a vertical memory device in accordance with some example embodiments.

FIG. 53 is a plan view illustrating a vertical type memory device in accordance with some example embodiments. FIG. 54 is a plan view illustrating a conductive pad pattern of one level in the vertical type memory device. FIG. 55 is a perspective view illustrating a portion of a conductive line and a pad pattern of one level in the vertical type memory device.

The vertical memory device is similar to the vertical memory device shown in FIGS. 1 to 3, except for the shape of the pad pattern. Thus, like reference numerals refer to like elements, and detailed descriptions thereon are omitted herein.

Referring to FIGS. 53 to 55, the pad pattern 180c may protrude in the third direction from an end in the second of the conductive line 180b. In some example embodiments, the pad patterns 180c protruding from each of the conductive lines 180b may contact to each other, so that the pad patterns may be connected to each other in the third direction. Therefore, only the pad patterns 180c may be disposed at the step portions of the merged pattern structure.

Accordingly, the gate electrodes 180a of the same level may be electrically connected with the connection line 180d, the conductive line 180b, and the pad pattern 180c. In some example embodiments, the connection line 180d, the conductive line 180b, and the pad pattern 180c of each level may have a ring shape, in a plan view.

The cell contact plug 202 is formed through the second insulating interlayer 146, the first insulating interlayer 130 and the pad pattern 180c in the second region B, and merged pattern structure and base insulation layer thereunder, so that the cell contact plug 202 may contact an upper surface of the lower pad pattern 108a in the lower insulating interlayer 110.

In some example embodiments, insulating material may not be formed between the pad patterns 180c in the third direction, so that the cell contact plugs 202 may be formed through the pad patterns 180c. The cell contact plug 202 may have various shapes. For example, the cell contact plug 202 may have one of the structure shown in FIGS. 6 and 7, the structure shown in FIGS. 47 and 48, and the structure shown in FIGS. 51 and 52.

The vertical memory device may be manufactured by processes the same as or similar to the processes described with reference to FIGS. 8 to 30. However, when the processes described with reference to FIGS. 22 and 23 are performed, the second gaps may be formed at both sides of the cell block to be spaced apart from each other in the third direction. Meanwhile, the third gaps may be formed to be communicated with each other. Thus, the pad patterns 180c connected to each other in the third direction may be formed in the third gap.

Figure 56:
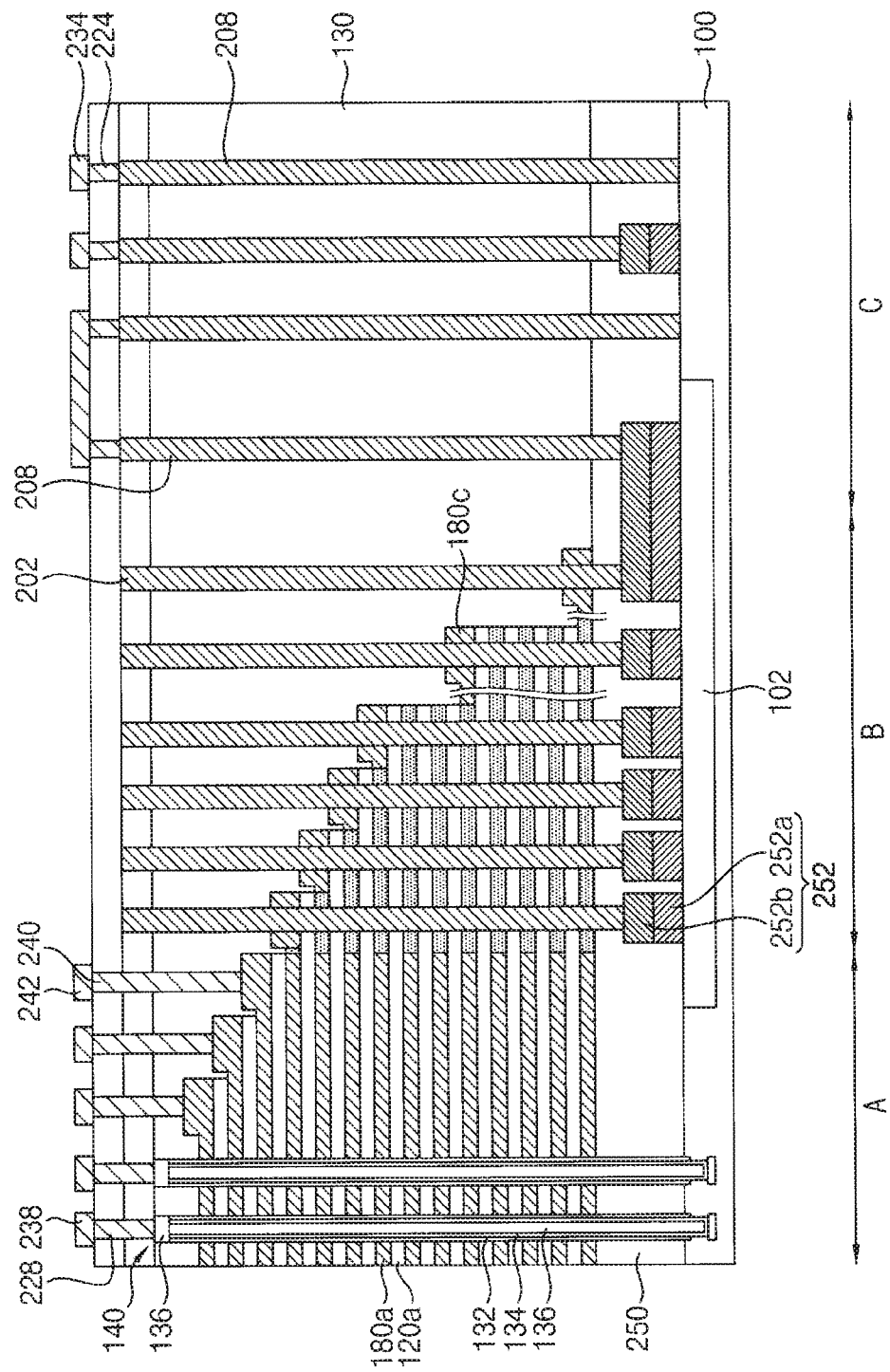

FIG. 56 is a cross-sectional view illustrating a vertical memory device in accordance with some example embodiments.

The vertical memory device is similar to the vertical memory device shown in FIGS. 1 to 3, except that it is not a COP structure. Thus, like reference numerals refer to like elements, and detailed descriptions thereon are omitted herein.

Referring to FIG. 56, the vertical memory device does not have a COP structure, and thus a peripheral circuit pattern may be formed on the third region C surrounding the first and second regions A and B of the substrate 100.

That is, transistors and lower wirings for constituting a peripheral circuit may be formed on the third region C of the substrate 100.

A lower insulating interlayer 250 may be formed on the substrate 100 to cover the lower wiring 252.

An isolation pattern 102 may be formed at the second region of the substrate, and the isolation pattern may serve as a field region. A conductive material such as a lower wiring 252 or a resistance pattern may be formed on the isolation pattern 102 facing the cell contact plug 202 in the first direction.

The cell contact plug 202 may contact at least portions of the pad pattern 180c, and may also contact an upper surface of the lower wiring 252 or the resistance pattern. In some example embodiments, the lower wiring 252 may have a stacked structure substantially the same as a stacked structure of the gate structure in the peripheral circuit. For example, the lower wiring 252 may include a first conductive pattern 252a and a second conductive pattern 252b stacked.

An upper wiring may not be formed on the upper surface of the cell contact plug 202. That is, only insulating material may contact the upper surface of the cell contact plug 202.

The lower wiring 252 or the resistance pattern may be electrically connected to the peripheral circuits. In some example embodiments, a via contact 208 or upper wirings 224 and 234 may be further formed to be electrically connected to the lower wiring 252 or the resistance pattern in the third region C.

Thus, as the lower wiring 252 or the resistance patterns electrically connected to the peripheral circuit is formed under the second region of the substrate 100, a horizontal area of memory cells may decrease.

The foregoing is illustrative of some example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical memory device, comprising:
   a circuit pattern formed on a substrate including a first region and a second region;
   gate electrodes disposed on the circuit pattern in the first region, the gate electrodes stacked in a first direction vertical to an upper surface of the substrate, the gate electrodes extending in a second direction parallel to the upper surface of the substrate, and arranged in a third direction perpendicular to the second direction and parallel to the upper surface of the substrate;
   a channel through the gate electrodes in the first direction;
   a merged pattern structure formed on the second region, wherein
   the merged pattern structure extends in the second direction, ends of extensions of gate electrodes of each level are merged, edges of the second direction of the merged pattern structure have a step shape, and the merged pattern structure includes insulation materials and pad patterns electrically connected to the extensions of gate electrodes of each level; and
   cell contact plugs extending through the merged pattern structure in the first direction, each of the cell contact plugs electrically connected to the circuit pattern and one of the pad patterns.

2. The vertical memory device of claim 1, wherein the cell contact plugs include an upper surface which only contacts an insulation material.

3. The vertical memory device of claim 1, wherein the merged pattern structure includes
   a conductive pattern structure including a connection line, a conductive line, and the pad patterns, the conductive pattern structure electrically connected to the extensions of gate electrodes of each level, and
   an insulation structure including sacrificial patterns including an insulating material, wherein the sacrificial patterns are disposed at the same level as the gate electrodes, respectively.

4. A vertical memory device, comprising:
   a circuit pattern on a substrate;
   lower pad patterns electrically connected to the circuit pattern;
   a base pattern over the circuit pattern and the lower pad patterns;
   an electrode stack structure on the base pattern, the electrode stack structure including a cell array region and a pad region;
   a channel extending through the electrode stack structure of the cell array region; and
   a plurality of contact plugs extending through the electrode stack structure of the pad region,
   wherein the cell array region of the electrode stack structure includes gate electrodes spaced from each other in a first direction perpendicular to an upper surface of the substrate, and wherein the pad region of the electrode stack structure has a step shape, and pad region of the electrode stack structure includes pad patterns electrically connected to the gate electrodes of each level,
   wherein upper surfaces of the contact plugs are higher than an upper surface of the electrode stack structure, and lower surfaces of the contact plugs are lower than an upper surface of the base pattern.

5. The vertical memory device of claim 4, wherein each of the contact plugs includes a connection portion for electrically connecting the pad patterns, and a passing portion.

6. The vertical memory device of claim 5, wherein the pad region of the electrode stack structure includes an insulating material, and the passing portion of each of the contact plugs extends through the insulating material.

7. The vertical memory device of claim 5, wherein the connection portion of each of the contact plugs contacts at least a portion of the pad patterns.

8. The vertical memory device of claim 5, wherein the connection portion of each of the contact plugs contacts at least a sidewall of a hole included in the pad patterns.

9. The vertical memory device of claim 4, wherein a lower surface of each of the contact plugs contacts one of the lower pad patterns.

10. The vertical memory device of claim 4, wherein the gate electrodes extend in a second direction parallel to the upper surface of the substrate, and the gate electrodes are arranged in a third direction perpendicular to the second direction and parallel to the upper surface of the substrate.

11. The vertical memory device of claim 10, wherein the pad region of the electrode stack structure includes
    a conductive pattern structure including a connection line, a conductive line, and the pad patterns, the conductive pattern structure electrically connected to the gate electrodes of each level, and
    an insulation structure including sacrificial patterns including an insulating material, wherein the sacrificial patterns are disposed at the same level as the gate electrodes, respectively.

12. The vertical memory device of claim 11, wherein the connection line extends in the third direction so as to be connected to ends of the gate electrodes, the conductive line extends in the second direction from an end in the third direction of the connection line, and the pad patterns protrude in the third direction from an end in the second direction of the conductive line.

13. The vertical memory device of claim 11, wherein the pad patterns are at an edge in the third direction of a step of the pad region of the electrode stack structure.

14. The vertical memory device of claim 11, wherein the contact plug passes through the insulation structure under the pad patterns.

15. The vertical memory device of claim 11, wherein the gate electrodes, the connection line, the conductive line, and the pad patterns include the same conductive material.

16. The vertical memory device of claim 4, further comprising:
    a through via contact through the electrode stack structure of a pad region in the first direction, the through via contact insulated from the gate electrodes.

17. A vertical memory device, comprising:
    a circuit pattern on a substrate;
    lower pad patterns electrically connected to the circuit pattern;
    a base pattern over the circuit pattern and the lower pad patterns;
    an electrode stack structure on the base pattern, the electrode stack structure including a cell array region and a pad region;
    a channel extending through the cell array region of the electrode stack structure; and
    a plurality of contact plugs extending through the pad region of the electrode stack structure, wherein the cell array region of the electrode stack structure includes gate electrodes spaced from each other in a first direction perpendicular to an upper surface of the substrate, and wherein the pad region of the electrode stack structure has a step shape, and the pad region of the electrode stack structure includes pad patterns electrically connected to the gate electrodes of each level, wherein each of the contact plugs is electrically connected to one of the pad patterns, and a lower surface of each of the contact plugs contacts one of the lower pad patterns.

18. The vertical memory device of claim 17, wherein each of the contact plugs includes a connection portion for electrically connecting the pad patterns and a passing portion extending through an insulating material.

19. The vertical memory device of claim 17, wherein the pad region of the electrode stack structure includes
- a conductive pattern structure including a connection line, a conductive line, and the pad patterns, the conductive pattern structure electrically connected to the gate electrodes of each level, and
- an insulation structure including sacrificial patterns including an insulating material, wherein the sacrificial patterns are disposed at the same level as the gate electrodes, respectively.

20. The vertical memory device of claim 17, wherein the pad patterns are at an edge of a step of the pad region of the electrode stack structure.

* * * * *